US012774412B2

(12) United States Patent
Sakai et al.

(10) Patent No.: US 12,774,412 B2
(45) Date of Patent: Oct. 27, 2026

(54) STABILISED A/M/X MATERIALS

(71) Applicant: OXFORD PHOTOVOLTAICS LIMITED, Yarnton (GB)

(72) Inventors: Nobuya Sakai, Oxford (GB); Bernard Wenger, Oxford (GB); Henry James Snaith, Oxford (GB)

(73) Assignee: Oxford Photovoltaics Limited, Yarnton (GB)

(*) Notice: Subject to any disclaimer, the term of this patent is extended or adjusted under 35 U.S.C. 154(b) by 545 days.

(21) Appl. No.: 18/325,051

(22) Filed: May 29, 2023

(65) Prior Publication Data

US 2023/0383176 A1 Nov. 30, 2023

Related U.S. Application Data

(63) Continuation of application No. 17/259,708, filed as application No. PCT/GB2019/051963 on Jul. 12, 2019, now Pat. No. 11,820,927.

(30) Foreign Application Priority Data

Jul. 13, 2018 (GB) ..................................... 1811538

(51) Int. Cl.
*C09K 11/02* (2006.01)
*C09K 11/66* (2006.01)
(Continued)

(52) U.S. Cl.
CPC ............ *C09K 11/02* (2013.01); *C09K 11/665* (2013.01); *H10F 10/00* (2025.01); *H10F 77/45* (2025.01);
(Continued)

(58) Field of Classification Search
CPC .............. C09K 11/665; C09K 11/0827; C09K 11/0833; C09K 11/61; C09K 11/611;
(Continued)

(56) References Cited

U.S. PATENT DOCUMENTS

| | | | | |
|---|---|---|---|---|
| 11,820,927 B2 * | 11/2023 | Sakai | .................. | C09K 11/025 |
| 2017/0346024 A1 * | 11/2017 | Lee | ...................... | H05B 33/14 |

(Continued)

FOREIGN PATENT DOCUMENTS

| | | |
|---|---|---|
| JP | 2019215516 A | 12/2019 |
| WO | 2013126385 | 8/2013 |

(Continued)

OTHER PUBLICATIONS

Sun. Highly luminescent, stable, transparent and flexible perovskite quantum dot gels towards light-emitting diodes. Nanotechnology 28 (2017) 365601 (9pp) (Year: 2017).*

(Continued)

*Primary Examiner* — Matthew E. Hoban
(74) *Attorney, Agent, or Firm* — Meunier Carlin & Curfman LLC

(57) ABSTRACT

The present invention relates to a method for preparing a stabilised crystalline A/M/X material comprising an oxide of formula $[Z]_pO_q$ and a compound of formula $[A]_a[M]_b[X]_c$, wherein [Z] comprises at least one element Z capable of forming an oxide with a band gap of at least 3 eV; p and q are positive numbers; [A] comprises one or more A cations; [M] comprises one or more M cations; [X] comprises one or more X anions; a is an integer from 1 to 6; b is an integer from 1 to 6; and c is an integer from 1 to 18. Often, the stabilised crystalline A/M/X material is a perovskite. The invention also provides a stabilised crystalline A/M/X material, which can be produced by the process of the invention. The invention further provides materials and devices containing the stabilised crystalline A/M/X material of the invention.

34 Claims, 7 Drawing Sheets

(51) Int. Cl.

| | |
|---|---|
| ***H10F 10/00*** | (2025.01) |
| ***H10K 30/87*** | (2023.01) |
| *H10F 77/45* | (2025.01) |
| *H10H 20/851* | (2025.01) |
| *H10K 50/125* | (2023.01) |

(52) U.S. Cl.
CPC ......... *H10H 20/8512* (2025.01); *H10K 30/87* (2023.02); *H10K 50/125* (2023.02)

(58) Field of Classification Search
CPC ... C09K 11/612; C09K 11/613; C09K 11/615; C09K 11/616; C09K 11/617; C09K 11/618; C09K 11/626; C09K 11/628; C09K 11/632; C09K 11/634; C09K 11/644; C09K 11/645; C09K 11/664; C09K 11/674; C09K 11/675; C09K 11/696; C09K 11/705; C09K 11/712; C09K 11/715; C09K 11/7428; C09K 11/7435; C09K 11/755; C09K 11/756; C09K 11/7704; C09K 11/7705; C09K 11/7719; C09K 11/772; C09K 11/7732; C09K 11/7733; C09K 11/7747; C09K 11/7748; C09K 11/7757; C09K 11/7762; C09K 11/7763; C09K 11/777; C09K 11/7772; C09K 11/7773; C09K 11/779; C09K 11/7791; C09K 11/895; C09K 11/897; H10F 10/00–19; H10K 30/87
See application file for complete search history.

(56) References Cited

U.S. PATENT DOCUMENTS

| | | | |
|---|---|---|---|
| 2018/0037815 | A1 | 2/2018 | Wang |
| 2018/0090312 | A1 | 3/2018 | Pickett |
| 2018/0273839 | A1 | 9/2018 | Li |

FOREIGN PATENT DOCUMENTS

| | | |
|---|---|---|
| WO | 2013171517 | 11/2013 |
| WO | 2013171518 | 11/2013 |
| WO | 2013171520 | 11/2013 |
| WO | 2014045021 | 3/2014 |
| WO | 2017001542 | 1/2017 |
| WO | 2017017441 | 2/2017 |
| WO | 2017037448 | 3/2017 |
| WO | 2017089819 | 6/2017 |

OTHER PUBLICATIONS

Duan. Simplified Perovskite Solar Cell with 4.1% Efficiency Employing Inorganic CsPbBr3 as Light Absorber. Small 2018, 14, 1704443 (Year: 2018).*
Related JP 2021-500802 Office Action, mailed Apr. 4, 2023, 7 pages, English Translation Provided.
Wikipedia, Grain boundary retrived from https://en.wikipedia.org/wiki/Grain_boundary, Apr. 6, 2023. 9 pages.
Barkhouse et al. (2012) Prog. Photovolt: Res. Appl. 20, 6-11.
Hirade & Adachi (2011) Appl. Phys. Lett. 99, 153302.
International Searching Authority. International Search Report and Written Opinion for application PCT/GB2019/051963. Mailed on Sep. 10, 2019. 9 pages.
Li et al. (2016) Adv. Mater. 28, 3528-3534.
Loiudice et al. (2017) Angew. Chemie Int. Ed. 56(36) 10696-10701.
Peumans et al. (2001) J. Appl. Phys. 93, 3693.
Rouquerol et al. (1994) Pure & Appl. Chem. 66(8), 1739-1758, 1994.
Sadhanala et al., Nano Letters, 15(9), 6095-6101.
Sun et al. (2017) Nanotechnology 28(36) 365601.
Tauc et al. (1966) Phys. Status Solidi 15, 627-637.
Wang, J. T.-W. et al. (2016) Energy Environ. Sci. 9, 2892-2901.
Yang M. et al. (2018) Journal of Colloid and Interface Science. 509, 32-38.
Sun et al. "Efficient and Stable White LEDs with Silica-Coated Inorganic Perovskite Quantum Dots," Advanced Materials, DOI: 10.1002/adma.201603081 (2016).

* cited by examiner

STABILISED A/M/X MATERIALS

CROSS-REFERENCE TO RELATED APPLICATIONS

This application is a continuation of U.S. patent application Ser. No. 17/259,708, filed Jan. 12, 2021, which is a national stage entry of PCT International Application No. PCT/GB2019/051963, filed Jul. 12, 2019, which claims priority to Great Britain Application No. 1811538.6, filed Jul. 13, 2018, both of which are incorporated herein by reference as if set forth in their entirety for all purposes.

The project leading to this application has received funding from the European Union's Horizon 2020 research and innovation programme under the Marie Sklodowska-Curie grant agreement no: 706552.

FIELD OF THE INVENTION

The invention relates to a process for producing a stabilised A/M/X material which comprises an oxide and a compound of formula $[A]_a[M]_b[X]_c$, and to a product obtainable by that process. The invention also provides a stabilised crystalline A/M/X material comprising a crystal of a compound of formula $[A]_a[M]_b[X]_c$, having an oxide coating on its entire surface. The invention also provides a stabilised crystalline A/M/X material which is a polycrystalline material comprising a plurality of crystallites comprising A/M/X material, and an oxide distributed along grain boundaries between the crystallites. The invention also relates to an optoelectronic device comprising a stabilised A/M/X material.

BACKGROUND TO THE INVENTION

There is great demand worldwide for photoactive semiconductor materials which convert electrical energy into light and vice versa. Such materials are useful in a wide range of semiconductor devices. For instance, light-emitting materials are useful in applications such as the production of luminescent screens and light-emitting diodes (LEDs). Light-absorbing materials are in high demand for the production of solar cells.

Organic species are currently widely used in fabricating devices such as light-emitting devices. However, organic species suffer from the disadvantage that they often emit weakly in the blue region of the visible spectrum. Organic LEDs (OLEDs) typically have a conversion efficiency of up to 20% in the red and green regions of the visible emission spectrum. However, they can often only achieve conversion efficiencies of up to 10% in the blue region of the visible spectrum. One key reason for this is that efficient red and green emission in OLEDs relies on the radiative recombination of singlet and triplet excitons. Triplet-triplet electron transitions, which are generally spin-forbidden in organic emitters are made possible by the introduction of phosphorescent metal complexes. However, such metal complexes are often not available or lack stability and efficiency in the blue region of the spectrum.

Inorganic materials such as perovskites do not suffer from the difficulty of spin-forbidden transitions to the same extent as organic species. Consequently, there is considerable interest in providing inorganic photoactive materials which can emit strongly in the blue region of the visible spectrum.

However, considerable difficulties have been encountered to date in providing inorganic materials which are stable and which emit strongly in the blue region of the visible spectrum. Many inorganic materials of interest have been found to undergo chemical degradation when exposed to light, oxygen and humidity. In addition, the wavelength of the emission of such materials has been found to change over time, which is usually unacceptable for lighting and display applications and therefore limits the commercial applications of such materials.

Perovskite materials and in particular lead halide perovskites are desirable candidates as photoactive materials as they are highly emissive semiconductor materials. Lead halide perovskites are materials of formula $APbX_3$, wherein X is one or more halides. However, so far most highly emitting perovskites (by "highly emitting perovskites" is meant perovskites with a radiative external quantum efficiency of 20% or more in a thin film) with a blue emission spectrum suffer from the aforementioned problems. In particular, they have shown poor stability in light and in air.

For example, the paper "Blue-green color tunable solution processable organo lead chloride-bromide mixed halide perovskites for optoelectronic applications", Sadhanala et al., *Nano Letters,* 15(9), pp 6095-6101 clearly shows that addition of chloride ions to the perovskite $MAPbBr_3$ is detrimental to its photoluminescence lifetime. That is, the presence of chloride increases the defect concentration in the perovskite, decreasing its photoluminescence lifetime.

A possible solution to the poor stability of perovskite materials has been proposed in the application WO2017/001542. That document describes a method of depositing an encapsulation matrix or layer onto a film comprising perovskite crystals. This technique is used to encapsulate green-emitting nanoparticles of the perovskite $CsPbBr_3$ by cross-linking aliphatic ligands on the surface of individual perovskite crystals using trimethylaluminium (TMA). The same technique is also used to encapsulate red-emitting nanoparticles of the perovskite $CsPb(Br_{1-x}I_x)_3$. The encapsulated green and red nanoparticles are shown to retain good photoluminescence quantum efficiency on encapsulation. However, difficulties were encountered when attempting to encapsulate blue-emitting perovskites of formula $CsPb(Br_{1-x}Cl_x)_3$. The photoluminescence quantum efficiency of these species was found to decrease significantly on encapsulation. Moreover, upon irradiation, the emission wavelength profile of the species was found to shift significantly towards the red. This red-shift in the emission spectrum is attributed to halide segregation (Li et al., "Highly efficient perovskite nanocrystal light-emitting diodes enabled by a universal crosslinking method", Adv. Mater., vol. 28, pp 3528-3534, 2016).

A further difficulty with the method of WO2017/001542 is the need for a vapour-phase deposition step. This step adds complexity to the process of producing perovskites for photoactive materials, and is not compatible with printing techniques for manufacturing, for instance manufacturing optoelectronic devices. Moreover, the perovskites may degrade before the encapsulation step is performed.

Degradation in performance of the perovskite is undesirable in applications such as the fabrication of solar cells, where a small change in absorbance onset wavelength can lead to a dramatic loss of performance. Accordingly, there remains a need for a simple process for producing stabilised materials, particularly perovskite materials, which can be used to provide stable blue-emitting materials such as perovskites. There also remains a need for the A/M/X materials obtained by such a process.

SUMMARY OF THE INVENTION

The inventors have now provided a new technique for preparing a crystalline A/M/X material with excellent stability, and hence an extraordinarily long lifetime. The process involves exposing the relevant precursors of the crystalline A/M/X material to an oxide precursor. The oxide precursor is therefore present during the formation of the A/M/X material, and forms a stabilising oxide upon the A/M/X material immediately. It is speculated that the formation of the oxide together with the A/M/X material stabilised by that oxide provides immediate protection for the stabilised A/M/X material against environmental factors such as water and oxygen. This may lead to the excellent stability observed in the products of the process of the invention.

Accordingly, the invention provides a process for producing a stabilised crystalline A/M/X material, which stabilised crystalline A/M/X material comprises an oxide of formula $[Z]_pO_q$ and a compound of formula $[A]_a[M]_b[X]_c$, wherein:

- [Z] comprises at least one element Z capable of forming an oxide with a band gap of at least 3 eV;
- p and q are positive numbers;
- [A] comprises one or more A cations;
- [M] comprises one or more M cations;
- [X] comprises one or more X anions;
- a is an integer from 1 to 6;
- b is an integer from 1 to 6; and
- c is an integer from 1 to 18, and wherein the process comprises treating:

- (a) an A precursor comprising an A cation; and
- (b) an M precursor comprising an M cation;

with an oxide precursor comprising an element Z.

The process of the invention may conveniently be performed in solution. Solution-phase processes are advantageous in comparison to gas-phase processes as they can avoid the need for more costly vacuum equipment, and are compatible with high fidelity printing.

Accordingly, in a preferred process of the invention, each of the A precursor, the M precursor and the oxide precursor are in solution.

A further surprising advantage of the invention is that, unlike previous coating techniques, it can be used to stabilise blue-emitting crystalline A/M/X materials without causing excessive loss of photoluminescence or a shift in emission wavelength away from the blue region.

Indeed, in some embodiments where the stabilised A/M/X material is a blue-emitting material, the stabilised A/M/X species has the same or even a better photoluminescence quantum yield (PLQY) than the corresponding A/M/X species without a stabilising oxide present.

Thus, in a preferred embodiment of the process of the invention, the stabilised A/M/X material emits light in the blue region of the visible spectrum, for example at wavelengths of 500 nm or less, preferably 495 nm or less or 490 nm or less. It is particularly preferred that the emission spectrum has a maximum between 460 and 480 nm. For example, in some embodiments the stabilised A/M/X material comprises an A/M/X material of formula $[A][M][X]_3$ wherein [A] comprises two or more different A cations, and/or [X] comprises two or more different X anions.

The invention also provides a product obtainable and/or obtained by a process of the invention.

The invention further provides a stabilised crystalline A/M/X material comprising a crystal of a compound of formula $[A]_a[M]_b[X]_c$, the crystal having an oxide coating of formula $[Z]_pO_q$ on its entire surface, wherein:

- [Z] comprises at least one element Z capable of forming an oxide with a band gap of at least 3 eV;
- p and q are positive numbers;
- [A] comprises one or more A cations;
- [M] comprises one or more M cations;
- [X] comprises one or more X anions;
- a is an integer from 1 to 6;
- b is an integer from 1 to 6; and
- c is an integer from 1 to 18.

The stabilised crystalline A/M/X material may be polycrystalline. Thus, the invention further provides stabilised crystalline A/M/X material which is a polycrystalline material comprising a plurality of crystallites comprising a compound of formula $[A]_a[M]_b[X]_c$, and a plurality of grain boundaries between the said crystallites, wherein an oxide of formula $[Z]_pO_q$ is distributed along the grain boundaries, wherein

- [Z] comprises at least one element Z capable of forming an oxide with a band gap of at least 3 eV;
- p and q are positive numbers;
- [A] comprises one or more A cations;
- [M] comprises one or more M cations;
- [X] comprises one or more X anions;
- a is an integer from 1 to 6;
- b is an integer from 1 to 6; and
- c is an integer from 1 to 18.

The stabilised crystalline A/M/X material of the invention has exceptional stability, meaning that it can maintain its photoluminescence characteristics for a very long time. For example, a stabilised A/M/X material of the invention has been shown to maintain its photoluminescence quantum yield of over 15% for 6000 hours without decay (see FIG. 5), while exposed to simulated full spectrum sun light at elevated temperatures.

Moreover, dependent upon the choice of [A], [M] and [X] and their relative proportions, the stabilised crystalline A/M/X material of the invention can emit light in the blue region of the visible spectrum with surprisingly high photoluminescence quantum yield and, of course, excellent stability. For example, a stabilised A/M/X material of the invention has been shown to emit light at 475 nm for a period of 300 hours at a quantum yield exceeding 12%. By contrast, a non-stabilised A/M/X material (comprising no oxide) illustrated a PLQY at this wavelength of no more than 8%, which decayed to 1% or less within the period of measurement (see FIG. 7).

Thus, in a preferred aspect, the stabilised crystalline A/M/X material of the invention comprises an A/M/X material of formula $[A]\,[M]\,[X]_3$ wherein [A] comprises two or more different A cations, and/or [X] comprises two or more different X anions. In a particularly preferred aspect of this embodiment, [A] comprises two different A cations, one being $Cs^+$ and the other being $Rb^+$. Such stabilised A/M/X materials are strong blue emitters.

The stabilised A/M/X materials of the invention may be provided in any form. For example, the invention provides a coarse-grained powder comprising a stabilised A/M/X material as defined herein; the invention also provides a thin film comprising a stabilised A/M/X material as defined herein.

The excellent stability and advantageous optical properties of the stabilised crystalline A/M/X materials of the invention are highly desirable in the production of optoelectronic devices. Accordingly, the invention provides an optoelectronic device comprising a stabilised A/M/X material as defined herein, for example a coarse-grained powder or a thin film as defined herein.

BRIEF DESCRIPTION OF THE FIGURES

FIG. 4(*b*) shows the small change of the normalised steady-state photoluminescence spectra of $CsPbBr_3$ thin film prepared in the presence of TMA with aging time.

DETAILED DESCRIPTION OF THE INVENTION

Figure 1:
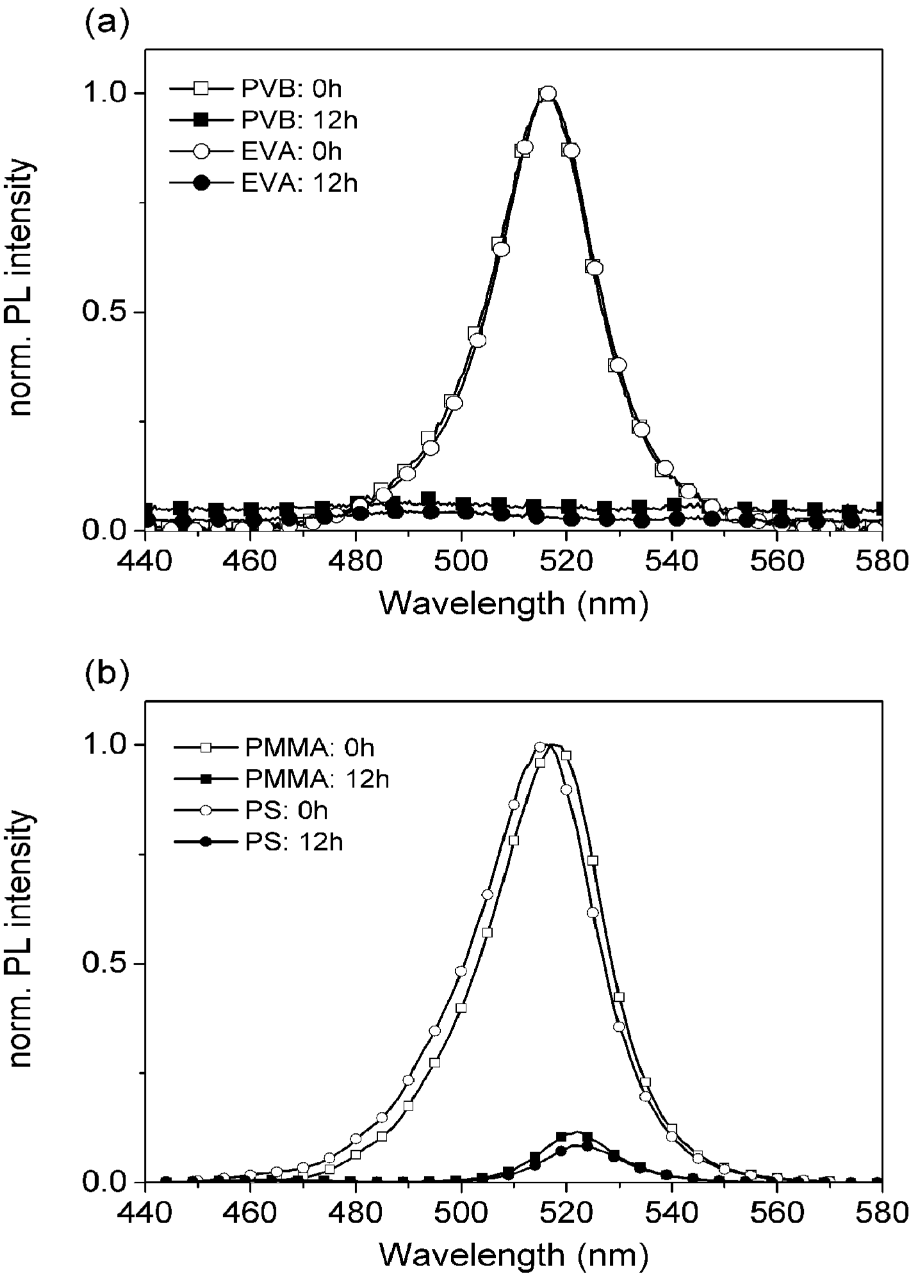
FIG. 1 shows normalised photoluminescence ("PL") spectra of $CsPbBr_3$ nanocrystals deposited by spin-coating on glass substrates protected by (a) PVB, EVA and dispersed in (b) poly methyl methacrylate (PMMA) or polystyrene (PS). The samples were exposed to simulated sunlight for 12 hours.

As mentioned above, the invention provides a process for producing a stabilised A/M/X product; a stabilised A/M/X material obtained and/or obtainable by the process of the invention; a stabilised A/M/X material; a thin film or coarse-grained powder comprising the stabilised A/M/X material; and an optoelectronic device comprising the stabilised A/M/X material of the invention.

These will now be described in more detail. It should be noted that the following definitions are general in nature, applying to both the products and the processes of the invention. For example, the description of the compound of formula $[A]_a[M]_b[X]_c$ applies equally to that compound as comprised in the product of the process of the invention and the stabilised A/M/X material product of the invention.

Definitions

The term "stabilised" as used herein indicates that the A/M/X material of the invention (or obtained or obtainable by the process of the invention) is stabilised by the presence of the oxide. By "stabilised" is meant that the emission and absorption properties of the A/M/X material change less over time than the corresponding properties of the non-stabilised A/M/X material.

The term "treating" as used herein refers to any process in which one compound is allowed to react or interact with another. A precursor compound which is treated with another precursor compound may be added to said another precursor as itself (for instance in dissolved form or vapour form) or as an initial compound that converts by some process to the precursor compound itself.

The term "reaction mixture" as used herein indicates a gas or liquid obtained by combining the A precursor, the M precursor and the oxide precursor. The term "reaction mixture" is used to denote that combination of A, M and oxide precursors before, during and after the precursors react together to produce the stabilised crystalline A/M/X material. Accordingly, immediately after these precursors are combined, the reaction mixture will contain very little stabilised crystalline A/M/X material. However, after these precursors have had time (e.g. a few seconds) to react, the reaction mixture will contain a greater quantity stabilised crystalline A/M/X material and a lesser quantity of the said precursors.

The terms "organic compound" and "organic solvent" as used herein have their typical meaning in the art and would readily be understood by the skilled person.

The term "disposing on", as used herein, refers to the making available or placing of one component on another component. The first component may be made available or placed directly on the second component, or there may be a third component which intervenes between the first and second component. For instance, if a first layer is disposed on a second layer, this includes the case where there is an intervening third layer between the first and second layers. Typically, however, "disposing on" refers to the direct placement of one component on another.

The term "porous", as used herein, refers to a material within which pores are arranged. Thus, for instance, in a porous material the pores are volumes within the scaffold where there is no material. Pores in a material may include "closed" pores as well as open pores. A closed pore is a pore in a material which is a non-connected cavity, i.e. a pore which is isolated within the material and not connected to any other pore and which cannot therefore be accessed by a fluid to which the material is exposed. An "open pore" on the other hand, would be accessible by such a fluid. The concepts of open and closed porosity are discussed in detail in J. Rouquerol et al., "Recommendations for the Characterization of Porous Solids", Pure & Appl. Chem., Vol. 66, No. 8, pp. 1739-1758, 1994. Open porosity, therefore, refers to the fraction of the total volume of the porous material in which fluid flow could effectively take place. It therefore excludes closed pores. The term "open porosity" is interchangeable with the terms "connected porosity" and "effective porosity", and in the art is commonly reduced simply to "porosity". The term "without open porosity", as used herein, therefore refers to a material with no effective porosity. The term "non-porous" as used herein, refers to a material without any porosity, i.e. without open porosity and also without closed porosity.

The term "layer", as used herein, refers to any structure which is substantially laminar in form (for instance extending substantially in two perpendicular directions, but limited in its extension in the third perpendicular direction). A layer may have a thickness which varies over the extent of the layer. Typically, a layer has approximately constant thickness. The "thickness" of a layer, as used herein, refers to the average thickness of a layer. The thickness of layers may easily be measured, for instance by using microscopy, such as electron microscopy of a cross section of a film, or by surface profilometry for instance using a stylus profilometer.

The term "band gap", as used herein, refers to the energy difference between the top of the valence band and the bottom of the conduction band in a material. The skilled person of course is readily able to measure the band gap of a semiconductor (including that of a perovskite) by using well-known procedures which do not require undue experimentation. For instance, the band gap of a semiconductor can be estimated by constructing a photovoltaic diode or solar cell from the semiconductor and determining the photovoltaic action spectrum. Alternatively the band gap can be estimated by measuring the light absorption spectra either via transmission spectrophotometry or by photo thermal deflection spectroscopy, or may be conveniently obtained from the photoluminescence spectrum. The band gap can be determined by making a Tauc plot, as described in Tauc, J., Grigorovici, R. & Vancu, a. Optical Properties and Electronic Structure of Amorphous Germanium. Phys. Status Solidi 15, 627-637 (1966) where the square of the product of absorption coefficient times photon energy is plotted on the Y-axis against photon energy on the x-axis with the straight line intercept of the absorption edge with the x-axis giving the optical band gap of the semiconductor. Alternatively, the optical band gap may be estimated by taking the onset of the incident photon-to-electron conversion efficiency, as described in [Barkhouse D A R, Gunawan O, Gokmen T, Todorov T K, Mitzi D B. Device characteristics of a 10.1% hydrazine processed Cu2ZnSn(Se,S)4 solar cell. Progress in Photovoltaics: Research and Applications 2012; published online DOI: 10.1002/pip.1160.]

The term "semiconductor" or "semiconducting material", as used herein, refers to a material with electrical conductivity intermediate in magnitude between that of a conductor and a dielectric. A semiconductor may be an negative (n)-type semiconductor, a positive (p)-type semiconductor or an intrinsic (i) semiconductor. A semiconductor may have a band gap of from 0.5 to 3.5 eV, for instance from 0.5 to 2.5 eV or from 1.0 to 2.0 eV (when measured at 300 K).

The term "n-type region", as used herein, refers to a region of one or more electron-transporting (i.e. n-type) materials. Similarly, the term "n-type layer" refers to a layer of an electron-transporting (i.e. an n-type) material. An electron-transporting (i.e. an n-type) material could be a single electron-transporting compound or elemental material, or a mixture of two or more electron-transporting compounds or elemental materials. An electron-transporting compound or elemental material may be undoped or doped with one or more dopant elements.

The term "p-type region", as used herein, refers to a region of one or more hole-transporting (i.e. p-type) materials. Similarly, the term "p-type layer" refers to a layer of a hole-transporting (i.e. a p-type) material. A hole-transporting (i.e. a p-type) material could be a single hole-transporting compound or elemental material, or a mixture of two or more hole-transporting compounds or elemental materials. A hole-transporting compound or elemental material may be undoped or doped with one or more dopant elements.

The term "electrode material", as used herein, refers to any material suitable for use in an electrode. An electrode material will have a high electrical conductivity. The term "electrode" as used herein indicates a region or layer consisting of, or consisting essentially of, an electrode material.

As used herein, the term "optionally substituted" means that the group at issue may or may not bear substituents, i.e. it may be unsubstituted or substituted. For instance, the group may bear 0, 1, 2, 3 or more substituents; typically 0, 1 or 2 substituents. The substituents may typically be selected from substituted or unsubstituted $C_1$-$C_{20}$ alkyl, substituted or unsubstituted aryl (as defined herein), cyano, amino, $C_1$-$C_{10}$ alkylamino, di($C_1$-$C_{10}$)alkylamino, arylamino, diarylamino, arylalkylamino, amido, acylamido, hydroxy, oxo, halo, carboxy, ester, acyl, acyloxy, $C_1$-$C_{20}$ alkoxy, aryloxy, haloalkyl, sulfonic acid, sulfhydryl (i.e. thiol, —SH), $C_1$-$C_{10}$ alkylthio, arylthio, and sulfonyl.

As used herein, an alkyl group can be a substituted or unsubstituted, linear or branched chain saturated radical, it is often a substituted or an unsubstituted linear chain saturated radical, more often an unsubstituted linear chain saturated radical. An alkyl group typically comprises 1 to 20 carbon atoms, usually 1 to 10 carbon atoms. A $C_{1-10}$ alkyl group is an unsubstituted or substituted, straight or branched chain saturated hydrocarbon radical, having from 1 to 10 carbon atoms. A $C_{1-6}$ alkyl group is an unsubstituted or substituted, straight or branched chain saturated hydrocarbon radical, having from 1 to 6 carbon atoms. Typically it is, for example, methyl, ethyl, propyl, i-propyl, n-propyl, butyl, t-butyl, s-butyl, n-butyl, pentyl, or hexyl. Often an alkyl group is a $C_{1-4}$ alkyl group. If the term "alkyl" is used without a prefix specifying the number of carbons anywhere herein, it generally has from 1 to 20 carbons (and this also applies to any other organic group referred to herein).

As used herein, an alkenyl group can be a substituted or unsubstituted, linear or branched chain unsaturated radical, it is often a substituted or an unsubstituted linear chain unsaturated radical, more often an unsubstituted linear chain unsaturated radical. An alkenyl group can comprise one or more carbon-carbon double bonds, for example one, two or three double bonds. Typically, an alkenyl group comprises one double bond. An alkenyl group typically comprises 2 to 20 carbon atoms, usually 2 to 10 carbon atoms. A $C_{2-10}$ alkenyl group is an unsubstituted or substituted, straight or branched chain unsaturated hydrocarbon radical, having from 2 to 10 carbon atoms. A $C_{2-6}$ alkenyl group is an unsubstituted or substituted, straight or branched chain unsaturated hydrocarbon radical, having from 2 to 6 carbon atoms. Typically it is, for example, vinyl, propenyl, prop-1-enyl, prop-2-enyl, butenyl, but-1-enyl, but-2-enyl, but-4-enyl, pentenyl, pent-1-enyl, pent-2-enyl, pent-3-enyl, pent-4-enyl, hexenyl, hex-1-enyl, hex-2-enyl, hex-3-enyl, hex-4-enyl, or hex-5-enyl.

As used herein, a cycloalkyl group can be a substituted or unsubstituted, cyclic saturated radical, and it is often an unsubstituted cyclic saturated radical. A cycloalkyl group typically comprises from 3 to 20 carbon atoms. A $C_{3-10}$ cycloalkyl group is an unsubstituted or substituted, cyclic saturated hydrocarbon radical, having from 3 to 10 carbon atoms. A $C_{3-6}$ cycloalkyl group is an unsubstituted or substituted, cyclic saturated hydrocarbon radical, having from 3 to 6 carbon atoms Typically it is, for example, cyclopropyl, cyclobutyl, cyclopentyl or cyclohexyl.

As used herein, a cycloalkenyl group can be a substituted or unsubstituted, cyclic unsaturated radical, and it is often an unsubstituted cyclic unsaturated radical. A cycloalkenyl group typically comprises from 3 to 20 carbon atoms. A cycloalkenyl group may comprise one or more double bonds (dependent on the number of carbon atoms present in the ring). A $C_{4-10}$ cycloalkenyl group is an unsubstituted or substituted, cyclic unsaturated hydrocarbon radical, having from 4 to 10 carbon atoms. A $C_{4-10}$ cycloalkenyl group is an unsubstituted or substituted, cyclic unsaturated hydrocarbon radical, having from 3 to 6 carbon atoms Typically it is, for example, cyclobutenyl, cyclopentenyl or cyclohexenyl.

As used herein, an alkyloxy group is a radical comprising an alkyl group as defined herein bound to an oxygen radical. That is, an alkoxy group has the formula —O-alkyl, wherein the alkyl radical is as defined herein. A $C_{1-10}$ alkyloxy group is therefore a radical of formula —O-alkyl wherein the alkyl radical is a $C_{1-10}$ alkyl radical as defined herein.

As used herein, an alkenyloxy group is a radical comprising an alkenyl group as defined herein bound to an oxygen radical. That is, an alkenyloxy group has the formula —O-alkenyl, wherein the alkenyl radical is as defined herein. A $C_{1-10}$ alkenyloxy group is therefore a radical of formula —O-alkenyl wherein the alkenyl radical is a $C_{1-10}$ alkenyl radical as defined herein.

The term "halide" as used herein indicates the singly charged anion of an element in group VIII of the periodic table. "Halide" includes fluoride, chloride, bromide and iodide.

The term "halo" as used herein indicates a halogen atom. Exemplary halo species include fluoro, chloro, bromo and iodo species.

As used herein, an aryl group is a substituted or unsubstituted, monocyclic or bicyclic aromatic group which typically contains from 6 to 14 carbon atoms, often from 6 to 12 carbon atoms and preferably from 6 to 10 carbon atoms in the ring portion. A $C_{6-12}$ aryl group is a substituted or unsubstituted, monocyclic or bicyclic aromatic group which contains from 6 to 12 carbon atoms. Examples include phenyl, naphthyl, indenyl and indanyl groups.

As used herein, an amino group is a radical of formula —$NR_2$, wherein each R is a substituent. R is usually selected from hydrogen, alkyl, alkenyl, cycloalkyl, or aryl, wherein each of alkyl, alkenyl, cycloalkyl and aryl are as defined herein. Typically, each R is selected from hydrogen, $C_{1-10}$ alkyl, $C_{2-10}$ alkenyl, and $C_{3-10}$ cycloalkyl. Preferably, each R is selected from hydrogen, $C_{1-6}$ alkyl, $C_{2-6}$ alkenyl, and $C_{3-6}$ cycloalkyl. More preferably, each R is selected from hydrogen and $C_{1-6}$ alkyl.

A typical amino group is an alkylamino group, which is a radical of formula —$NR_2$ wherein at least one R is an alkyl group as defined herein. A $C_{1-6}$ alkylamino group is an alkylamino group comprising 1 to 6 carbon atoms.

As used herein, an imino group is a radical of formula $R_2C$═N— or —C(R)═NR, wherein each R is a substituent. That is, an imino group is a radical comprising a C═N moiety, having the radical moiety either at the N atom or attached to the C atom of said C═N bond. R is as defined herein: that is, R is usually selected from hydrogen, alkyl, alkenyl, cycloalkyl, or aryl, wherein each of alkyl, alkenyl, cycloalkyl and aryl are as defined herein. Typically, each R is selected from hydrogen, $C_{1-10}$ alkyl, $C_{2-10}$ alkenyl, and $C_{3-10}$ cycloalkyl. Preferably, each R is selected from hydrogen, $C_{1-6}$ alkyl, $C_{2-6}$ alkenyl, and $C_{3-6}$ cycloalkyl. More preferably, each R is selected from hydrogen and $C_{1-6}$ alkyl.

A typical imino group is an alkylimino group, which is a radical of formula $R_2C$═N— or —C(R)═NR wherein at least one R is an alkyl group as defined herein. A $C_{1-6}$ alkylimino group is an alkylimino group wherein the R substituents comprise from 1 to 6 carbon atoms.

The term "ester" as used herein indicates an organic compound of the formula alkyl-C(═O)—O-alkyl, wherein the alkyl radicals are the same or different and are as defined herein. The alkyl radicals may be optionally substituted.

The term "ether" as used herein indicates an oxygen atom substituted with two alkyl radicals as defined herein. The alkyl radicals may be optionally substituted, and may be the same or different.

The term "perovskite", as used herein, refers to a material with a three-dimensional crystal structure related to that of $CaTiO_3$ or a material comprising a layer of material, which layer has a structure related to that of $CaTiO_3$. A material with a three-dimensional crystal structure related to that of $CaTiO_3$ may be referred to as having a "3D perovskite structure", and a perovskite according to this definition may therefore be referred to as a "3D perovskite". The structure of $CaTiO_3$ can be represented by the formula $ABX_3$, wherein A and B are cations of different sizes and X is an anion. In the unit cell, the A cations are at (0,0,0), the B cations are at (½, ½, ½) and the X anions are at (½, ½, 0). The A cation is usually larger than the B cation. The skilled person will appreciate that when A, B and X are varied, the different ion sizes may cause the structure of the perovskite material to distort away from the structure adopted by $CaTiO_3$ to a lower-symmetry distorted structure. The symmetry will also be lower if the material comprises a layer that has a structure related to that of $CaTiO_3$. Materials comprising a layer of perovskite material are well known. For instance, the structure of materials adopting the $K_2NiF_4$-type structure comprises a layer of perovskite material. These are referred to in the art as "2D layered perovskites", being different in structure from the above-mentioned 3D perovskites. 2D layered perovskites can be represented by the formula $[A]_2[M][X]_4$, wherein [A] is at least one cation, [M] is at least one cation of a different size to the cation(s) A and [X] is at least one anion.

The skilled person will appreciate that a perovskite material can be represented by the formula $[A][B][X]_3$, wherein [A] is at least one cation, [B] is at least one cation and [X] is at least one anion. When the perovskite comprise more than one A cation, the different A cations may distributed over the A sites in an ordered or disordered way. When the perovskite comprises more than one B cation, the different B cations may distributed over the B sites in an ordered or disordered way. When the perovskite comprise more than one X anion, the different X anions may distributed over the X sites in an ordered or disordered way. The symmetry of a perovskite comprising more than one A cation, more than one B cation or more than one X cation, will be lower than that of $CaTiO_3$.

The term "metal halide perovskite", as used herein, refers to a perovskite, the formula of which contains at least one metal cation and at least one halide anion.

The term "mixed halide perovskite" as used herein refers to a perovskite or mixed perovskite which contains at least two types of halide anion.

The term "mixed cation perovskite" as used herein refers to a perovskite of mixed perovskite which contains at least two types of A cation.

The term "hexahalometallate", as used herein, refers to a compound which comprises an anion of the formula $[MX_6]^{n-}$, wherein M is a metal atom, each X is independently a halide anion and n is an integer from 1 to 4.

The term "optoelectronic device", as used herein, refers to devices which source, control, detect or emit light. Light is understood to include any electromagnetic radiation. Examples of optoelectronic devices include photovoltaic devices, photodiodes, solar cells, photodetectors, phototransistors, photomultipliers, photoresistors, chromogenic devices, light-sensitive transistors, light emitting devices, light emitting diodes and charge injection lasers.

The term "consisting essentially of" refers to a composition comprising the components of which it consists essentially as well as other components, provided that the other components do not materially affect the essential characteristics of the composition. Typically, a composition consisting essentially of certain components will comprise greater than or equal to 95 wt % of those components or greater than or equal to 99 wt % of those components.

Process

The process of the invention comprises treating both an A precursor comprising an A cation, and an M precursor comprising an M cation, with an oxide precursor comprising an element Z. The process of the invention therefore comprises bringing into contact an A precursor as defined herein, an M precursor as defined herein and an oxide precursor as defined herein.

The process typically occurs in a fluid phase. In some embodiments, the process occurs in the gaseous phase. For example, in some embodiments the process comprises treating a gaseous A precursor and a gaseous M precursor with a gaseous oxide precursor.

In some embodiments, the process occurs in the liquid phase. For example, in some embodiments the process comprises treating an A precursor in solution and an M precursor in solution with an oxide precursor in solution.

In yet other embodiments, the process may involve both the liquid phase and the gas phase. For example, the process may comprise treating an A precursor in solution and an M precursor in solution with a gaseous oxide precursor. By "in solution" is meant that the relevant precursor is dissolved in a solution containing one or more solvents.

Embodiments wherein the process occurs in in the liquid phase or in solution are preferred for reasons of convenience as they do not require the generation and control of vapourised precursor compounds. Preferably, therefore, one or more of the A precursor, the M precursor and the oxide precursor are in solution. In a preferred embodiment of the process of the invention, each of the A precursor, the M precursor and the oxide precursor are in solution. In such a case, the process may comprise treating an A precursor in solution and an M precursor in solution with an oxide precursor in solution.

The A precursor, the M precursor and the oxide precursor may involve one or more solutions. In some embodiments, each precursor is initially present in a different solution at the start of the process of the invention. For example, the process may comprise treating a first solution (which first solution comprises an M precursor and a first solvent) with a second solution (which second solution comprises an oxide precursor and a second solvent) and with a third solution (which third solution comprises an A precursor and a third solvent). Typically, in these embodiments the process comprises mixing said first solution, said second solution and said third solution. For example, in an aspect of this embodiment the process may comprise disposing said first solution, said second solution and said third solution together on a substrate.

In other embodiments, two of the precursors may be present in the same solution. Such embodiments may be preferred as they require the manipulation of fewer solutions. Thus, in a typical example of these embodiments of the process of the invention, the said A precursor and said M precursor are present in a first solution, which first solution comprises the A precursor, the M precursor, and a first solvent. That is, the process may comprise treating a first solution comprising an A precursor, an M precursor and a first solvent with an oxide precursor.

In some embodiments of the process of the invention, the oxide precursor is present in a second solution, which second solution comprises the oxide precursor and a second solvent.

Often, the process of the invention involves two solutions. Thus, in the process of the invention, one or more of the precursors may be present in a first solution, and one or more precursors may be present in a second solution. The advantage of using two or more different solutions is that the precursors can be kept separate, and hence do not react, until the first and second solutions are contacted. For example, the process may comprise treating a first solution with a second solution, wherein:

- the first solution comprises the M precursor and a first solvent;
- the second solution comprises the oxide precursor and a second solvent; and
- either the first solution or the second solution comprises the A precursor.

In a preferred aspect, the process may comprise treating a first solution with a second solution, wherein:

- the first solution comprises the A precursor, the M precursor and a first solvent; and
- the second solution comprises the oxide precursor and a second solvent.

According to the above-described processes, a reaction to produce the stabilised A/M/X material occurs when all of the A precursor, the M precursor and the oxide precursor meet. The process generates a stabilised A/M/X material, rather than producing an A/M/X material which is subsequently treated with an oxide precursor.

Where present, the said first solution comprises the said first solvent and the M precursor. Typically, therefore, the first solvent is a solvent which is capable of dissolving the M precursor. Usually the first solvent is an organic solvent, and preferably a polar organic solvent. Polar organic solvents are preferred as they are usually capable of dissolving ionic compounds, and the M precursor is often an organic compound. Suitable examples of the first solvent are dimethyl sulfoxide (DMSO), dimethylformamide (DMF), N-methyl-2-pyrrolidone (NMP), and gamma-butyrolactone (GBL).

It should be noted that the first solution may comprise one or more compound(s) and/or one or more solvent(s) in addition to the M precursor compound and the first solvent. For example, the first solution may comprise a first solvent selected from dimethyl sulfoxide (DMSO), dimethylformamide (DMF), N-methyl-2-pyrrolidone (NMP), gamma-butyrolactone (GBL) and one or more additional solvents, typically each selected from that group.

Where present, the said second solution comprises the said second solvent and the oxide precursor. Typically, therefore, the second solvent is a solvent which is capable of dissolving the oxide precursor. The nature of the second solvent is therefore not particularly limited. Generally, the second solvent is an organic solvent which may be polar or non-polar. Often, however, the second solvent is a weakly polar or non-polar solvent. Typically, the second solvent may be selected from optionally substituted aryl species, optionally substituted esters and optionally substituted ethers. Exemplary second solvents include for example, toluene, chlorobenzene, anisole, methyl acetate, ethyl acetate, diethyl ether, chloroform, and dichlorobenzene.

It should be noted that the second solution may comprise one or more compound(s) and/or one or more solvent(s) in addition to the oxide precursor compound and the second solvent. For example, the second solution may comprise a second solvent selected from an optionally substituted aryl species, an optionally substituted ester or an optionally substituted ether; and one or more additional solvents selected from that group. In particular, the second solution may comprise a second solvent selected from toluene, chlorobenzene, anisole, methyl acetate, ethyl acetate, diethyl ether, chloroform, and dichlorobenzene and one or more additional solvents, typically each selected from that group.

In some embodiments, the A precursor is present in a third solution. Where present, the said third solution comprises the said third solvent and the A precursor. Typically, therefore, the third solvent is a solvent which is capable of dissolving the A precursor. Usually the third solvent is an organic solvent, and preferably a polar organic solvent. Polar organic solvents are preferred as they are usually capable of dissolving ionic compounds, and the A precursor is often an organic compound. Suitable examples of the third solvent are dimethyl sulfoxide (DMSO), dimethylformamide (DMF), N-methyl-2-pyrrolidone (NMP), and gamma-butyrolactone (GBL). The third solution may comprise one or more compound(s) and/or one or more solvent(s) in addition to the A precursor compound and the third solvent. For example, the third solution may comprise a third solvent selected from dimethyl sulfoxide (DMSO), dimethylformamide (DMF), N-methyl-2-pyrrolidone (NMP), gamma-butyrolactone (GBL) and one or more additional solvents, typically each selected from that group.

Accordingly, in an exemplary embodiment of the process of the invention, the process comprises treating a first solution with a second solution, wherein:

- the first solution comprises a first solvent and an M precursor comprising an M cation;
- the second solution comprises a second solvent and an oxide precursor comprising an element Z;
- either the first solution or the second solution (preferably the first solution) comprises an A precursor comprising an A cation;
- the first solvent is selected from dimethyl sulfoxide (DMSO), dimethylformamide (DMF), N-methyl-2-pyrrolidone (NMP), or gamma-butyrolactone (GBL); and
- the second solvent is selected from toluene, chlorobenzene, anisole, methyl acetate, ethyl acetate, diethyl ether, chloroform, or dichlorobenzene.

In a preferred embodiment of the process of the invention, the process comprises a step of treating the A precursor, the M precursor and the oxide precursor with an anti-solvent. An anti-solvent is a solvent in which the stabilised A/M/X material is sparingly soluble or insoluble. "Insoluble" and "sparingly soluble" here have their usual meaning to the skilled person in the art. Typically, the solubility of the stabilised A/M/X material in the anti-solvent is 10 g/l or less, preferably 1 g/l or less, for example 0.1 g/l or less or 0.01 g/l or less.

Thus, in a preferred embodiment of the process of the invention, the process involves treating the A precursor and the M precursor with a second solution comprising the oxide precursor and a second solvent, wherein the compound of formula $[A]_a[M]_b[X]$, is insoluble in said second solvent. The said second solution may optionally comprise the A precursor.

The anti-solvent is typically a weakly polar or non-polar organic solvent. Exemplary anti-solvents include a substituted aryl species (typically substituted benzene) or benzene, an optionally substituted ester or an optionally substituted ether. Particularly preferably the anti-solvent is selected from toluene, chlorobenzene, anisole, methyl acetate, ethyl acetate, diethyl ether, chloroform, isopropanol, ethanol, methanol or dichlorobenzene.

Where the second solvent is an anti-solvent, the second solution may comprise one or more additional solvents. For example, the second solution may comprise one or more additional solvents which are also anti-solvents.

The advantage of the anti-solvent is that it encourages precipitation of the stabilised A/M/X material of the invention as soon as it is formed.

An anti-solvent need not be provided together with any precursor species. Thus, in some embodiments, the process comprises treating an A precursor and an M precursor with an M precursor with an oxide precursor, thus forming a reaction mixture, and subsequently treating the reaction mixture with an anti-solvent as defined herein. For example, in an exemplary embodiment the process comprises treating a first solution with a second solution to form a reaction mixture, wherein:

- the first solution comprises a first solvent and an M precursor comprising an M cation;
- the second solution comprises a second solvent and an oxide precursor comprising an element Z;
- either the first solution or the second solution (preferably the first solution) comprises an A precursor comprising an A cation; and
- subsequently treating the reaction mixture with an anti-solvent.

As noted above, where present, each of the first solution, the second solution and the third solution may comprise additional components. However, in a preferred embodiment of the invention, each of these solutions (where present) is free of aliphatic ligands. Thus, in a preferred embodiment, the process of the invention is performed in the absence of aliphatic ligands.

By "aliphatic ligands" is meant ligands comprising a hydrocarbon tail. Typical examples of aliphatic ligands include amines, aliphatic phosphoric acids and carboxylic acids. For example, aliphatic ligands include $L^1COOH$ and $L^1L^2L^3$ N. $L^1$ is selected from optionally substituted $C_4$-$C_{20}$ alkyl, $C_4$-$C_{20}$ alkenyl and $C_4$-$C_{20}$ cycloalkyl; preferably unsubstituted $C_4$-$C_{20}$ alkyl, $C_4$-$C_{20}$ alkenyl and $C_4$-$C_{20}$ cycloalkyl. $L^2$ and $L^3$ are each independently selected from H, optionally substituted $C_1$-$C_6$ alkyl, $C_2$-$C_6$ alkenyl and $C_3$-$C_6$ cycloalkyl; preferably H or unsubstituted $C_1$-$C_6$ alkyl, $C_2$-$C_6$ alkenyl and $C_3$-$C_6$ cycloalkyl; most preferably H.

In the process of the invention, the oxide precursor produces the oxide $[Z]_pO_q$. This oxide is generated by oxidation of the oxide precursor. Accordingly, in the process of the invention, the oxide precursor is treated with an oxidant. Suitable oxidants include oxygen and water; most commonly the oxidant is water. Accordingly, in the process of the invention the treating of the A precursor and the M precursor with the oxide precursor is generally carried out in the presence of water.

Usually it is not necessary to include a step of addition of an oxidant, e.g. water, in the process of the invention. The oxide precursor is typically a reactive species which readily reacts with the oxidant (typically water). Often, traces of the oxidant (usually oxygen or water, most commonly water) in the atmosphere, or for example in the first solvent and/or in the second solvent where present, can be relied on to provide sufficient oxygen for the process of the invention.

In some embodiments, the process of the invention comprises treating an A precursor and an M precursor with the oxide precursor and water. As discussed above, the water may be present in the atmosphere or in a solvent used in the process. Alternatively, water may be actively added to the reaction mixture. For example, the reaction may comprise a step of adding water to the first solvent (generally not the second solvent, to avoid reaction of water with the oxide precursor before the process of the invention). In other embodiments, for instance where the process is carried out in the vapour phase, the process may comprise providing water vapour or steam to the gaseous A precursor or the gaseous M precursor, or to the gaseous reaction mixture. Typically, trace amounts of water or oxygen are relied on and there is no need for active addition of water or oxygen.

Typically, the process of the invention produces the stabilised crystalline A/M/X material on a substrate. Usually, therefore, the process involves treating (a) an A precursor comprising an A cation; and (b) an M precursor comprising an M cation;

with an oxide precursor comprising an element Z in the presence of a substrate.

The precursors may be mixed to form a reaction mixture, after which the reaction mixture is exposed to (e.g. disposed on) a substrate. However, in other embodiments, the process comprises disposing one or more precursors on the substrate before said precursor(s) is/arc treated with the other precursor(s). This latter embodiment is preferred as it allows the stabilised crystalline A/M/X material to be produced directly on the desired substrate.

In a preferred embodiment, the process comprises disposing the A precursor and the M precursor on a substrate before treating the A precursor and the M precursor with the oxide precursor.

Where the reaction is carried out in the gaseous phase, the process typically comprises exposing the gaseous reaction mixture to the substrate. In this embodiment, the process usually involves treating a gaseous A precursor and a gaseous M precursor with a gaseous oxide precursor, and optionally with water vapour, in the presence of a substrate. For example, the process may comprise exposing the reaction mixture comprising the gaseous A precursor, the gaseous M precursor, the gaseous oxide precursor and optionally water vapour to a substrate.

When the reaction is carried out in the liquid phase, the process typically comprises exposing the liquid reaction mixture to the substrate. In some embodiments, the process may firstly comprise preparing a liquid reaction mixture comprising an A precursor, an M precursor and an oxide precursor and subsequently exposing said liquid reaction mixture to a substrate. In other embodiments, one or more precursors are disposed on a substrate prior to treatment with one or more other precursors.

In some embodiments, therefore, the process of the invention comprises

- disposing a first solution on a substrate; and
- treating the first solution with a second solution, wherein:
- the first solution comprises a first solvent and an M precursor comprising an M cation;
- the second solution comprises a second solvent and an oxide precursor comprising an element Z;
- either the first solution or the second solution (preferably the first solution) comprises an A precursor comprising an A cation.

The substrate is a solid. The nature of the substrate is not particularly limited. For example, the substrate may simply be glass, e.g. a glass slide. More typically, the substrate is a material which is useful in the manufacture of an optoelectronic device as defined herein.

For example, the substrate may comprise one or more of: a semiconductor; an n-type semiconductor; a p-type semiconductor; an electrode; a dielectric scaffold material, and a polymer as defined herein.

The process may comprise one or more preliminary steps in order to prepare the precursors. Where the process occurs entirely in the vapour phase, for instance, the process may comprise generating each of the precursors in gaseous form. Such a process may involve heating the precursors, optionally under a low pressure inert gas atmosphere or under vacuum. The gaseous precursors may be generated together or each generated separately.

Where the process occurs in solution, the process may comprise generating one or more solutions. For example, the process may comprise:

- generating a first solution comprising an M precursor dissolved in a first solvent;
- generating a second solution comprising an oxide precursor dissolved in a second solvent;
- generating a third solution comprising an A precursor dissolved in a third solvent; and
- treating the first solution and the third solution with the second solution.

Preferably, the treatment step of the process may involve mixing only two solutions. For example, the process may comprise:

- generating a first solution comprising an M precursor and optionally an A precursor dissolved in a first solvent;
- generating a second solution comprising an oxide precursor and optionally an A precursor dissolved in a second solvent; and
- treating the first solution with the second solution.

The process preferably further comprises disposing the first solution on a substrate, and optionally further comprises also disposing the second solution on the substrate.

The process of the invention may also comprise further steps for processing the stabilised crystalline A/M/X material.

Typically, the process of the invention further comprises recovering the stabilised crystalline A/M/X material from the reaction mixture. For example, the process of the invention may further comprise removing any solvent present from the stabilised crystalline A/M/X material. Preferably, the process of the invention comprises removing the first solvent and the second solvent from the stabilised crystalline A/M/X material. Other optional further process steps include washing the stabilised crystalline A/M/X material or drying the stabilised crystalline A/M/X material.

The product of the process is a product as described herein. Thus, the process of the invention may be a process for producing a stabilised crystalline A/M/X material, which stabilised crystalline A/M/X material comprises a crystal of a compound of formula $[A]_a[M]_b[X]_c$, the crystal having an oxide coating of formula $[Z]_pO_q$ on its entire surface, wherein:

- [Z] comprises at least one element Z capable of forming an oxide with a band gap of at least 3 eV;
- p and q are positive numbers;
- [A] comprises one or more A cations;
- [M] comprises one or more M cations;
- [X] comprises one or more X anions;
- a is an integer from 1 to 6;
- b is an integer from 1 to 6; and
- c is an integer from 1 to 18, and wherein the process comprises treating:

(a) an A precursor comprising an A cation; and (b) an M precursor comprising an M cation;

with an oxide precursor comprising an element Z.

Typically, the process is a process for producing a stabilised A/M/X material which is a polycrystalline material comprising a crystal of a compound of formula $[A]_a[M]_b[X]_c$, the crystal having an oxide coating of formula $[Z]_pO_q$ on its entire surface.

Thus, the process may be a process for producing a stabilised A/M/X material which is a polycrystalline material comprising a crystal of a compound of formula $[A]_a[M]_b[X]_c$, the crystal having an oxide coating of formula $[Z]_pO_q$ on its entire surface, wherein at least a part of the said oxide coating is located at a crystal grain boundary.

The process may be a process for producing a stabilised A/M/X material which is a polycrystalline material comprising a plurality of crystallites comprising a compound of formula $[A]_a[M]_b[X]_c$, and a plurality of grain boundaries between the said crystallites, wherein an oxide of formula $[Z]_pO_q$ is distributed along the grain boundaries, wherein

[Z] comprises at least one element Z capable of forming an oxide with a band gap of at least 3 eV;

p and q are positive numbers;

[A] comprises one or more A cations;

[M] comprises one or more M cations;

[X] comprises one or more X anions;

a is an integer from 1 to 6;

b is an integer from 1 to 6; and c is an integer from 1 to 18.

Typically, the crystallites are substantially free of oxide. For instance, the crystallites may comprise less than 20% oxygen by weight, preferably less than 10% oxygen by weight or less than 5% oxygen by weight.

Oxide

The stabilised A/M/X material of the invention comprises an oxide. The oxide protects the A/M/X material from environmental factors such as water an oxygen. The oxide moreover stabilises the crystalline A/M/X material and extends its photoluminescence lifetime. This is indicative of reducing the electronic trap density within the material. The oxide typically also increases the photoluminescence yield of the crystalline A/M/X material.

In order to have the above advantageous effects on photoluminescence yield and increased photoluminescence decay lifetime, the oxide should not absorb light emitted by the A/M/X material itself. Accordingly, the oxide has a band gap of at least 3 eV. 3 eV corresponds to a wavelength of approximately 413 nm. Thus, the oxide of the invention typically does not absorb light having a wavelength of over 413 nm. Preferably, the oxide will have a band gap wider than 3.06 eV, corresponding to approximately 405 nm wavelength. This is in order that the A/M/X material can be photo excited by a GaN LED, which may have an emission wavelength as short as 405 nm, depending upon the In doping of the emission layer in the GaN LED. In consequence, the band gap of the oxide is large enough that the oxide does not absorb any light (particularly blue light) emitted by the A/M/X material, or by the photo excitation sources commonly used to excite the A/M/X material.

This is particularly advantageous for the manufacture of optoelectronic devices such as LEDs or phosphors where the device comprises a light source which emits visible light such as blue light. The large band gap of the oxide also prevents the oxide from absorbing light emitted by an optical source in the optoelectronic device.

The oxide therefore has a band gap of at least 3 eV. Preferably, the oxide has a band gap of at least 3.5 eV or at least 4 eV.

Preferably, the oxide is transparent to visible light. By this is meant that the oxide preferably does not absorb light of wavelengths from 420 nm to 700 nm More preferably the oxide does not absorb light of wavelengths from 400 to 750 nm. By "light" is meant electromagnetic radiation.

Also preferably, the oxide is not reactive towards water or oxygen. For example the oxide may not react with water or oxygen at 300 K.

The oxide is a compound of formula $[Z]_pO_q$, wherein [Z] comprises at least one element Z capable of forming an oxide with a band gap of at least 3 eV and p and q are positive numbers.

The precise value of p and q will depend on the element or elements present in [Z]. The numbers p and q are both greater than zero. In general, p and q are greater and 0 and less than 20. For example, p and q are typically 0.01 or more and 20 or less.

Usually, p is an integer. Also usually, q is an integer. Typically, p and q are each from 1 to 10. Therefore p may generally be 1, 2, 3, 4, 5, 6, 7, 8, 9 or 10, and q may generally be 1, 2, 3, 4, 5, 6, 7, 8, 9, or 10. Usually, p is from 1 to 5. Also usually, q is from 0 to 5. For example, both p and q may each be 1, 2, 3, 4, or 5. Preferably, p is 1 or 2. Also preferably, q is 1, 2, 3 or 4.

The oxide $[Z]_pO_q$ comprises component [Z], which may comprise one or more elements Z. For example, [Z] may comprise two, three or four elements Z. In a preferred embodiment, [Z] may consist of only one element Z.

Each element Z is an element which is capable of forming an oxide with a band gap of at least 3 eV. Generally, each element Z is an element which is capable of forming an oxide of formula $Z_{pp}O_{qq}$, wherein pp and qq are positive integers. Typically, pp is 1, 2, 3, 4, 5, 6, 7, 8, 9 or 10. Also typically, qq is 1, 2, 3, 4, 5, 6, 7, 8, 9, or 10. Usually, pp is from 1 to 5. Also usually, qq is from 0 to 5. For example, both pp and qq may each be 1, 2, 3, 4, or 5. Preferably, pp is 1 or 2. Also preferably, qq is 1, 2, 3 or 4.

Suitable examples of elements from which element Z may be selected include Al, Si, Zr, Ga, Ba, Nb, Mg, Y, Ti, Ni, and Zn. Accordingly, in a typical embodiment, the oxide comprises an element Z selected from Al, Si, Zr, Ga, Ba, Nb, Mg, Y, Ti, Ni, and Zn. In a preferred aspect of this embodiment where [Z] comprises two or more elements Z, each element Z is selected from Al, Si, Zr, Ga, Ba, Nb, Mg, Y, Ti, Ni, and Zn.

Preferably, element Z may be selected from Al, Zr or Si. Accordingly, in a preferred embodiment of the invention, the oxide comprises an element Z selected from Al, Zr or Si. In a preferred aspect of this embodiment where [Z] comprises two or three elements Z, each element Z is selected from Al, Zr or Si.

In a particularly preferred embodiment of the invention, [Z] consists of one element Z which is Al.

For example, the oxide of the invention may comprise one or more of alumina ($Al_2O_3$), aluminium silicate ($Al_2SiO_5$), zirconia ($ZrO_2$), silica ($SiO_2$) or mixtures thereof.

Oxide Precursor

The oxide precursor is a species capable of reacting with an oxidant to produce an oxide as defined herein. Accordingly, where the oxide (which has a formula $[Z]_pO_q$) comprises two or more elements Z, the oxide precursor also comprises said two or more elements Z. The oxide precursor comprises all elements Z present in the oxide $[Z]_pO_q$.

Herein, therefore, the term "oxide precursor" may indicate a single compound comprising a single element Z; a single compound comprising a plurality of elements Z; or a plurality of compounds each comprising one or more elements Z. Reference herein to the "oxide precursor" should therefore be understood to be referring both to a single species and to a plurality of component species. It is preferred for the purpose of minimising complexity that the oxide precursor comprises a single compound containing all the elements Z present in [Z].

The oxide precursor is typically reactive towards an oxidant. For example, the oxide precursor is typically reactive towards water and/or oxygen. It should be noted that by "reactive towards water" is meant to indicate that the oxide precursor will react with $H_2O$, whether the $H_2O$ is in liquid or gaseous form. In preferred embodiments, the oxide precursor is reactive towards water. In particularly preferred embodiments, the oxide precursor will spontaneously react with water at 300 K to produce the oxide $[Z]_pO_q$.

Usually, the oxide precursor comprises one or more elements Z and a labile ligand or ligands. "Labile" takes its usual meaning in the art. The skilled person would readily be able to select a labile ligand or ligands suitable for the oxide precursor to be used in the process of the invention. Suitable examples of labile ligands include unstable organic ligands.

Particular examples of unstable organic ligands include alkyl, alkenyl, cycloalkyl, alkyloxy, alkenyloxy, and hydride ligands.

In some embodiments of the process of the invention, the oxide precursor comprises one or more compounds of formula $ZR_n$; wherein n is a number from 1 to 6; and each R is independently selected from optionally substituted $C_{1-10}$ alkyl, $C_{2-10}$ alkenyl, $C_{3-10}$ cycloalkyl, $C_{1-10}$ alkyloxy, $C_{2-10}$ alkenyloxy, hydride, and halide; preferably unsubstituted substituted $C_{1-10}$ alkyl, $C_{2-10}$ alkenyl, $C_{3-10}$ cycloalkyl, $C_{1-10}$ alkyloxy, $C_{2-10}$ alkenyloxy, hydride, and halide.

Preferably n is an integer of from 1 to 6.

In a particularly preferred embodiment of the process, the oxide precursor comprises one or more organometallic compounds of formula $ZR_n$, wherein n is a number (preferably an integer) of from 1 to 5 (preferably from 2 to 4) and each R is independently selected from unsubstituted $C_{1-6}$ alkyl and $C_{1-6}$ alkyloxy. In a particularly preferred aspect of this embodiment, R is methyl and n is 3.

Exemplary oxide precursors include triethylaluminium and trimethylaluminium, preferably trimethylaluminium.

Compound of formula $[A]_a[M]_b[X]_c$

The stabilised crystalline A/M/X material of the invention comprises a compound of formula $[A]_a[M]_b[X]_c$. The compound of formula $[A]_a[M]_b[X]_c$ is usually crystalline. Within this compound, [A] comprises one or more A cations; [M] comprises one or more M cations; [X] comprises one or more X anions; a is an integer from 1 to 6; b is an integer from 1 to 6; and c is an integer from 1 to 18. a is often an integer from 1 to 3, b is often an integer from 1 to 3, and c is often an integer from 1 to 8.

In the embodiment where [A] comprises two or more A cations, each individual A cation may be denoted herein as $A^I$, $A^{II}$, $A^{III}$ and so on respectively. Similarly, where [M] comprises two or more M cations, each individual M cation may be denoted as $M^I$, $M^{II}$, $M^{III}$ etc. respectively, and where [X] comprises two or more X anions each individual X anion may be denoted as $X^I$, $X^{II}$, $X^{III}$ etc. respectively.

In the compound of formula $[A]_a[M]_b[X]_c$, generally:

[A] comprises one or more A cations, which A cations may for instance be selected from alkali metal cations or organic monocations;

[M] comprises one or more M cations which are metal or metalloid cations selected from $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$, $Te^{4+}$, $Bi^{3+}$, $Sb^{3+}$, $Sn^{2+}$, $Pb^{2+}$, $Cu^{2+}$, $Ge^{2+}$ and $Ni^{2+}$; and

[X] comprises one or more X anions selected from halide anions (e.g. $Cl^-$, $Br^-$, and $I^-$), $O^{2-}$, $S^{2-}$, $Se^{2-}$, and $Te^{2-}$;

a is an integer from 1 to 3;

b is an integer from 1 to 3; and c is an integer from 1 to 8.

Typically, the stabilised crystalline A/M/X material comprises a perovskite or a hexahalometallate. Preferably the stabilised crystalline material comprises a perovskite. The stabilised crystalline material often comprises a metal halide perovskite.

Typically, a=1, b=1 and c=3. Thus, typically, the crystalline A/M/X material comprises: a perovskite of formula (I):

$$[A][M][X]_3 \qquad (I)$$

wherein: [A] comprises one or more A cations which are monocations; [M] comprises one or more M cations which are metal or metalloid dications; and [X] comprises one or more anions which are halide anions.

[A] comprises one or more A cations which may be organic and/or inorganic monocations. Where an A species is an organic monocation, A is typically selected from $C_{1-10}$ alkylammonium, $C_{2-10}$ alkenylammonium, $C_{1-10}$ alkyliminium, $C_{3-10}$ cycloalkylammonium and $C_{3-10}$ cycloalkyliminium optionally substituted with one or more substituents selected from amino, $C_{1-6}$ alkylamino, imino, $C_{1-6}$ alkylimino, $C_{1-6}$ alkyl, $C_{2-6}$ alkenyl, $C_{3-6}$ cycloalkyl and $C_{6-12}$ aryl. For example, A may be selected from $(CH_3NH_3)^+$, $(CH_3CH_2NH_3)^+$, $(CH_3CH_2CH_2NH_3)^+$, $(N(CH_3)_4)^+$, $(H_2N{-}C(H){=}NH_2)^+$ and $(H_2N{-}C(CH_3){=}NH_2)^+$. Where an A species is an inorganic monocation, A is typically an alkali metal monocation (that is, a monocation of a metal found in Group 1 of the periodic table), for example $Cs^+$ or $Rb^+$.

[A] usually comprises one, two or three A monocations. Preferably, A comprises a single cation selected from $(CH_3NH_3)^+$, $(CH_3CH_2NH_3)^+$, $(CH_3CH_2CH_2NH_3)^+$, $(N(CH_3)_4)^+$, $(H_2N{-}C(H){=}NH_2)^+$, $(H_2N{-}C(CH_3){=}NH_2)^+$, $Cs^+$ and $Rb^+$. Alternatively, [A] may comprise two cations selected from this group, for instance $Cs^+$ and $(H_2N{-}C(CH_3){=}NH_2)^+$, or for instance $Cs^+$ and $Rb^+$.

[M] comprises one or more M cations which are metal or metalloid dications. For instance, [M] may comprise an M cation selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$. [M] typically comprises one or two M cations, and these are generally selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$; preferably $Pb^{2+}$ or $Sn^{2+}$. In one particularly preferred embodiment, [M] consists of $Pb^{2+}$. In another particularly preferred embodiment, [M] consists of $Pb^{2+}$ and $Sn^{2+}$.

[X] comprises one or more X anions. For instance, [X] may comprise an anion selected from $F^-$, $Br^-$, $Cl^-$ and $I^-$. [X] typically comprises one, two or three X anions and these are generally selected from $Br^-$, $Cl^-$ and $I^-$.

In one embodiment, the perovskite is a perovskite of the formula (IA):

$$[A^I_xA^{II}_{1-x}]MX_3 \qquad (IA)$$

wherein $A^I$ and $A^{II}$ are as defined above with respect to A, wherein M and X are as defined above and wherein x is greater than 0 and less than 1. In a preferred embodiment, $A^I$ and $A^{II}$ are each selected from $(CH_3NH_3)^+$, $(CH_3CH_2NH_3)^+$, $(CH_3CH_2CH_2NH_3)^+$, $(N(CH_3)_4)^+$, $(H_2N{-}C(H){=}NH_2)^+$, $(H_2N{-}C(CH_3){=}NH_2)^+$, $Cs^+$ and $Rb^+$; M is $Pb^{2+}$ and X is selected from $Br^-$, $Cl^-$ and $I^-$. $A^I$ and $A^{II}$ may for instance be $(H_2N—C(CH_3)═NH_2)^+$ and $Cs^+$ respectively. Alternatively, they may be $Cs^+$ and $Rb^+$ respectively.

In one embodiment, the perovskite is a perovskite compound of the formula (IB):

$$AM[X^I_y X^{II}_{1-y}]_3 \quad \text{(IA)}$$

wherein A and M are as defined above, wherein $X^I$ and $X^{II}$ are as defined above in relation to X and wherein y is greater than 0 and less than 1. In a preferred embodiment, A is selected from $(CH_3NH_3)^+$, $(CH_3CH_2NH_3)^+$, $(CH_3CH_2CH_2NH_3)^+$, $(N(CH_3)_4)^+$, $(H_2N—C(H)═NH_2)^+$, $(H_2N—C(CH_3)═NH_2)^+$, $Cs^+$ and $Rb^+$; M is $Pb^{2+}$ and $X^I$ and $X^{II}$ are each selected from $Br^-$, $Cl^-$ and $I^-$.

In a particularly preferred embodiment, the perovskite is a perovskite of the formula (IC):

$$[A^I_x A^{II}_{1-x}]M[X^I_y X^{II}_{1-y}]_3 \quad \text{(IC)}$$

wherein $A^I$ and $A^{II}$ are as defined above with respect to A, M is as defined above, $X^I$ and $X^{II}$ are as defined above in relation to X and wherein x and y are both greater than 0 and less than 1. In a preferred embodiment, $A^I$ and $A^{II}$ are each selected from $(CH_3NH_3)^+$, $(CH_3CH_2NH_3)^+$, $(CH_3CH_2CH_2NH_3)^+$, $(N(CH_3)_4)^+$, $(H_2N—C(H)═NH_2)^+$, $(H_2N—C(CH_3)═NH_2)^+$, $Cs^+$ and $Rb^+$; M is $Pb^{2+}$ and $X^I$ and $X^{II}$ are each selected from $Br^-$, $Cl^-$ and $I^-$.

In a further preferred embodiment, the perovskite is a perovskite of the formula (ID):

$$[A][M^I_z M^{II}_{1-z}][X]_3 \quad \text{(ID)}$$

wherein [A] and [X] are as defined herein, $M^I$ is $Pb^{2+}$, $M^{II}$ is $Sn^{2+}$, and wherein z is greater than 0 and less than 1.

Generally, in the above, x is from 0.01 to 0.99. For example, x may be from 0.05 to 0.95 or 0.1 to 0.9. Similarly, in the above, y is generally from 0.01 to 0.99. For example, y may be from 0.05 to 0.95 or 0.1 to 0.9. In an exemplary embodiment, x and y are both from 0.1 to 0.9.

In exemplary embodiments, the compound of formula $[A]_a[M]_b[X]_c$ is selected from $CsPbBr_3$, $CsPbCl_3$, $CsPbI_3$, $CsPb(Br_yCl_{1-y})_3$, $CsPb(Br_yI_{1-y})_3$, $CsPb(Cl_yI_{1-y})_3$, $(Cs_xRb_{1-x})PbBr_3$, $(Cs_xRb_{1-x})PbCl_3$, $(Cs_xRb_{1-x})PbI_3$, $(Cs_xRb_{1-x})Pb(Br_yCl_{1-y})_3$, $(Cs_xRb_{1-x})Pb(Br_yI_{1-y})_3$, and $(Cs_xRb_{1-x})Pb(Cl_yI_{1-y})_3$, wherein x and y are both greater than 0 and less than 1. Preferably, in these embodiments, x is from 0.01 to 0.99 and y is from 0.01 to 0.99; more preferably, x is from 0.05 to 0.95 and y is from 0.05 to 0.95.

In one embodiment, a=2, b=1 and c=4. In that embodiment, the stabilised crystalline A/M/X material comprises a compound (a "2D layered perovskite") of formula (II):

$$[A]_2[M][X]_4 \quad \text{(II)}$$

wherein: [A] comprises one or more A cations which are monocations; [M] comprises one or more M cations which are metal or metalloid dications; and [X] comprises one or more X anions which are halide anions. In this embodiment, the A and M cations, and the X anions, are as defined above in relation to the perovskite of formula (I).

In another embodiment, a=2, b=1 and c=6. In that embodiment, the crystalline A/M/X material may in that case comprise a hexahalometallate of formula (III):

$$[A]_2[M][X]_6 \quad \text{(III)}$$

wherein: [A] comprises one or more A cations which are monocations; [M] comprises one or more M cations which are metal or metalloid tetracations; and [X] comprises one or more X anions which are halide anions.

In a mixed monocation hexahalometallate, [A] comprises at least two A cations which are monocations; [M] comprises at least one M cation which is a metal or metalloid tetracation (and typically [M] comprises a single M cation which is a metal or metalloid tetracation); and [X] comprises at least one X anion which is a halide anion (and typically [X] comprises a single halide anion). In a mixed metal hexahalometallate, [A] comprises at least one monocation (and typically [A] is a single monocation); [M] comprises at least two metal or metalloid tetracations (for instance $Ge^{4+}$ and $Sn^{4+}$); and [X] comprises at least one halide anion (and typically [X] is a single halide anion). In a mixed halide hexahalometallate, [A] comprises at least one monocation (and typically [A] is a single monocation); [M] comprises at least one metal or metalloid tetracation (and typically [M] is a single metal tetra cation); and [X] comprises at least two halide anions, for instance $Br^-$ and $Cl^-$.

[A] may comprise at least one A monocation selected from any suitable monocations, such as those described above for a perovskite. In the case of a hexahalometallate, each A cation is typically selected from $Li^-$, $Na^-$, $K^-$, $Rb^+$, $Cs^+$, $NH_4^+$ and monovalent organic cations. Monovalent organic cations are singly positively charged organic cations, which may, for instance, have a molecular weight of no greater than 500 g/mol. For instance, [A] may be a single A cation which is selected from $Li^+$, $Na^+$, $K^+$, $Rb^+$, $Cs^+$, $NH_4^+$ and monovalent organic cations. [A] preferably comprises at least one A cation which is a monocation selected from $Rb^+$, $Cs^+$, $NH_4^+$ and monovalent organic cations. For instance, [A] may be a single inorganic A monocation selected from $Li^+$, $Na^+$, $K^+$, $Rb^+$, $Cs^+$ and $NH_4^+$. In another embodiment, [A] may be at least one monovalent organic A cation. For instance, [A] may be a single monovalent organic A cation.

Preferably, [A] comprises a single type of A cation, i.e. the hexahalometallate is a compound of formula $A_2[M][X]_6$. [A] may be a single A monocation selected from $K^+$, $Rb^+$, $Cs^+$, $NH_4^+$, $(CH_3NH_3)^+$, $(CH_3CH_2NH_3)^+$, $(CH_3CH_2CH_2NH_3)^+$, $(N(CH_3)_4)^+$, $(N(CH_2CH_3)_4)^+$, $(N(CH_2CH_2CH_3)_4)^+$, $(H_2N—C(H)═NH_2)^+$ and $(H_2N—C(CH_3)═NH_2)^+$. Preferably, [A] is a single A monocation selected from $Cs^+$, $NH_4^+$, $(CH_3NH_3)^+$, $(CH_3CH_2NH_3)^+$, $(N(CH_3)_4)^+$, $(N(CH_2CH_3)_4)^+$, $(H_2N—C(H)═NH_2)^+$ and $(H_2N—C(CH_3)═NH_2)^+$. In one embodiment, [A] is $(CH_3NH_3)^+$. In another embodiment, [A] is $(H_2N—C(H)═NH_2)^+$. In a further embodiment, [A] is $((NH_2)_2C(═NH))^+$.

[M] may comprise one or more M cations which are selected from suitable metal or metalloid tetracations. Metals include elements of groups 3 to 12 of the Periodic Table of the Elements and Ga, In, Tl, Sn, Pb, Bi and Po. Metalloids include Si, Ge, As, Sb, and Te. For instance, [M] may comprise at least one M cation which is a metal or metalloid tetracation selected from $Ti^{4+}$, $V^{4+}$, $Mn^{4+}$, $Fe^{4+}$, $Co^{4+}$, $Zr^{4+}$, $Nb^{4+}$, $Mo^{4+}$, $Ru^{4+}$, $Rh^{4+}$, $Pd^{4+}$, $Hf^{4+}$, $Ta^{4+}$, $W^{4+}$, $Re^{4+}$, $Os^{4+}$, $Ir^{4+}$, $Pt^{4+}$, $Sn^{4+}$, $Pb^{4+}$, $Po^{4+}$, $Si^{4+}$, $Ge^{4+}$, and $Te^{4+}$. Typically, [M] comprises at least one metal or metalloid tetracation selected from $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$, and $Te^{4+}$. For instance, [M] may be a single metal or metalloid tetracation selected from $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$, and $Te^{4+}$.

Typically, [M] comprises at least one M cation which is a metal or metalloid tetracation selected from $Sn^{4+}$, $Te^{4+}$, $Ge^{4+}$ and $Re^{4+}$. In one embodiment [M] comprises at least one M cation which is a metal or metalloid tetracation selected from $Pb^{4+}$, $Sn^{4+}$, $Te^{4+}$, $Ge^{4+}$ and $Re^{4+}$. For instance, [M] may comprise an M cation which is at least one metal or metalloid tetracation selected from $Pb^{4+}$, $Sn^{4+}$, $Te^{4+}$ and $Ge^{4+}$. Preferably, [M] comprises at least one metal or metalloid tetracation selected from $Sn^{4+}$, $Te^{4+}$, and $Ge^{4+}$. As discussed above, the hexahalometallate compound may be a mixed-metal or a single-metal hexahalometallate. Preferably, the hexahalometallate compound is a single-metal hexahalometallate compound. More preferably, [M] is a single metal or metalloid tetracation selected from $Sn^{4+}$, $Te^{4+}$, and $Ge^{4+}$. For instance, [M] may be a single metal or metalloid tetracation which is $Te^{4+}$. For instance, [M] may be a single metal or metalloid tetracation which is $Ge^{4+}$. Most preferably, [M] is a single metal or metalloid tetracation which is $Sn^{4+}$.

[X] may comprise at least one X anion which is a halide anion. [X] therefore comprises at least one halide anion selected from $F^-$, $Cl^-$, $Br^-$ and $I^-$. Typically, [X] comprises at least one halide anion selected from $Cl^-$, $Br^-$ and $I^-$. The hexahalometallate compound may be a mixed-halide hexahalometallate or a single-halide hexahalometallate. If the hexahalometallate is mixed, [X] comprises two, three or four halide anions selected from $F^-$, $Cl^-$, $Br^-$ and $I^-$. Typically, in a mixed-halide compound, [X] comprises two halide anions selected from $F^-$, $Cl^-$, $Br^-$ and $I^-$.

Typically, [A] is a single monocation and [M] is a single metal or metalloid tetracation. Thus, the crystalline material may, for instance, comprise a hexahalometallate compound of formula (IIIA)

$$A_2M[X]_6 \quad \text{(IIIA)}$$

wherein: A is a monocation; M is a metal or metalloid tetracation; and [X] is at least one halide anion. [X] may be one, two or three halide anions selected from $F^-$, $Cl^-$, $Br^-$ and $I^-$, and preferably selected from $Cl^-$, $Br^-$ and $I^-$. In formula (IIIA), [X] is preferably one or two halide anions selected from $Cl^-$, $Br^-$ and $I^-$.

The crystalline material may, for instance, comprise, or consist essentially of, a hexahalometallate compound of formula (IIIB)

$$A_2MX_{6-y}X'_y \quad \text{(IIIB)}$$

wherein: A is a monocation (i.e. the second cation); M is a metal or metalloid tetracation (i.e. the first cation); X and X' are each independently a (different) halide anion (i.e. two second anions); and y is from 0 to 6. When y is 0 or 6, the hexahalometallate compound is a single-halide compound. When y is from 0.01 to 5.99 the compound is a mixed-halide hexahalometallate compound. When the compound is a mixed-halide compound, y may be from 0.05 to 5.95. For instance, y may be from 1.00 to 5.00.

The hexahalometallate compound may, for instance, be $A_2SnF_{6-y}Cl_y$, $A_2SnF_{6-y}Br_y$, $A_2SnF_{6-y}I_y$, $A_2SnCl_{6-y}Br_y$, $A_2SnCl_{6-y}I_y$, $A_2SnBr_{6-y}I_y$, $A_2TeF_{6-y}Cl_y$, $A_2TeF_{6-y}Br_y$, $A_2TeF_{6-y}I_y$, $A_2TeCl_{6-y}Br_y$, $A_2TeCl_{6-y}I_y$, $A_2TeBr_{6-y}I_y$, $A_2GeF_{6-y}Cl_y$, $A_2GeF_{6-y}Br_y$, $A_2GeF_{6-y}I_y$, $A_2GeCl_{6-y}Br_y$, $A_2GeCl_{6-y}I_y$, $A_2GeBr_{6-y}I_y$, $A_2ReF_{6-y}Cl_y$, $A_2ReF_{6-y}Br_y$, $A_2ReF_{6-y}I_y$, $A_2ReCl_{6-y}Br_y$, $A_2ReCl_{6-y}I_y$ or $A_2ReBr_{6-y}I_y$, wherein: A is $K^+$, $Rb^+$, $Cs^+$, $(R^1NH_3)^+$, $(NR^2_4)^+$, or $(H_2N{-}C(R^1){=}NH_2)^+$, wherein $R^1$ is H, a substituted or unsubstituted $C_{1-20}$ alkyl group or a substituted or unsubstituted aryl group, and $R^2$ is a substituted or unsubstituted $C_{1-10}$ alkyl group; and y is from 0 to 6. Optionally, y is from 0.01 to 5.99. If the hexahalometallate compound is a mixed-halide compound, y is typically from 1.00 to 5.00. A may be as defined above. For instance, A may be $Cs^+$, $NH_4^+$, $(CH_3NH_3)^+$, $(CH_3CH_2NH_3)^+$, $(N(CH_3)_4)^+$, $(N(CH_2CH_3)_4)^+$, $(H_2N{-}C(H){=}NH_2)^+$ or $(H_2N{-}C(CH_3){=}NH_2)^+$, for instance $Cs^+$, $NH_4^+$, or $(CH_3NH_3)^+$.

The hexahalometallate compound may typically be $A_2SnF_{6-y}Cl_y$, $A_2SnF_{6-y}Br_y$, $A_2SnF_{6-y}I_y$, $A_2SnCl_{6-y}Br_y$, $A_2SnCl_{6-y}I_y$, or $A_2SnBr_{6-y}I_y$, wherein: A is $K^+$, $Rb^+$, $Cs^+$, $(R^1NH_3)^+$, $(NR^2_4)^+$, or $(H_2N{-}C(R^1){=}NH_2)^+$, or A is as defined herein, wherein $R^1$ is H, a substituted or unsubstituted $C_{1-20}$ alkyl group or a substituted or unsubstituted aryl group, or $R^2$ is a substituted or unsubstituted $C_{1-10}$ alkyl group; and y is from 0 to 6.

In another embodiment, the hexahalometallate compound is $A_2GeF_{6-y}Cl_y$, $A_2GeF_{6-y}Br_y$, $A_2GeF_{6-y}I_y$, $A_2GeCl_{6-y}Br_y$, $A_2GeCl_{6-y}I_y$, or $A_2GeBr_{6-y}I_y$, wherein: A is $K^+$, $Rb^+$, $Cs^+$, $(R^1NH_3)^+$, $(NR^2_4)^+$, or $(H_2N{-}C(R^1){=}NH_2)^+$, or A is as defined herein, wherein $R^1$ is H, a substituted or unsubstituted $C_{1-20}$ alkyl group or a substituted or unsubstituted aryl group, and $R^2$ is a substituted or unsubstituted $C_{1-10}$ alkyl group; and y is from 0 to 6.

The hexahalometallate compound may, for instance, be $A_2TeF_{6-y}Cl_y$, $A_2TeF_{6-y}Br_y$, $A_2TeF_{6-y}I_y$, $A_2TeCl_{6-y}Br_y$, $A_2TeCl_{6-y}I_y$, or $A_2TeBr_{6-y}I_y$, wherein: A is $K^+$, $Rb^+$, $Cs^+$, $(R^1NH_3)^+$, $(NR^2_4)^+$, or $(H_2N{-}C(R^1){=}NH_2)^+$, or A is as defined herein, wherein $R^1$ is H, a substituted or unsubstituted $C_{1-20}$ alkyl group or a substituted or unsubstituted aryl group, and $R^2$ is a substituted or unsubstituted $C_{1-10}$ alkyl group; and y is from 0 to 6 or y is as defined herein.

Often, y will be from 1.50 to 2.50. For instance, y may be from 1.80 to 2.20. This may occur if the compound is produced using two equivalents of AX' and one equivalent of $MX_4$, as discussed below.

In some embodiments, all of the ions are single anions. Thus, the crystalline material may comprise, or consist essentially of, a hexahalometallate compound of formula (IIIC)

$$A_2MX_6 \quad \text{(IIIC)}$$

wherein: A is a monocation; M is a metal or metalloid tetracation; and X is a halide anion. A, M and X may be as defined herein.

The hexahalometallate compound may be $A_2SnF_6$, $A_2SnCl_6$, $A_2SnBr_6$, $A_2SnI_6$, $A_2TeF_6$, $A_2TeCl_6$, $A_2TeBr_6$, $A_2TeI_6$, $A_2GeF_6$, $A_2GeCl_6$, $A_2GeBr_6$, $A_2GeI_6$, $A_2ReF_6$, $A_2ReCl_6$, $A_2ReBr_6$ or $A_2ReI_6$, wherein: A is $K^+$, $Rb^+$, $Cs^+$, $(R^1NH_3)^+$, $(NR^2_4)^+$, or $(H_2N{-}C(R^1){=}NH_2)^+$, wherein $R^1$ is H, a substituted or unsubstituted $C_{1-20}$ alkyl group or a substituted or unsubstituted aryl group, and $R^2$ is a substituted or unsubstituted $C_{1-10}$ alkyl group. A may be as defined herein. Preferably, the hexahalometallate compound is $Cs_2SnI_6$, $Cs_2SnBr_6$, $Cs_2SnBr_{6-y}Y_y$, $Cs_2SnCl_{6-y}I_y$, $Cs_2SnCl_{6-y}Br_y$, $(CH_3NH_3)_2SnI_6$, $(CH_3NH_3)_2SnBr_6$, $(CH_3NH_3)_2SnBr_{6-y}I_y$, $(CH_3NH_3)_2SnCl_{6-y}I_y$, $(CH_3NH_3)_2SnCl_{6-y}Br_y$, $(H_2N{-}C(H){=}NH_2)_2SnI_6$, $(H_2N{-}C(H){=}NH_2)_2SnBr_6$, $(H_2N{-}C(H){=}NH_2)_2SnBr_{6-y}I_y$, $(H_2N{-}C(H){=}NH_2)_2SnCl_{6-y}I_y$ or $(H_2N{-}C(H){=}NH_2)_2SnCl_{6-y}Br_y$ wherein y is from 0.01 to 5.99. For example, the hexahalometallate compound may be $(CH_3NH_3)_2SnI_6$, $(CH_3NH_3)_2SnBr_6$, $(CH_3NH_3)_2SnCl_6$, $(H_2N{-}C(H){=}NH_2)_2SnI_6$, $(H_2N{-}C(H){=}NH_2)_2SnBr_6$ or $(H_2N{-}C(H){=}NH_2)_2SnCl_6$. The hexahalometallate compound may be $Cs_2SnI_6$, $Cs_2SnBr_6$, $Cs_2SnCl_{6-y}Br_y$, $(CH_3NH_3)_2SnI_6$, $(CH_3NH_3)_2SnBr_6$, or $(H_2N{-}C(H){=}NH_2)_2SnI_6$.

The crystalline A/M/X material may comprise a bismuth or antimony halogenometallate. For instance, the crystalline A/M/X material may comprise a halogenometallate compound comprising: (i) one or more monocations ([A]) or one or more dications ([B]); (ii) one or more metal or metalloid trications ([M]); and (iii) one or more halide anions ([X]). The compound may be a compound of formula $BBiX_5$, $B_2BiX_7$ or $B_3BiX_9$ where B is $(H_3NCH_2NH_3)^{2+}$, $(H_3N(CH_2)_2NH_3)^{2+}$, $(H_3N(CH_2)_3NH_3)^{2+}$, $(H_3N(CH_2)_4NH_3)^{2+}$, $(H_3N(CH_2)_5NH_3)^{2+}$, $(H_3N(CH_2)_6NH_3)^{2+}$, $(H_3N(CH_2)_7NH_3)^{2+}$, $(H_3N(CH_2)_8NH_3)^{2+}$ or $(H_3N{-}C_6H_4{-}NH_3)^{2+}$ and X is $I^-$, $Br^-$ or $Cl^-$, preferably $I^-$.

In yet further embodiments, the stabilised crystalline A/M/X materials of the invention may be double perovskites. Such compounds are defined in WO 2017/037448, the entire contents of which is incorporated herein by reference. Typically, the compound is a double perovskite compound of formula (IV):

$$[A]_2[B^+][B^{3+}][X]_6 \quad (IV);$$

wherein: [A] comprises one or more A cations which are monocations, as defined herein; $[B^+]$ and $[B^{3+}]$ are equivalent to [M] where M comprises one or more M cations which are monocations and one or more M cations which are trications; and [X] comprises one or more X anions which are halide anions.

The one or more M cations which are monocations comprised in $[B^+]$ are typically selected from metal and metalloid monocations. Preferably, the one or more M cations which are monocations are selected from $Li^+$, $Na^+$, $K^+$, $Rb^+$, $Cs^+$, $Cu^+$, $Ag^+$, $Au^+$ and $Hg^+$. More preferably, the one or more M cations which are monocations are selected from $Cu^+$, $Ag^+$ and $Au^+$. Most preferably, the one or more M cations which are monocations are selected from $Ag^+$ and $Au^+$. For instance, $[B^+]$ may be one monocation which is $Ag^+$ or $[B^+]$ may be one monocation which is $Au^+$.

The one or more M cations which are trications comprised in $[B^{3+}]$ are typically selected from metal and metalloid trications. Preferably, the one or more M cations which are trications are selected from $Bi^{3+}$, $Sb^{3+}$, $Cr^{3+}$, $Fe^{3+}$, $Co^{3+}$, $Ga^{3+}$, $As^{3+}$, $Ru^{3+}$, $Rh^{3+}$, $In^{3+}$, $Ir^{3+}$ and $Au^{3+}$. More preferably, the one or more M cations which are trications are selected from $Bi^{3+}$ and $Sb^{3+}$. For instance, $[B^{3+}]$ may be one trication which is $Bi^{3+}$ or $[B^{3+}]$ may be one trication which is $Sb^{3+}$. Bismuth has relatively low toxicity compared with heavy metals such as lead.

In some embodiments, the one or more M cations which are monocations (in $[B^+]$) are selected from $Cu^+$, $Ag^+$ and $Au^+$ and the one or more M cations which are trications (in $[B^{3+}]$) are selected from $Bi^{3+}$ and $Sb^{3+}$.

Typically, where the compound is a double perovskite it is a compound of formula (IVa):

$$A_2B^+B^{3+}[X]_6 \quad (IVa);$$

wherein: the A cation is as defined herein; $B^+$ is an M cation which is a monocation as defined herein; $B^{3+}$ is an M cation which is a trication as defined herein; and [X] comprises one or more X anions which are halide anions, for instance two or more halide anions, preferably a single halide anion.

In yet another embodiment, the compound may be a layered double perovskite compound of formula (V):

$$[A]_4[B^+][B^{3+}][X]_8 \quad (V);$$

wherein: [A], $[B^+]$, $[B^{3+}]$ and [X] are as defined above. In this embodiment, typically the layered double perovskite compound is a double perovskite compound of formula (Va):

$$A_4B^+B^{3+}[X]_8 \quad (Va);$$

wherein: the A cation is as defined herein; $B^+$ is an M cation which is a monocation as defined herein; $B^{3+}$ is an M cation which is a trication as defined herein; and [X] comprises one or more X anions which are halide anions, for instance two or more halide anions, preferably a single halide anion.

In general, therefore, in the compound of formula $[A]_a[M]_b[X]_c$, [A] comprises one or more A cations; [M] comprises one or more M cations and [X] comprises one or more anions.

Typically, each A cation is selected from an alkali metal cation, $C_{1-10}$ alkylammonium, $C_{2-10}$ alkenylammonium, $C_{1-10}$ alkyliminium, $C_{3-10}$ cycloalkylammonium and $C_{3-10}$ cycloalkyliminium optionally substituted with one or more substituents selected from amine, $C_{1-6}$ alkylamine, imine, $C_{1-6}$ alkylamine, $C_{1-6}$ alkyl, $C_{2-6}$ alkenyl $C_{3-6}$ cycloalkyl and $C_{6-12}$ aryl. Preferably each A cation is selected from $Cs^+$, $Rb^+$, methylammonium, ethylammonium, propylammonium. butylammonium, pentylammonium, hexylammonium, heptylammonium, octylammonium, formamidinium, benzyl ammonium, phenyl ethyl ammonium, benzylammonium, naphtylmethyl ammonium and guanidinium. Typically, [A] comprises one, two or three A cations; preferably [A] is one A cation. Preferably, each A cation is a monocation.

Generally each M cation is selected from a metal or metalloid cation; preferably from one or more of $Li^+$, $Na^+$, $K^+$, $Rb^+$, $Cs^+$, $Cu^+$, $Ag^+$, $Au^+$, $Hg^+$, $Ca^{2+}$, $Sr^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, $Eu^{2+}$, $Bi^{3+}$, $Sb^{3+}$, $Cr^{3+}$, $Fe^{3+}$, $Co^{3+}$, $Ga^{3+}$, $As^{3+}$, $Ru^{3+}$, $Rh^{3+}$, $In^{3+}$, $Ir^{3+}$ and $Au^{3+}$, preferably $Cu^+$, $Ag^+$, $Au^+$, $Sn^{2+}$, $Pb^{2+}$, $Cu^{2+}$, $Ge^{2+}$, $Ni^{2+}$, $Bi^{3+}$ and $Sb^{3+}$; particularly preferably $Pb^{2+}$. For example, preferably each M cation is a metal or metalloid dication.

Usually each X anion is selected from $F^-$, $Cl^-$, $Br^-$ or $I^-$, preferably $Cl^-$ or $Br^-$.

It is usually preferred that the one or more A cations are monocations and that the one or more M cations are dications. It is particularly preferred that, the compound of formula $[A]_a[M]_b[X]_c$ is a compound of formula $[A][M][X]_3$, wherein each A cation is a monocation and each M cation is a metal or metalloid dication.

In a preferred embodiment, [A] comprises two or more different A cations. In a particularly preferred aspect of this embodiment, the compound of formula $[A]_a[M]_b[X]_c$ is a perovskite of formula [A][M][X]3. These "mixed cation perovskites" are shown in the Examples section to have unexpectedly good photoluminescence properties, particularly in the blue region of the spectrum.

In another preferred embodiment, [X] comprises two or more different X anions. In a particularly preferred aspect of these embodiments, the compound of formula $[A]_a[M]_b[X]_c$ is a perovskite of formula $[A][M][X]_3$. These "mixed halide perovskites" have been shown to suffer from degradation, often by halide segregation, when stabilised using previous stabilising techniques. The stabilised crystalline A/M/X material of the present invention comprising an oxide appears not to suffer from these difficulties.

In a preferred embodiment, the material is a "blue emitter". By this is meant that the compound of formula $[A]_a[M]_b[X]_c$ may be capable of emitting blue light after stimulation by electrical energy or irradiation with blue, violet or ultraviolet light (e.g. light having a wavelength of 500 nm or less). In this embodiment, the compound of formula $[A]_a[M]_b[X]_c$ is capable of emitting light having a wavelength of from 450 to 500 nm, e.g. from 455 to 495 nm, preferably from 460 to 490 nm.

A and M Precursors

The A precursor is a species capable of reacting with the M precursor and the oxide precursor to produce a stabilised crystalline A/M/X material as defined herein. Accordingly, where the compound of formula $[A]_a[M]_b[X]_c$ comprises two or more A cations, the A precursor also comprises said two or more A cations. The A precursor comprises all cations A present in the compound of formula $[A]_a[M]_b[X]_c$. Herein, therefore, the term "A precursor" may indicate a single compound comprising a single A cation; a single compound comprising a plurality of A cations; or a plurality of compounds each comprising one or more A cations. Reference herein to the "A precursor" should therefore be understood to be referring both to a single species and to a plurality of component species. It is preferred for the purpose of minimising complexity that the A precursor comprises a single compound containing all the A cations present in [A].

The M precursor is a species capable of reacting with the A precursor and the oxide precursor to produce a stabilised crystalline A/M/X material as defined herein. Accordingly, where the compound of formula $[A]_a[M]_b[X]_c$ comprises two or more M cations, the M precursor also comprises said two or more M cations. The M precursor comprises all cations M present in the compound of formula $[A]_a[M]_b[X]_c$. Herein, therefore, the term "M precursor" may indicate a single compound comprising a single M cation; a single compound comprising a plurality of M cations; or a plurality of compounds each comprising one or more M cations. Reference herein to the "M precursor" should therefore be understood to be referring both to a single species and to a plurality of component species. It is preferred for the purpose of minimising complexity that the M precursor comprises a single compound containing all the M cations present in [M].

The stabilised crystalline A/M/X material of the invention comprises component [X], which comprises one or more anions X. Accordingly, the process requires a source of these anions. In some embodiments, the process involves an X precursor. The X precursor is a species capable of reacting with the A precursor, the M precursor and the oxide precursor to produce a stabilised crystalline A/M/X material as defined herein. The X precursor may comprise some or all of the X anions present in the compound of formula $[A]_a[M]_b[X]_c$.

In such embodiments, the process of the invention comprises treating an A precursor, an M precursor and an X precursor with an oxide precursor.

More usually, however, the source of the X anions in the process of the invention is one or more of the A precursor, the M precursor and the oxide precursor. That is, typically one or more of the A precursor, the M precursor and the oxide precursor comprises one or more of the X anions required to form the stabilised crystalline A/M/X material. Of course, an additional X precursor may additionally be involved in the process of the invention.

In a preferred aspect of this embodiment of the invention, either the A precursor or the M precursor, or both the A precursor and the M precursor, comprise one or more X anions. In this embodiment, the process of the invention comprises treating:

(a) an A precursor comprising an A cation and optionally an X anion; and (b) an M precursor comprising an M cation and optionally an X anion;

with an oxide precursor comprising an element Z. In a preferred aspect of this embodiment, the A precursor and the M precursor together comprise all of the X anions required to provide the stabilised crystalline A/M/X product.

Preferably, therefore, the A precursor comprises a salt or salts of each A cation present in [A], wherein the salts comprise one or more of the X anions present in [X]. Similarly it is preferred that the M precursor comprises a salt or salts of each M cation present in [M], wherein the salts comprise one or more of the X anions present in [X]. It is particularly preferred that the A precursor and the M precursor together comprise all of the X anions present in [X].

Typically, [X] comprises one or more X anions which are halide anions. Preferably, [X] comprises one or more X anions, all of which are halide anions. Accordingly, it is preferred that the A precursor comprises a halide salt of one or more of the A cations comprised in the stabilised crystalline A/M/X material. For instance, it is preferred that the A precursor is a halide salt of the A cation or each of the A cations. Similarly, it is preferred that the M precursor comprises a halide salt of one or more of the M cations comprised in the stabilised crystalline A/M/X material. For instance, the M precursor may be a halide salt of the M cation or each of the M cations.

In a particularly preferred embodiment, the A precursor consists of a halide salt or halide salts of the or each A cation in [A], and the M precursor consists of a halide salt or halide salts of the or each M cation in [M].

Stabilised Crystalline A/M/X Material

The stabilised crystalline A/M/X material of the invention, also referred to as the "product" of the invention, is as defined herein. The stabilised crystalline A/M/X material is obtainable by the process of the invention. Accordingly, the following definition of the stabilised crystalline A/M/X material of the invention applies equally to the product of the process of the invention as described herein. Similarly, all aspects of the above description of the process of the invention apply equally to the product of the invention.

Accordingly, in some embodiments, the invention provides the product obtained or obtainable by the process of the invention as defined herein.

The product of the invention is advantageous as the oxide stabilises the crystalline A/M/X material. The advantages of the product of the invention are illustrated in the data provided herewith.

Figure 2:
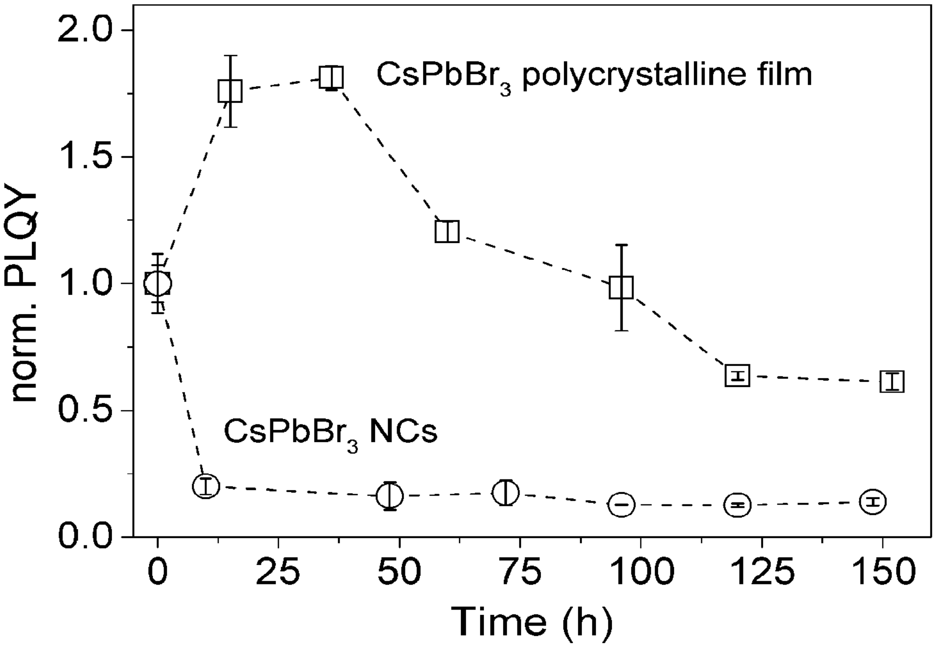
FIG. 2 indicates the stability of thin films of $CsPbBr_3$ deposited from nanocrystals (NCs) colloidal solution and from perovskite precursors (thin film) exposed to simulated sunlight, by showing PLQY over a period of 150 hours.

Firstly, for comparison, FIGS. 1 and 2 exemplify common stability difficulties of A/M/X materials obtainable by conventional methods. FIG. 1 shows the normalised photoluminescence intensity upon formation and after 12 hours of perovskite ($CsPbBr_3$) nanocrystals. The $CsPbBr_3$ nanocrystals coated with a stabilising coating of various polymers. FIG. 1(*a*) shows the photoluminescence of nanocrystals coated in polymers polyvinyl butyral (PVB, squares) and ethylene vinyl acetate (EVA, circles). FIG. 1(*b*) shows the photoluminescence properties of nanocrystals dispersed in polymethyl methacrylate (squares) and polystyrene (circles). In all cases, despite the protective plastic layer, after only 12 hours the photoluminescence intensity of the perovskite falls to a fraction of its original intensity. In FIG. 1(*a*), after 12 hours no visible photoluminescence remains at all.

FIG. 2 shows that the poor stability of nanocrystals illustrated in FIG. 1 is also observed in thin films. A thin film of the perovskite $CsPbBr_3$ initially shows a small increase in photoluminescence, but after approximately 150 hours its photoluminescence quantum yield (PLQY) drops to approximately half of its initial value, and much less than half of its maximum value. Although this is a considerably longer lifetime than is observed for nanocrystals in FIG. 1, it is still insufficient for use in an optoelectronic device which is usually expected to last months or years.

Figure 3:
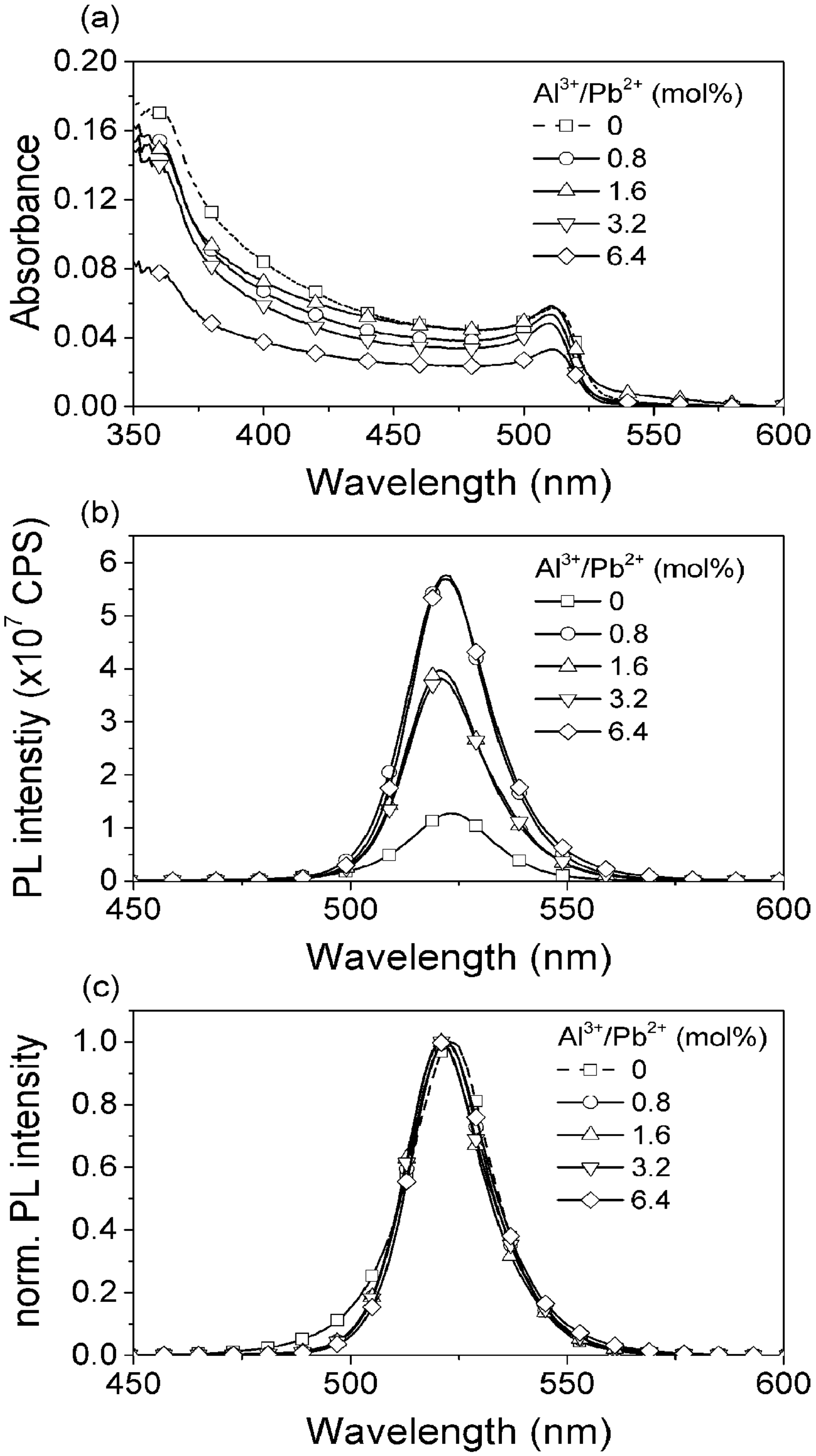
FIG. 3 shows the absorption spectra (FIG. 3*a*), steady-state photoluminescence spectra (FIG. 3*b*) and the normalised steady-state fluorescence spectrum (FIG. 3*c*) of $CsPbBr_3$ thin films created from precursors having different $Al^{3+}/Pb^{2+}$ ratios.
Figure 4:
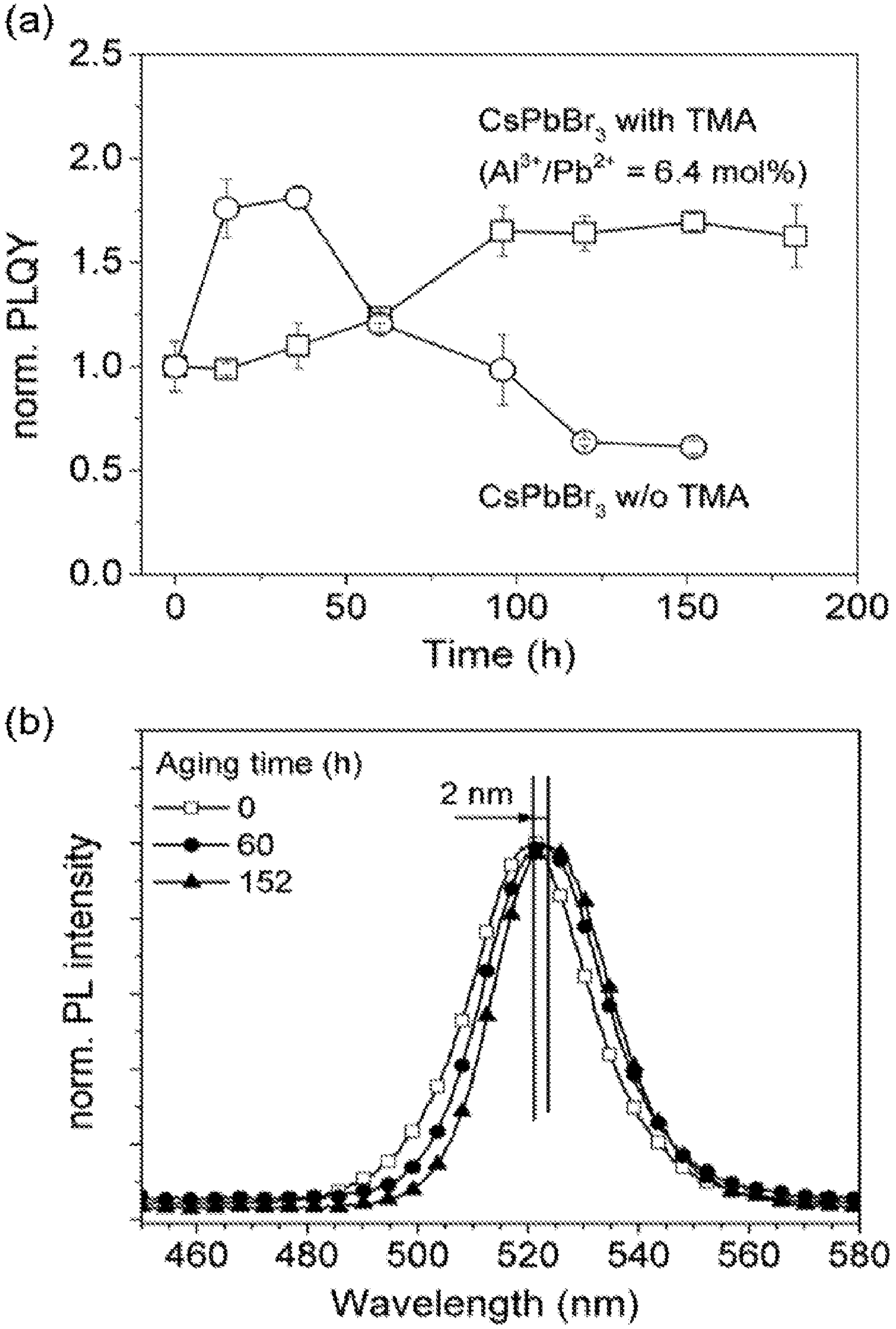
FIG. 4 shows, in 4(*a*), the normalised PLQY of $CsPbBr_3$ thin films as function of exposure time under simulated sunlight (76 $mW \cdot cm^{-2}$ at 70° C.).
Figure 5:
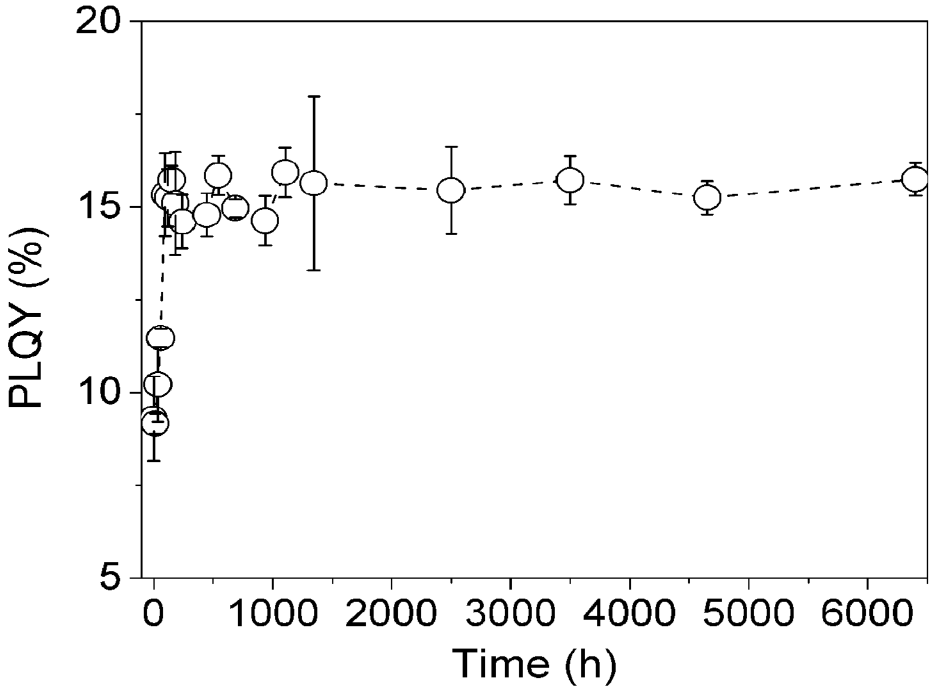
FIG. 5 shows the PLQY of $CsPbBr_3$ thin films, which includes one treated with TMA, as function of exposure time under simulated sun light (76 $mW \cdot cm^{-2}$ at 70° C.) for exposures of up to 6000 hours.

By contrast, the exceptional photoluminescence properties of the products of the invention are illustrated in FIGS. 3, 4 and 5.

FIG. 3 shows that the presence of a stabilising oxide in the stabilised crystalline A/M/X materials of the present invention does not significantly shift the photoluminescence spectrum of the underlying A/M/X material. The stabilised A/M/X materials of FIG. 3 are prepared by a process described in the Examples section below wherein the process comprises treating a first solution with a second solution, wherein the first solution comprises the A precursor (a Cs halide), the M precursor (a Pb halide) and a first solvent; and the second solution comprises the oxide precursor (trimethylaluminium, "TMA") and a second solvent. The ratio of $Al^{3+}$ precursor to $Pb^{2+}$ precursor (in mole percent, mol %) varies from 0 (no TMA present) to 6.4 (the precursor solutions contain 6.4 moles of $Al^{3+}$ for each 100 moles of $Pb^{2+}$). As can be seen from FIG. 3, the presence of TMA, which provides a stabilised aluminium oxide in the product, does not significantly move the absorbance peak (see FIG. 3(*a*)) or the emission peak (see FIG. 3(*b*)). The similarity of the absorbance peak positions is most clearly seen in FIG. 3(*c*), wherein the normalised photoluminescence spectra are overlaid. Therefore, typically the presence of a stabilising oxide preserves the peak positions in the photoluminescence and absorption spectra (by "peak positions" means the wavelengths of maximum photoluminescence/maximum absorption respectively). These peak positions, and PLQY, are summarised in Table 1 below.

TABLE 1

| Mol % ($Al^{3+}/Pb^{2+}$) | PL peak position (nm) | FWHM (nm) | PLQY (%) |
|---|---|---|---|
| 0 | 523 | 22.4 | 1.44 ± 0.42 |
| 0.8 | 522 | 21.8 | 5.53 ± 1.45 |
| 1.6 | 521 | 21.1 | 5.51 ± 0.89 |
| 3.2 | 521 | 21.8 | 4.26 ± 0.85 |
| 6.4 | 522 | 21.7 | 4.71 ± 1.47 |

The peak position moves by only 2 nm at most.

Moreover, the stabilising oxide has a further advantageous effect: it can increase photoluminescence intensity. For instance, comparing the spectrum of $CsPbBr_3$ in FIG. 3(*b*) in the absence of oxide (squares) with the spectrum of the stabilised $CsPbBr_3$ containing the largest quantity of oxide (rhombi) it is clear that the maximum photoluminescence intensity of the latter is approximately six times greater than the photoluminescence intensity of the non-stabilised $CsPbBr_3$ at the corresponding wavelength. Moreover, Table 1 shows that the PLQY (photoluminescence quantum yield) in all cases is at least three times greater than the PLQY of the non-stabilised perovskite.

Thus, in a preferred embodiment of the invention, the stabilised crystalline A/M/X material has a photoluminescence intensity greater than or equal to the photoluminescence intensity of the corresponding crystalline compound of formula $[A]_a[M]_b[X]_c$. For instance, the stabilised crystalline A/M/X material has a PLQY greater than or equal to the PLQY of the corresponding crystalline compound of formula $[A]_a[M]_b[X]_c$. In particular, the stabilised crystalline A/M/X material may have a PLQE greater than or equal to the PLQE of the corresponding crystalline compound of formula $[A]_a[M]_b[X]_c$. Photoluminescence intensity, PLQE and PLQY can be measured using standard techniques. PLQY indicates photoluminescence quantum yield, which may also be referred to as PLQE (photoluminescence quantum efficiency).

Not only does the stabilising oxide have an advantageous effect on photoluminescence intensity, it also greatly increases the length of time for which for which that high PLQY is observed. As shown above in FIGS. 1 and 2, the PLQY of non-stabilised $CsPbBr_3$ perovskites falls far below its initial value within 12 hours for nanocrystals and within 125 hours for thin films. By contrast, it can be seen from FIG. 4 that the stabilised A/M/X materials of the invention (exemplified by stabilised $CsPbBr_3$) have much longer lifetimes before they decay in this way. FIG. 4(*a*) illustrates that a $CsPbBr_3$ thin film, prepared as discussed in relation to FIG. 3, maintains a PLQY greater or equal to its initial value for at least 200 hours. FIG. 5 confirms that this thin film in fact can maintain a PLQY greater than its initial value for much longer than 200 hours: the film was tested for up to 6000 hours and showed no indication of falling back to or below its initial value. By contrast, a corresponding thin film without a stabilising oxide falls below its initial value within 125 hours. This long lifetime is indicative of the extraordinary stability of the film.

FIG. 4(*b*) confirms that the photoluminescence spectrum of the stabilised A/M/X material of the invention shifts very little in this time; only 2 nm or so after 152 hours.

Accordingly, in a particularly preferred embodiment of the invention, the photoluminescence intensity of the stabilised A/M/X material of the invention is approximately equal to or greater than its initial value for at least 100 hours, e.g. for at least 150 hours or at least 500 hours; preferably for at least 1000 hours. In an aspect of this embodiment, the PLQY of the stabilised A/M/X material of the invention is equal to or greater than its initial value for at least 100 hours, e.g. for at least 150 hours or at least 500 hours; preferably for at least 1000 hours. In a further aspect of this embodiment, the PLQE of the stabilised A/M/X material of the invention is equal to or greater than its initial value for at least 100 hours, e.g. for at least 150 hours or at least 500 hours; preferably for at least 1000 hours.

In another preferred embodiment of the invention, the peak wavelength of the photoluminescence spectrum of the stabilised A/M/X material of the invention differs from its initial value by no more than 5 nm, preferably no more than 3 nm, more preferably no more than 1 nm after 100 hours; e.g. after 150 or 500 hours, preferably after 1000 hours.

By "initial value" is meant the value of that parameter measured on its formation, for instance within 1 hour or within 30 minutes of preparation of the material.

The advantages of the invention are also evident where the stabilised A/M/X material of the invention is prepared using an anti-solvent as discussed herein. In this embodiment, the stabilised A/M/X materials are prepared by a "quenching" process described in the Examples section below wherein the process comprises treating a first solution with a second solution, wherein the first solution comprises the A precursor (a Cs halide), the M precursor (a Pb halide) and a first solvent; and the second solution comprises the oxide precursor (trimethylaluminium, "TMA") and an anti-solvent. The concentration of TMA present in the anti-solvent was varied from 0 to 100 mM.

Figure 6:
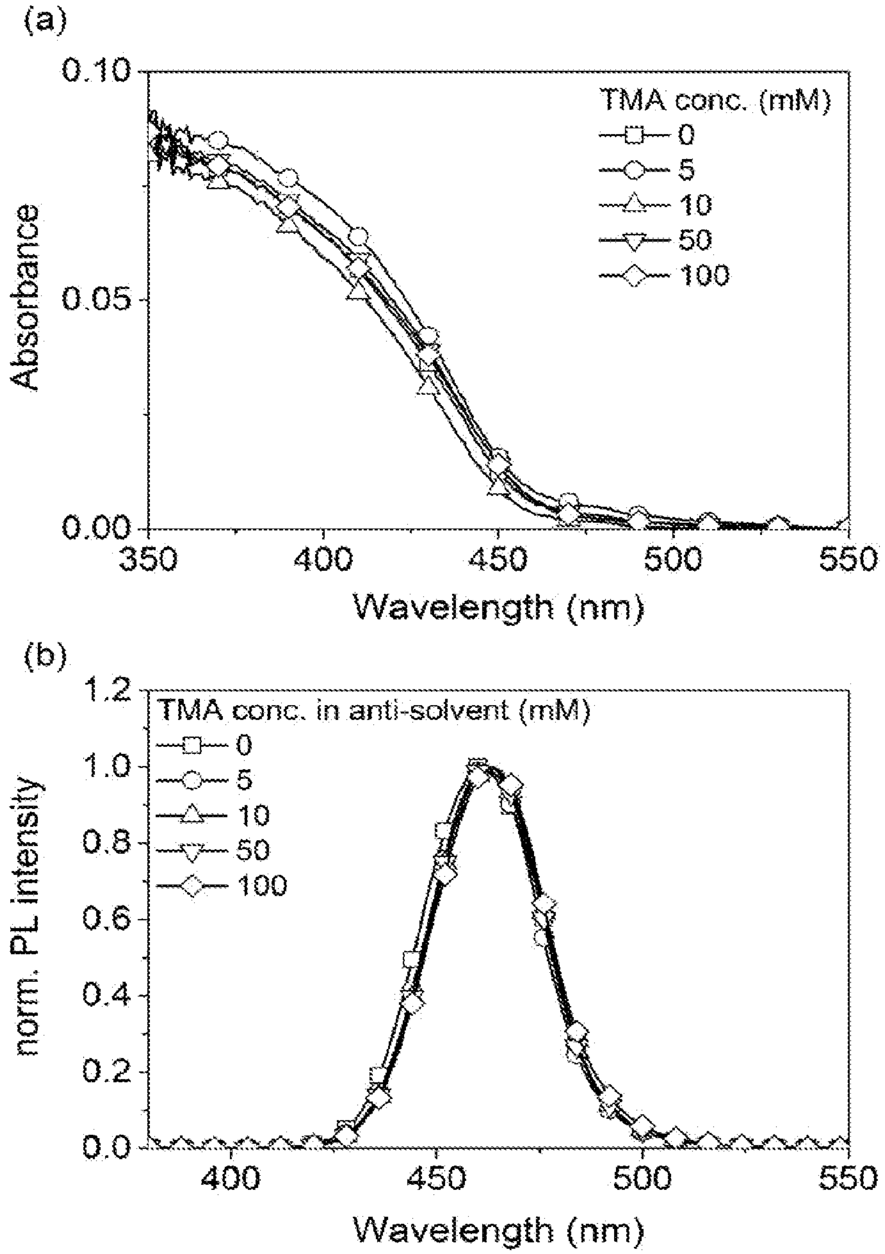
FIG. 6 shows the absorption spectra (FIG. 6*a*), and normalised steady-state photoluminescence spectra (FIG. 6*b*) of stabilised crystalline A/M/X materials prepared in the presence of a TMA precursor using the TMA in an anti-solvent (referred to as the TMA quenching method). The compound of formula $[A]_a[M]_b[X]_c$ is $CsPb(Br_{0.7}Cl_{0.3})_3$. The materials are in thin film form, and were prepared with differing TMA concentrations in the anti-solvent.
Figure 7:
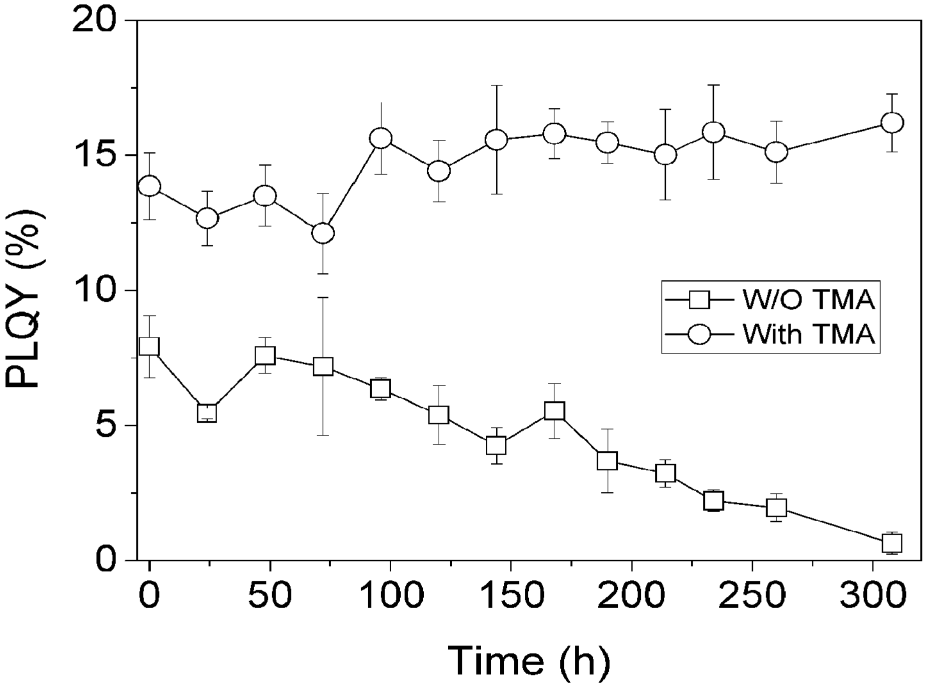
FIG. 7 shows the PLQY of $CsPb(Br_{0.7}Cl_{0.3})_3$ thin films prepared as described in relation to 6 (circles) and in the absence of TMA (squares) as function of exposure time under simulated sun light (76 $mW \cdot cm^{-2}$ at 70° C.). The exposure time extends up to 300 hours.
Figure 8:
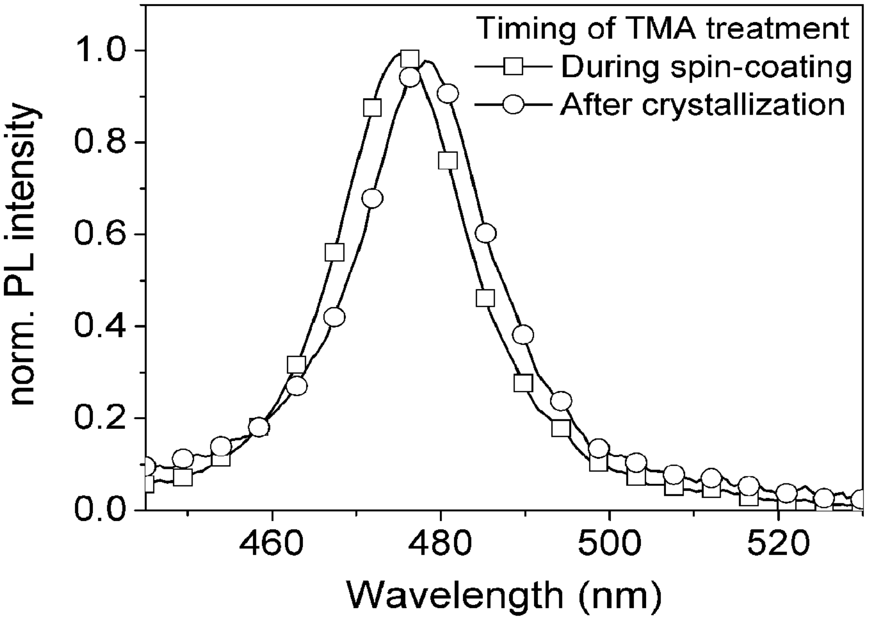
FIG. 8 shows the normalised steady-state photoluminescence spectra of TMA-quenched $CsPb(Br_{0.7}Cl_{0.3})_3$ thin films with different TMA quenching timing. The thin film indicated by squares ("during spin coating") was prepared as discussed in relation to FIG. 6; the thin film indicated by circles ("after crystallisation") involved the addition of TMA after crystallisation of $CsPb(Br_{0.7}Cl_{0.3})_3$ had occurred.

FIGS. 7 and 8 show the characteristics of a thin film of a stabilised A/M/X material of the invention produced with an anti-solvent as described in the previous paragraph. The oxide in this instance is $Al_2O_3$ and the compound of formula $[A]_a[M]_b[X]_c$ is a mixed halide perovskite: $CsPb(Br_{0.7}Cl_{0.3})_3$. FIG. 6(*a*) shows the absorbance spectra and FIG. 6(*b*) shows the normalised photoluminescence intensity of this material according to the invention. As with the $CsPbBr_3$ materials of FIGS. 3-5, it can be seen that the photoluminescence spectrum is not shifted by the presence of the stabilising oxide. The peak in the absorbance spectrum produced in the absence of oxide precursor (where the concentration of TMA is zero) is in almost exactly the same place as that produced with a TMA concentration of 100 mM in the anti-solvent. Thus, again, the presence of the oxide does not shift the photoluminescence spectrum or the absorbance spectrum.

The PLQY, PL peak position (that is, the peak of the photoluminescence spectrum) and the FWHM for the absorbance in each of the thin films illustrated in FIG. 7 are shown in Table 2 below.

TABLE 2

| TMA concentration (mM) | PL peak position (nm) | FWHM (nm) | PLQY (%) |
|---|---|---|---|
| 0 | 460 | 34.4 | 7.92 ± 1.16 |
| 5 | 462 | 31.1 | 11.2 ± 1.21 |
| 10 | 463 | 32.5 | 13.9 ± 1.25 |
| 50 | 463 | 31.8 | 12.6 ± 1.39 |
| 100 | 464 | 32.0 | 12.5 ± 1.36 |

Table 2 shows that the peak position moves by up to only 4 nm away from its position in the absence of oxide. Table 2 also shows that the same advantages of increased of photoluminescence, i.e. increased PLQY, are apparent in methods using the anti-solvent technique also.

FIG. 7 illustrates the advantageously extended lifetime of a stabilised crystalline A/M/X material according to the invention. In the absence of a stabilising oxide, the PLQY of a thin film of $CsPb(Br_{0.7}Cl_{0.3})_3$ decreases noticeably within 150 hours. By contrast, the PLQY of a stabilised crystalline A/M/X material according to the invention comprising $CsPb(Br_{0.7}Cl_{0.3})_3$ and alumina has a very similar value after 150 hours to its initial value. No considerable loss of PLQY is observed for the thin film of the invention over the whole 300 hour experimental period. By contrast, after 300 hours the non-stabilised $CsPb(Br_{0.7}Cl_{0.3})_3$ shows a decrease to almost 0 in PLQY.

Thus, in a preferred embodiment of the invention, the photoluminescence intensity of the stabilised A/M/X material of the invention measured approximately 100 hours after its formation, e.g. least 150 hours or at least 500 hours after its formation; preferably at least 1000 hours after its formation is approximately equal to or greater than its initial value. In an aspect of this embodiment, the PLQY of the stabilised A/M/X material measured approximately 100 hours after its formation, e.g. least 150 hours or at least 500 hours after its formation; preferably at least 1000 hours after its formation is approximately equal to or greater than its initial value. In a further aspect of this embodiment, the PLQE of the stabilised A/M/X material of the invention measured approximately 100 hours after its formation, e.g. least 150 hours or at least 500 hours after its formation; preferably at least 1000 hours after its formation is approximately equal to or greater than its initial value.

Without wishing to be bound by theory, it is speculated that the above advantages of the invention may arise at least in part because the oxide precursor contacts the precursors of the A/M/X material and so the oxide forms together with the crystalline compound of formula $[A]_a[M]_b[X]_c$. An experiment was formed wherein a thin film of stabilised $CsPb(Br_{0.7}Cl_{0.3})_3$ was formed using an anti-solvent containing TMA as described above. In one experiment, the anti-solvent containing TMA was added to the Cs and Pb precursors according to the invention. In another experiment, the anti-solvent containing TMA was added after $CsPb(Br_{0.7}Cl_{0.3})_3$ had crystallised. The normalised spectra of the resultant films are shown in FIG. 8, where it can be seen that the photoluminescence peaks are rather similar. However, when the photoluminescence intensity was measured, it could be seen that the method of the invention yields a product with considerably greater photoluminescence intensity. These results are shown in Table 3 below. Where the oxide precursor TMA is added during formation of the stabilised crystalline A/M/X material of the invention, denoted "during" in the Table, a PLQY of 9.52 is observed. By contrast, where the TMA and anti-solvent are added after crystallisation of $CsPb(Br_{0.7}Cl_{0.3})_3$, a PLQY of only 5.11 is observed.

TABLE 3

| Quenching timing | PL peak position (nm) | FWHM (nm) | PLQY (%) |
|---|---|---|---|
| During | 475 | 18.2 | 9.52 ± 1.36 |
| After | 478 | 18.7 | 5.11 ± 1.28 |

The stabilised crystalline A/M/X material of the invention comprises a crystal of a compound of formula $[A]_a[M]_b[X]_c$, the crystal having an oxide coating of formula $[Z]_pO_q$ on its entire surface, wherein:

[Z] comprises at least one element Z capable of forming an oxide with a band gap of at least 3 eV;

p and q are positive numbers;

[A] comprises one or more A cations;

[M] comprises one or more M cations;

[X] comprises one or more X anions;

a is an integer from 1 to 6;

b is an integer from 1 to 6; and c is an integer from 1 to 18.

$[A]_a[M]_b[X]_c$, $[Z]_pO_q$, [A], A, [M], M, [X], X, [Z], Z, a, b, c, p and q are as defined herein.

In the stabilised crystalline A/M/X material of the invention, it is convenient to define the amount of oxide present by the molar ratio of [Z] to [M]. The molar ratio of [Z]:[M] is typically from 1:1 to 1:10000. Preferably, the molar ratio of [Z]:[M] is from 1:2 to 1:1000, for instance, from 1:5 to 1:500; particularly preferably from 1:5 to 1:100.

The stabilised crystalline A/M/X material of the invention is crystalline. The term "crystalline" as used herein encompasses in meaning individual crystals and polycrystalline materials. A crystalline compound is a compound having an extended three-dimensional crystal structure. A crystalline compound is typically in the form of crystals or, in the case of a polycrystalline compound, crystallites (i.e. a plurality of crystals having particle sizes of less than or equal to 1 μm). The crystals together often form a layer. The crystals of a crystalline material may be of any size. The crystals of the compound(s) of the invention when in crystalline form (not polycrystalline form) typically have a smallest dimensions of no less than 1 nm and a largest dimension of no more than 100 micrometres (μm). Where the crystals have one or more dimensions in the range of from 1 nm up to 1000 nm, they may be described as nanocrystals.

The stabilised crystalline A/M/X material of the invention comprises a crystal of a compound of formula $[A]_a[M]_b[X]_c$, which is formed with an oxide coating of formula $[Z]_pO_q$. Thus, unlike a process where a crystalline $[A]_a[M]_b[X]_c$ material is formed and an oxide of formula $[Z]_pO_q$ is subsequently deposited on its exposed faces, the compound of the invention comprises a crystal where an oxide coating is present on the entire surface of the crystal. By "on the entire surface" is meant that the whole surface of the crystal is coated with a layer of oxide of formula $[Z]_pO_q$ which is at least one atom thick.

Of course, the stabilised crystalline A/M/X material of the invention is not entirely uniform. In the bulk of the said material, there may be some crystals which do not have an oxide coating on the entire surface. However, typically the stabilised crystalline A/M/X material of the invention comprises a plurality of crystals of a compound of formula $[A]_a[M]_b[X]_c$, wherein each of the crystals has an oxide coating of formula $[Z]_pO_q$ on its entire surface. In a preferred embodiment, at least half of the crystals of a compound of formula $[A]_a[M]_b[X]_c$ in the stabilised crystalline A/M/X material of the invention have an oxide coating of formula $[Z]_pO_q$ on their entire surface. Preferably at least three quarters, more preferably at least 90% of the crystals of a compound of formula $[A]_a[M]_b[X]_c$ in the stabilised crystalline A/M/X material of the invention have an oxide coating of formula $[Z]_pO_q$ on their entire surface.

In a preferred embodiment, the stabilised crystalline A/M/X material of the invention is a polycrystalline material. By "polycrystalline material" herein is meant a crystalline material comprising grain boundaries between crystallites. A crystalline material which is not a polycrystalline material is a material comprising one or more crystals without grain boundaries. A grain boundary is a planar defect that separates regions of different crystalline orientation (i.e. grains) within a crystalline solid. A grain boundary is therefore the interface between two adjacent grains, or crystallites, in a crystalline material. Such polycrystalline materials can have particularly advantageous optical properties and improved stability. In the case of a polycrystalline material, reference to a crystal, e.g. a "crystal having a coating" should be understood to mean reference to a crystallite, e.g. to a "crystallite having a coating".

Where the product comprises a polycrystalline material comprising crystallites, the crystallites comprise the A/M/X material. The crystallites (excluding the oxide coating) are typically substantially free of oxide. For instance, the crystallites typically comprise 20% or less oxygen by weight, preferably 10% or less oxygen by weight; e.g. 5% or less oxygen by weight or 1% or less oxygen by weight. The crystallites may comprise 0.1% or less oxygen by weight. Further, the crystallites typically comprise 20% or less of [Z] by weight, preferably 10% or less of [Z] by weight; e.g. 5% or less [Z] by weight or 1% or less [Z] by weight. The crystallites may comprise 0.1% or less [Z] by weight.

In a preferred embodiment, therefore the stabilised crystalline A/M/X material of the invention is a polycrystalline material comprising the said crystal (having an oxide coating of formula $[Z]_pO_q$ on its entire surface), wherein at least a part of the said oxide coating is located at a crystal grain boundary. The location of an oxide coating at a crystal grain boundary can arise because the oxide precursor is present during the formation of the polycrystalline material. Where the crystal is surrounded on all sides by grain boundaries, the entirety of the oxide coating of formula $[Z]_pO_q$ will lie at those grain boundaries.

The product may therefore comprise a polycrystalline material comprising a crystal having an oxide coating of formula $[Z]_pO_q$ on its entire surface, wherein the crystal is substantially free of oxide and at least a part of the said oxide coating is located at a crystal grain boundary.

The product may comprise a polycrystalline material comprising a plurality of crystals having an oxide coating of formula $[Z]_pO_q$ on the entire surface of each crystal, wherein the crystal is substantially free of oxide and at least a part of the said oxide coating is located at a crystal grain boundary.

The stabilised A/M/X material may be a polycrystalline material comprising a plurality of crystallites comprising a compound of formula $[A]_a[M]_b[X]_c$, and a plurality of grain boundaries between the said crystallites, wherein an oxide of formula $[Z]_pO_q$ is distributed along the grain boundaries, wherein

- [Z] comprises at least one element Z capable of forming an oxide with a band gap of at least 3 eV;
- p and q are positive numbers;
- [A] comprises one or more A cations;
- [M] comprises one or more M cations;
- [X] comprises one or more X anions;
- a is an integer from 1 to 6;
- b is an integer from 1 to 6; and
- c is an integer from 1 to 18.

Typically, the crystallites are substantially free of oxide. For instance, the crystallites may comprise less than 20% oxygen by weight, preferably less than 10% oxygen by weight or less than 5% oxygen by weight. Further, the crystallites typically comprise 20% or less of [Z] by weight, preferably 10% or less of [Z] by weight; e.g. 5% or less [Z] by weight or 1% or less [Z] by weight. The crystallites may comprise 0.1% or less [Z] by weight.

Preferably, the stabilised A/M/X material which is a polycrystalline material comprises a crystal of the compound of formula $[A]_a[M]_b[X]_c$, the crystal having an oxide coating of formula $[Z]_pO_q$ on its entire surface, as described herein.

As is the case with the crystals of a non-polycrystalline material, the distribution of the oxide coating will vary throughout the bulk of the stabilised polycrystalline A/M/X material. Typically, where the stabilised crystalline A/M/X material is a polycrystalline material, the said material will comprise a plurality of crystallites of a compound of formula $[A]_a[M]_b[X]_c$, each of the crystallites having an oxide coating of formula $[Z]_pO_q$ on its entire surface. In a preferred embodiment, at least half of the crystallites of a compound of formula $[A]_a[M]_b[X]c$ in the stabilised polycrystalline A/M/X material of the invention have an oxide coating of formula $[Z]_pO_q$ on their entire surface. Preferably at least three quarters, more preferably at least 90% of the crystallites of a compound of formula $[A]_a[M]_b[X]_c$ in the stabilised polycrystalline A/M/X material of the invention have an oxide coating of formula $[Z]_pO_q$ on their entire surface. In one particular embodiment, the invention provides a stabilised crystalline A/M/X material which is a polycrystalline material wherein each crystal (i.e. each crystallite) in the polycrystalline material has said coating on its entire surface.

Whether a polycrystalline material is formed (as opposed to a crystalline material without grain boundaries) can be controlled by variation of crystallisation conditions according to techniques well known in the art. The average crystal size, or crystallite size in a polycrystalline material, can also be varied by varying the crystallisation conditions according to techniques well known in the art.

The stabilised crystalline material of the invention typically comprises crystals having a diameter of from 1 nm to 5 μm. Accordingly, the crystal which has an oxide coating on its entire surface typically has a diameter of from 1 nm to 5 μm. By "diameter" is meant the diameter of the smallest sphere which can fit entirely within the crystal. (Of course, as in general, the term "crystal" should be understood to refer to "crystallite" where the crystalline material is a polycrystalline material.

More usually, the stabilised crystalline material of the invention comprises crystals having a diameter of from 10 nm to 1 μm. Accordingly, the crystal which has an oxide coating on its entire surface typically has a diameter of from 10 nm to 1 μm. In one embodiment, the stabilised crystalline material of the invention comprises crystals having a diameter of at least 50 nm, or at least 100 nm. In that embodiment, the crystal which has an oxide coating on its entire surface has a diameter of at least 50 nm, preferably at least 100 nm.

The oxide coating itself can have a wide range of thicknesses. By the "thickness" of the oxide coating is meant its mean height measured in a direction perpendicular to the crystal face on which it sits.

The oxide coating is at least one atom thick. The maximum thickness of the oxide coating is not particularly limited. Generally, the thickness of the oxide coating is smaller than the diameter of the crystal, especially where the diameter of the crystal is 50 nm or more. The thickness typically varies with the amount of oxide precursor used during the formation of the stabilised crystalline A/M/X material. However, after formation of a stabilised crystalline A/M/X material according to the process described herein, the stabilised crystalline material may be subjected to a further deposition of oxide, causing a thicker oxide layer.

Typically, therefore, in the stabilised crystalline A/M/X material of the invention the oxide coating has a minimum thickness of 0.1 nm. The oxide coating may for example be at least 1 nm thick or at least 2 nm thick, for instance at least 5 nm thick. The oxide coating is typically from 0.5 nm thick to 500 nm thick. For example, the oxide coating may be from 1 nm to 100 nm thick, e.g. from 2 nm to 50 nm thick.

The stabilised crystalline A/M/X material of the invention comprises a compound of formula $[A]_a[M]_b[X]_c$ and an oxide of formula $[Z]_pO_q$. However, it may comprise various other species. For instance either the compound of formula $[A]_a[M]_b[X]$, and/or the oxide of formula $[Z]_pO_q$ may comprise one or more impurities. Such impurities can include, for example, residual solvent molecules, residual A precursor, residual M precursor, residual oxide precursor, residual solvent molecules or residual water.

In a preferred embodiment, the compound of formula $[A]_a[M]_b[X]_c$ comprises the at least one element Z as an impurity. This impurity can arise as the element(s) Z are present during the formation of the compound of formula $[A]_a[M]_b[X]_c$.

Generally, it is desirable to avoid large quantities of impurities in order to avoid excessive disruption of optical properties of the material of the invention. Accordingly, in a preferred embodiment, the stabilised A/M/X material consists essentially of a compound of formula $[A]_a[M]_b[X]_c$, and an oxide of formula $[Z]_pO_q$. In a particular exemplary embodiment, the stabilised crystalline A/M/X material of the invention is substantially free of aliphatic ligands, preferably entirely free of aliphatic ligands, wherein "aliphatic ligands" are as defined herein. By "substantially free of aliphatic ligands" is meant that the stabilised crystalline A/M/X material comprises less than 0.5% by weight of aliphatic ligands, preferably less than 0.01% by weight; more preferably less than 0.001% by weight.

The compound of formula $[A]_a[M]_b[X]_c$, and the oxide of formula $[Z]_pO_q$. Briefly, it may be preferred that p is from 1 to 3 and q is from 1 to 8. Each element Z is selected from Al, Si, Zr, Ga, Ba, Nb, Mg, Y, Ni, and Zn, preferably Al, Zr or Si, most preferably Al.

Each A cation is generally selected from an alkali metal cation, $C_{1-10}$ alkylammonium, $C_{2-10}$ alkenylammonium, iminium, $C_{1-10}$ alkyliminium, $C_{3-10}$ cycloalkylammonium and $C_{3-10}$ cycloalkyliminium optionally substituted with one or more substituents selected from amine, $C_{1-6}$ alkylamine, imine, $C_{1-6}$ alkylamine, $C_{1-6}$ alkyl, $C_{2-6}$ alkenyl $C_{3-6}$ cycloalkyl and $C_{6-12}$ aryl; preferably one or more of $Cs^+$, $Rb^+$, methylammonium, ethylammonium, propylammonium. butylammonium, pentylammonium, hexylammonium, heptylammonium, octylammonium, formamidinium, benzyl ammonium, phenylethylammonium, benzylammonium, naphtylmethylammonium and guanidinium.

Each M cation is generally selected from a metal or metalloid cation; preferably from one or more of $Li^+$, $Na^+$, $K^+$, $Rb^+$, $Cs^+$, $Cu^+$, $Ag^+$, $Au^+$, $Hg^+$, $Ca^{2+}$, $Sr^{2+}$, $Cd^+$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, $Eu^{2+}$, $Bi^{3+}$, $Sb^{3+}$, $Cr^{3+}$, $Fe^{3+}$, $Co^{3+}$, $Ga^{3+}$, $As^{3+}$, $Ru^{3+}$, $Rh^{3+}$, $In^{3+}$, $Ir^{3+}$ and $Au^{3+}$, preferably $Cu^+$, $Ag^+$, $Au^+$, $Sn^{2+}$, $Pb^{2+}$, $Cu^{2+}$, $Ge^{2+}$, $Ni^{2+}$, $Bi^{3+}$ and $Sb^{3+}$; particularly preferably $Pb^{2+}$.

Each X anion is generally selected from $F^-$, $Cl^-$, $Br^-$ or $I^-$, preferably $Cl^-$ or $Br^-$.

It is particularly preferred that the compound of formula $[A]_a[M]_b[X]_c$ is a compound of formula $[A][M][X]_3$. Such compounds are exemplified herein.

It is further particularly preferred that [A] comprises two or more A cations, preferably wherein [A] comprises $Cs^+$ and $Rb^+$. Compounds of this type have been shown to degrade particularly rapidly under previous methods of stabilisation, but have been shown to maintain their photoluminescence properties for at least 300 hours when subjected to oxide stabilisation as described herein.

The crystalline product of the invention may be manipulated and modified for use in an optoelectronic device. For example, the stabilised crystalline A/M/X material may be ground to a coarse powder. For example, a powder may be used to coat a surface or may be embedded into a carrier material such as a polymer. By a coarse powder is meant a powder of particles no smaller than the crystal grains, such that the oxide coating on the crystals (where present) generally remains intact.

Accordingly, the invention provides a coarse-grained powder comprising a stabilised crystalline A/M/X material as defined herein.

In other embodiments, the stabilised crystalline A/M/X material of the invention is formed as a thin film. Accordingly, the invention provides a thin film comprising a stabilised crystalline A/M/X material as defined herein.

Photoactive Material

The stabilised crystalline A/M/X material of the invention is typically a semiconductor, and is typically a strong and stable emitter of visible light (i.e. light having a wavelength of from about 450 nm to about 700 nm). Accordingly, the stabilised crystalline A/M/X material is highly useful in a wide variety of electronic devices. Exemplary optoelectronic devices and their manufacture are described in WO 2013/171517, WO 2013/171518, WO 2013/171520, WO 2014/045021, WO 2017/017441, WO 2017/037448 and WO 2017/089819, the entire contents of which are incorporated herein by reference.

For incorporation into an optoelectronic device, the stabilised crystalline A/M/X material of the invention is typically provided as a photoactive material. The photoactive material may consist entirely of a stabilised A/M/X material as defined herein, or may comprise other components. Accordingly, the invention provides a photoactive material comprising the stabilised crystalline A/M/X material of the invention, for example a luminescent material comprising the stabilised crystalline A/M/X material of the invention.

The term "photoactive material", as used herein, refers to a material which can absorb and/or emit photons. A photoactive material can do one or more of the following.

(i) Absorb photons, which may then generate free charge carriers e.g. electrons and holes. These materials are referred to as photoabsorbent materials.

(ii) Absorb photons at energies higher than its band gap and re-emit photons at energies of the band gap (these are referred to as photoemissive materials). One type of photoemissive material is a luminescent material, which is a material that emits light following the absorption of photons, i.e. a phosphorescent or a fluorescent material.

(iii) Accept charge, both electrons and holes, which may subsequently recombine and emit light.

Photoactive materials are examples of semiconducting materials. A semiconductor or semiconducting material as used herein refers to a material with electrical conductivity intermediate in magnitude between that of a conductor and a dielectric. A semiconductor may have a band gap of from 0.5 to 3.5 eV, for instance from 0.5 to 2.5 eV or from 1.0 to 2.0 eV (when measured at 300 K). The invention therefore provides a semiconducting material comprising the stabilised crystalline A/M/X material of the invention.

The photoactive material of the invention is generally capable of absorbing and/or emitting photons in the visible region of the spectrum, for example in the blue region of the visible spectrum. The photoactive material may therefore be described as a photoemissive material (i.e. a material that can emit light) or a photoabsorbent material (i.e. a material that can absorb light). For instance, the photoactive material of the invention can typically emit and/or absorb photons of at least one wavelength of 450 to 700 nm, for example of 450 to 650 nm. In a preferred embodiment, the stabilised A/M/X materials of the invention have a peak emission wavelength in the range 450 to 500 nm, preferably 455 to 495 nm, particularly preferably 460 to 490 nm. However, photoactive materials which can absorb and emit photons typically do not show absorbance onset and peak emission at exactly the same wavelength.

By absorbance onset is meant, from the perspective of moving from longer wavelength towards shorter wavelength, the wavelength at which the photoactive material starts to significantly absorbs photons, and by peak emission is meant the wavelength at which the photoactive material emits photons with the highest intensity. Typically, the peak emission of the photoactive material is 1000 nm or less, preferably 700 nm or less, for example 650 nm or less. In a preferred embodiment, the stabilised A/M/X materials of the invention have a peak emission wavelength in the range 450 to 500 nm, preferably 455 to 495 nm, particularly preferably 460 to 490 nm.

The photoactive material may comprise greater than or equal to 5 wt % of the stabilised crystalline A/M/X material of the invention. Typically at least 50% of the weight of the photoactive materials consists of a stabilised crystalline A/M/X material as defined herein. The photoactive material may comprise additional components as discussed herein, for example scaffold materials, matrix materials or coatings. Typically, though, the photoactive material comprises greater than or equal to 80 wt % of a stabilised crystalline A/M/X material as defined herein. Preferably, the photoactive material comprises greater than or equal to 95 wt % of a stabilised crystalline A/M/X material, for instance greater than or equal to 99 wt % of a stabilised crystalline A/M/X material. The photoactive material may consist, or consist essentially, of a stabilised crystalline A/M/X material.

The photoactive material is typically solid.

The photoactive material may comprise a stabilised crystalline A/M/X material as defined herein. Accordingly, in one embodiment the photoactive material comprises a coarse-grained powder of the stabilised crystalline A/M/X material. In another embodiment, the photoactive material may comprise a thin film of the stabilised crystalline A/M/X material. Often, the stabilised crystalline A/M/X material is polycrystalline and accordingly the photoactive material therefore comprises a polycrystalline stabilised crystalline A/M/X material of the invention. In other embodiments, the photoactive material comprises nanocrystals of the stabilised crystalline A/M/X material.

The photoactive material may be in any form. Typically the photoactive material is in the form of a layer. The photoactive material in the form of a layer is typically at least 1 nm thick. The layer of photoactive material may be up to 10 mm thick, for instance where the layer is intended to be a free-standing component of a device. Usually, the layer of photoactive material is from 2 nm to 1 mm thick, more usually from 5 nm to 5 μm thick.

The layer of photoactive material may comprise a stabilised crystalline A/M/X material within the said layer. The amount of said material within the said layer may vary, depending upon other components in the layer such as any coatings, or matrix or scaffold materials. In some embodiments, the photoactive material may consist essentially of a layer of a stabilised crystalline A/M/X material as defined herein. For example, the photoactive material may consist entirely of a stabilised crystalline A/M/X material of the invention. However, more typically, the photoactive material may comprise at least 50% of a stabilised crystalline A/M/X material by weight, for example at least 70, 80 or 80% of a stabilised crystalline A/M/X material by weight. In some embodiments, the photoactive material may comprise at least 95%, of a stabilised crystalline A/M/X material by weight. Typically, a layer of photoactive material according to the invention comprises up to 99.9% of a stabilised crystalline A/M/X material by weight.

The photoactive material may comprise a plurality of layers. Some or all of such layers may comprise a stabilised crystalline A/M/X material.

Where a photoactive material is in the form of a layer, a stabilised crystalline A/M/X material may be distributed evenly or unevenly throughout the layer. For instance, the photoactive material may comprise a layer consisting essentially of, or consisting only of, a stabilised crystalline A/M/X material. Alternatively or additionally, the photoactive material may comprise a substrate having a stabilised crystalline A/M/X material on the said substrate (for instance in coarse-grained powder form or thin film form).

In some embodiments, the photoactive material may comprise one or more stabilised crystalline A/M/X material(s) of the invention in the form of a thin film. A thin film typically comprises a polycrystalline material disposed on a substrate.

In some embodiments, the photoactive material of the invention comprises a matrix material. That is, the photoactive material of the invention may comprise one or more stabilised A/M/X materials of the invention together with a matrix material.

Where the photoactive material of the invention comprises a matrix material, the photoactive material typically comprises particles of one stabilised crystalline A/M/X material(s) of the invention suspended in one or more matrix materials. By "particles" is meant a coarse-grained powder or crystals (e.g. nanocrystals) of the stabilised crystalline A/M/X material(s). Preferably, where the photoactive material comprises a matrix material, the photoactive material comprises nanocrystals of one or more stabilised crystalline A/M/X material(s) of the invention suspended in said matrix material.

Suitable matrix materials are described in WO 2017/017441, the entire contents of which is incorporated by reference herein. A matrix material is any suitable material in which a plurality of nanoparticles can be suspended. The matrix material is typically solid. The matrix material is typically non-reactive in that it does not undergo a chemical reaction with the nanoparticles or any other part of the light emitting device (e.g. a metal component). The matrix material typically has a high transparency to light across a large proportion of the visible spectrum.

The matrix material may be an inorganic material or an organic material. The matrix material is usually stable at temperatures up to 150° C. or up to 100° C. Typically, the matrix material comprises a polymeric matrix material.

A polymeric matrix material is a matrix material comprising a polymer. The polymeric matrix material typically comprises a polymer which is a polyalkene (e.g. polyethene, polypropene, polybutene, polymethylmethacrylate or polystyrene), a polyester (e.g. polyethylene terephthalate, polyhydroxybutyrate or polyethylene apidate), a polyurethane, a polycarbonate, a polyimide, a polyamide (e.g. polyamide 6 or polyamide 66), or an epoxy resin. Preferably, the polymeric matrix material comprises a polymer selected from polymethylmethacrylate, polystyrene, polyurethane, a polycarbonate, a polyimide, a polyamide or an epoxy resin.

An inorganic matrix material is typically an inorganic oxide, for example a metal oxide. Examples of inorganic matrix materials include ZnO, NiO and $SnO_2$. Other examples of inorganic matrix materials include large band-gap perovskites, for instance perovskites with a band gap of 3 eV or more, preferably 4 eV or more. However, these large band-gap perovskites are less preferred matrix materials than inorganic oxides.

In some embodiments, the matrix material is a semiconducting material. Suitable examples of semiconducting matrix materials include poly vinyl carbazole, a polyfluorene derivative, and CBP (4,4'-Bis(N-carbazolyl)-1,1'-biphenyl).

Thus, in some embodiments, the photoactive material comprises nanoparticles of one or more stabilised crystalline A/M/X material(s) of the invention together with a matrix material selected from polymethylmethacrylate, polystyrene, polyurethane, a polycarbonate, a polyimide, a polyamide, an epoxy resin, ZnO, NiO and $SnO_2$, poly vinyl carbazole, a polyfluorene derivative, and CBP (4,4'-Bis(N-carbazolyl)-1,1'-biphenyl).

Where the photoactive material comprises a matrix material, the photoactive material typically comprises up to 50% by weight of the matrix material. For example, the photoactive material typically comprises up to 40% by weight, up to 30% by weight or up to 20% by weight of the matrix material. In such embodiments, the photoactive material typically comprises at least 50% by weight of a stabilised crystalline A/M/X material(s) of the invention.

Where the photoactive material comprises a matrix material, the photoactive material is typically present in the form of a layer. The thickness of the said layer is typically from 100 nm to 4 mm, for instance from 1 μm to 1000 μm or from 50 μm to 500 μm. In some cases the layer may have a thickness of from 1 to 4 mm, for instance if a free-standing layer is to be constructed.

In some embodiments, the photoactive material comprises a scaffold material. A scaffold material is typically a solid material. A scaffold material is typically a solid support on which one or more stabilised crystalline A/M/X material(s) of the invention are distributed.

In some embodiments, the photoactive material of the invention comprises a porous scaffold together with one or more stabilised crystalline A/M/X material(s) of the invention. Typically, the said porous scaffold material is in contact with the said one or more stabilised crystalline A/M/X material(s). Suitable examples of a porous scaffold material are described in WO 2013/171518, the entire contents of which is incorporated by reference.

Typically, a stabilised crystalline A/M/X material of the invention is disposed on the surface of the scaffold material. Typically, where the scaffold is a porous scaffold, a stabilised crystalline A/M/X material is disposed on the surface of the porous scaffold material, so that it is supported on the surfaces of pores within the scaffold. In such embodiments, the stabilised crystalline A/M/X material(s) of the invention are distributed on an internal surface or surfaces of the scaffold material so that the said material(s) may be said to be distributed within the scaffold material. The stabilised crystalline A/M/X material(s) in this situation typically act as a light-absorbing, photosensitising materials, as well as charge-transporting materials. A photoactive material comprising a stabilised crystalline A/M/X material and a scaffold material, e.g. a porous scaffold material, can advantageously rapidly transport charge carriers through the photoactive material.

A scaffold material is typically a dielectric scaffold material or an n-type scaffold material. Preferably, a scaffold material is a porous dielectric scaffold material or a porous n-type scaffold material.

By "dielectric material" is meant an insulating material. A dielectric scaffold material may comprise a material having a band gap greater than or equal to 3.6 eV, or greater than or equal to 4 eV. A dielectric scaffold material is often a dielectric oxide. A dielectric scaffold material typically comprises one or more oxides of aluminium, germanium, zirconium, silicon, yttrium or ytterbium. However, a dielectric scaffold material may comprise one or more of polymethylmethacrylate (PMMA), polystyrene, polycarbonate, or polyimide. A dielectric scaffold material may be preferably be selected from aluminosilicate, zirconia, alumina and silica, for instance alumina ($Al_2O_3$).

An n-type scaffold may be selected from any n-type material described herein, for instance titania ($TiO_2$). By "n-type material" is meant an electron-transporting material.

A suitable n-type material is typically an inorganic material. A suitable n-type inorganic material may be selected from a metal oxide, a metal sulphide, a metal selenide, a metal telluride, a perovskite, amorphous Si, an n-type group IV semiconductor, an n-type group III-V semiconductor, an n-type group II-VI semiconductor, an n-type group I-VII semiconductor, an n-type group IV-VI semiconductor, an n-type group V-VI semiconductor, and an n-type group II-V semiconductor, any of which may be doped or undoped. More typically, the n-type material is selected from a metal oxide, a metal sulphide, a metal selenide, and a metal telluride. The n-type material may comprise an inorganic material selected from oxide of titanium, tin, zinc, niobium, tantalum, tungsten, indium, gallium, neodymium, palladium, or cadmium, or an oxide of a mixture of two or more of said metals. For instance, the n-type material may comprise $TiO_2$, $SnO_2$, ZnO, $Nb_2O_5$, $Ta_2O_5$, $WO_3$, $W_2O_5$, $In_2O_3$, $Ga_2O_3$, $Nd_2O_3$, PhO, or CdO. Other suitable n-type materials that may be employed include sulphides of cadmium, tin, copper, or zinc, including sulphides of a mixture of two or more of said metals. For instance, the sulphide may be $FeS_2$, CdS, ZnS or $Cu_2ZnSnS_4$. The n-type material may for instance comprise a selenide of cadmium, zinc, indium, or gallium or a selenide of a mixture of two or more of said metals; or a telluride of cadmium, zinc, cadmium or tin, or a telluride of a mixture of two or more of said metals. For instance, the selenide may be $Cu(In,Ga)Se_2$. Typically, the telluride is a telluride of cadmium, zinc, cadmium or tin. For instance, the telluride may be CdTe. The n-type material may for instance comprise an inorganic material selected from oxide of titanium, tin, zinc, niobium, tantalum, tungsten, indium, gallium, neodymium, palladium, cadmium, or an oxide of a mixture of two or more of said metals; a sulphide of cadmium, tin, copper, zinc or a sulphide of a mixture of two or more of said metals; a selenide of cadmium, zinc, indium, gallium or a selenide of a mixture of two or more of said metals; or a telluride of cadmium, zinc, cadmium or tin, or a telluride of a mixture of two or more of said metals. Examples of other semiconductors that may be suitable n-type materials, for instance if they are n-doped, include group IV compound semiconductors; amorphous Si; group III-V semiconductors (e.g. gallium arsenide); group II-VI semiconductors (e.g. cadmium selenide); group I-VII semiconductors (e.g. cuprous chloride); group IV-VI semiconductors (e.g. lead selenide); group V-VI semiconductors (e.g. bismuth telluride); and group II-V semiconductors (e.g. cadmium arsenide). Typically, the n-type material comprises $TiO_2$.

Thus, in some embodiments the photoactive material of the invention may comprise a stabilised crystalline A/M/X material of the invention together with a porous scaffold material, preferably wherein the dielectric scaffold material is selected from one or more of alumina, silica and titania.

Where the photoactive material comprises a scaffold material, the photoactive material is typically present in the form of a layer. Typically, the thickness of the said layer is from 10 nm to 5000 nm, for instance the thickness may be from 400 nm to 800 nm. Often, thickness of the said layer is from 100 nm to 700 nm.

A layer of the photoactive material of the invention may be without open porosity. The layer of the photoactive material may comprise a layer of a stabilised crystalline A/M/X material of the invention, which layer of a stabilised crystalline A/M/X material is without open porosity. Alternatively, the layer of the photoactive material may be porous, or the layer of the photoactive material may be deposited on a porous scaffold as described herein.

Optoelectronic Device

The invention further provides an optoelectronic device comprising a photoactive material as defined herein. Thus, the invention provides an optoelectronic device comprising a stabilised crystalline A/M/X material as defined herein, a coarse-grained powder as defined herein or a thin film as defined herein.

The term "optoelectronic device" as used herein, refers to devices which source, control, detect or emit light. Typically, the light is visible light, e.g. light having a wavelength of about 450 to 700 nm. In a preferred embodiment, the device is capable of emitting blue light (i.e. light having a wavelength of about 450 to 500 nm, preferably about 455 to 495 nm, more preferably about 460 to 490 nm). The optoelectronic device of the invention comprises the photoactive material of the invention and is therefore capable of one or more of:

(i) absorbing photons, which may then generate free charge carriers e.g. electrons and holes;

(ii) absorbing photons at energies higher than its band gap and re-emit photons at energies of the band gap; and (iii) accepting charge, both electrons and holes, which may subsequently recombine and emit light.

In one preferred embodiment, the invention provides an optoelectronic device which is a photovoltaic device, comprising a photoactive material as defined herein. By "photovoltaic device" is meant herein a device that is capable of converting electrical energy into light, particularly visible light. In a preferred embodiment the said photovoltaic device is capable of converting electrical energy into blue light (i.e. light having a wavelength of about 450 to 500 nm, preferably about 455 to 495 nm, more preferably about 460 to 490 nm).

In another preferred embodiment, the invention provides an optoelectronic device which is capable of producing photons outside the visible spectrum, particularly in the infrared region, for instance form 700 to 1500 nm. Thus, in a preferred embodiment the invention provides an optoelectronic device which is a light emitting diode capable of converting electrical energy into photons having a wavelength of from 700 to 1500 nm Such optoelectronic devices are most useful as there is a wide demand for infra red emitters, specifically for communications technologies. Many A/M/X materials are available which do emit in the IR region of the spectrum and which may be used in the fabrication of such optoelectronic devices. For instance the Sn-based $[A]Pb_ySn_{1-x}[X]_3$ family of compounds, which emit light between 700 and 1000 nm in wavelength. These specific material generally suffer from instability due to the $Sn^{2+}$ ion, required to sustain the charge neutrality in the crystal, oxidizing to $Sn^{4+}$. Hence the stability imparted by the process of the invention is most advantageous in stabilising these compounds, and in producing photoactive materials comprising these species for a wide variety of optoelectronic devices including LED and photovoltaic applications.

In another preferred embodiment, the invention provides an optoelectronic device which is a light-emitting device, comprising a photoactive material as defined herein. The light-emitting device may be a light-emitting diode (LED). The light-emitting device of the invention is typically capable of emitting visible light. In a preferred embodiment the light-emitting device is capable of emitting blue light (i.e. light having a wavelength of about 450 to 500 nm, preferably about 455 to 495 nm, more preferably about 460 to 490 nm).

In some preferred embodiments, the optoelectronic device of the invention comprises a photoactive material, wherein the photoactive material is disposed in a layer. A layer of photoactive material is defined herein. Usually, the said layer of photoactive material has a thickness of at least 2 nm. However, in some embodiments where the layer is intended to stand alone, the layer may be considerably thicker (for example up to 10 mm thick, more usually up to 5 mm thick).

In some embodiments, the optoelectronic device of the invention comprises a layer of photoactive material which is a thin sensitising layer, for instance having a thickness of from 5 nm to 50 nm.

In devices wherein the layer of said photoactive material forms a planar heterojunction with an n-type or p-type region, the layer of said photoactive material may have a thickness of greater than or equal to 100 nm. Preferably, the layer of said photoactive material has a thickness of from 100 nm to 700 nm, for instance from 200 nm to 500 nm. The term "planar heterojunction", as used herein, means that surface defining junction between the semiconducting material and the n- or p-type region is substantially planar and has a low roughness, for instance a root mean squared roughness of less than 20 nm over an area of 25 nm by 25 nm, for instance a root mean squared roughness of less than 10 nm, or less than 5 nm, over an area of 25 nm by 25 nm.

The photoactive material often acts as a photoactive component (e.g. a photoabsorbent component or a photoemissive component) within the optoelectronic device. In other embodiments, the semiconducting material may form a layer of a p-type or n-type semiconductor in an optoelectronic device, e.g. a solar cell or an LED.

Typically, the optoelectronic device of the invention is a photovoltaic device wherein the photovoltaic device comprises:

(a) an n-type region comprising at least one n-type layer;

(b) a p-type region comprising at least one p-type layer; and, disposed between the n-type region and the p-type region:

(c) the layer of the photoactive material.

Preferred examples of the optoelectronic device of the invention include an LED, a photodiode, a solar cell, a photodetector, or a photosensor; particularly preferable are an LED, a photodiode or a solar cell.

For instance, the optoelectronic device may comprise:

an n-type region comprising at least one n-type layer;

a p-type region comprising at least one p-type layer; and, disposed between the n-type region and the p-type region:

said layer of a photoactive material which comprises (or consists essentially of) a stabilised crystalline A/M/X material of the invention.

The n-type region comprises at least one n-type layer. The n-type region typically comprises one or two n-type layers. Each layer may be porous or compact. A compact layer is typically a layer without open porosity (e.g. absent of any meso- or macroporosity). The p-type region comprises at least one p-type layer. The p-type region typically comprises one or two p-type layers. Each layer may be porous or compact. A compact layer is typically a layer without open porosity. It may be a non-porous layer.

In some cases, the optoelectronic device comprises a layer of said photoactive material without open porosity. The layer of said photoactive material without open porosity is typically a crystalline layer of a stabilised crystalline A/M/X material (preferably a perovskite) according to the invention without open porosity. Thus, the layer of said photoactive material may comprise greater than or equal to 95 volume % of one or more stabilised crystalline A/M/X material(s) of the invention (and thus less than 5 volume % of absence pore volume). The layer without open porosity typically does not comprise macropores or mesopores.

The layer of the photoactive material typically forms a planar heterojunction with the n-type region or the p-type region. The layer of the photoactive material typically forms a first planar heterojunction with the n-type region and a second planar heterojunction with the p-type region. This forms a planar heterojunction device, of the kind described in WO 2014/045021. The term "planar heterojunction" as used herein refers to a junction between two regions where one region does not infiltrate the other. This does not require that the junction is completely smooth, just that one region does not substantially infiltrate pores in the other region.

When the layer of the photoactive material forms a planar heterojunction with both the p-type and the n-type region, this typically forms a thin film device. The thickness of the layer of the photoactive material may be greater than or equal to 50 nm.

In some embodiments, it is desirable to have a porous scaffold material present, wherein the porous scaffold is as defined herein. The scaffold material may aid charge transport from the photoactive material to an adjacent region. The scaffold material may also, or alternatively, aid formation of the layer of the photoactive material during device construction. Thus, in some embodiments, the optoelectronic device comprises:

an n-type region comprising at least one n-type layer;

a p-type region comprising at least one p-type layer; and, disposed between the n-type region and the p-type region, a layer of photoactive material comprising:

(i) a porous scaffold material; and (ii) a stabilised crystalline A/M/X material in contact with the scaffold material.

The architecture of such devices is described in more detail in WO 2014/045021, whose entire contents are incorporated herein by reference.

The layer of photoactive material comprising a porous scaffold material and a stabilised crystalline A/M/X material may form a sensitizing layer of the photoactive material. Thus, the optoelectronic device may be a sensitized device.

Further details of the architecture of optoelectronic devices such as solar cells and suitable materials therefor are described in published application WO 2017/037448, the entire contents of which is incorporated herein by reference. The stabilised crystalline A/M/X material of the present invention may be used in place of the semiconducting material therein.

In some embodiments, the optoelectronic device comprises:

an n-type region comprising at least one n-type layer;

a p-type region comprising at least one p-type layer; and, disposed between the n-type region and the p-type region:

(i) a first layer which comprises a porous scaffold material and said stabilised crystalline A/M/X material; and (ii) a capping layer disposed on said first layer, which capping layer is a layer of said stabilised crystalline A/M/X material without open porosity, wherein the stabilised crystalline A/M/X material in the capping layer is in contact with the stabilised crystalline A/M/X material in the first layer.

The first layer comprises said porous scaffold material and said stabilised crystalline A/M/X material disposed on the surface of the scaffold material. The term "scaffold material" as used herein refers to a material whose function(s) include acting as a physical support for another material. In the present case, the scaffold material acts as a support for the stabilised crystalline A/M/X material present in the first layer. The stabilised crystalline A/M/X material is disposed, or supported on, the surface of the scaffold material. The porous scaffold material typically has an open porous structure. Accordingly, the "surface" of the porous scaffold material here typically refers to the surfaces of pores within the scaffold material. Thus, the stabilised crystalline A/M/X material in the first layer is typically disposed on the surfaces of pores within the scaffold material.

In some embodiments, the scaffold material is porous and the stabilised crystalline A/M/X material in the first layer is disposed in pores of the scaffold material. The effective porosity of said scaffold material is usually at least 50%. For instance, the effective porosity may be about 70%. In one embodiment, the effective porosity is at least 60%, for instance at least 70%.

Typically, the stabilised crystalline A/M/X material (or photoactive material) in the first layer contacts one of the p-type and n-type regions, and the stabilised crystalline A/M/X material in the capping layer contacts the other of the p-type and n-type regions. The stabilised crystalline A/M/X material in the capping layer typically forms a planar heterojunction with the p-type region or the n-type region.

In one embodiment, the stabilised crystalline A/M/X material in the capping layer contacts the p-type region, and the stabilised crystalline A/M/X material in the first layer contacts the n-type region. In another embodiment, the stabilised crystalline A/M/X material in the capping layer contacts the n-type region, and the stabilised crystalline A/M/X material in the first layer contacts the p-type region (for instance in an inverted device).

In one embodiment, the stabilised crystalline A/M/X material in the capping layer contacts the p-type region, and the stabilised crystalline A/M/X material in the first layer contacts the n-type region. Usually, in this embodiment, the scaffold material is either an electron-transporting scaffold material or a dielectric scaffold material. Typically, the stabilised crystalline A/M/X material in the capping layer forms a planar heterojunction with the p-type region.

In another embodiment, however, the stabilised crystalline A/M/X material in the capping layer contacts the n-type region, and the stabilised crystalline A/IVI/X material in the first layer contacts the p-type region. Typically, in this embodiment, the scaffold material is a hole-transporting scaffold material or a dielectric scaffold material. Typically, the stabilised crystalline A/M/X material in the capping layer forms a planar heterojunction with the n-type region.

The thickness of the capping layer is usually greater than the thickness of the first layer. The majority of any photoactivity (e.g. light absorption or light emission) therefore usually occurs in a capping layer. The thickness of the capping layer is typically from 10 nm to 100 μm. More typically, the thickness of the capping layer is from 10 nm to 10 μm. Preferably, the thickness of the capping layer is from 50 nm to 1000 nm, or for instance from 100 nm to 700 nm. The thickness of the capping layer may be greater than or equal to 100 nm. The thickness of the first layer, on the other hand, is often from 5 nm to 1000 nm. More typically, it is from 5 nm to 500 nm, or for instance from 30 nm to 200 nm.

The n-type region is typically an n-type layer. The n-type region may alternatively comprise an n-type layer and an n-type exciton blocking layer. Such an n-type exciton blocking layer is typically disposed between the n-type layer and the layer(s) comprising the stabilised crystalline A/M/X material. The n-type region may have a thickness of from 50 nm to 1000 nm. For instance, the n-type region may have a thickness of from 50 nm to 500 nm, or from 100 nm to 500 nm.

Preferably, the n-type region comprises a compact layer of an n-type semiconductor. The n-type region may further comprise a porous layer of an n-type semiconductor which may be the porous scaffold material as described above (wherein the porous scaffold material is an electron-transporting material).

The n-type region in the optoelectronic device of the invention comprises one or more n-type layers. Often, the n-type region is an n-type layer, i.e. a single n-type layer. In other embodiments, however, the n-type region may comprise an n-type layer and an n-type exciton blocking layer. In cases where an n-type exciton blocking layer is employed, the n-type exciton blocking layer is usually disposed between the n-type layer and the layer(s) comprising the stabilised crystalline A/M/X material.

An exciton blocking layer is a material which is of wider band gap than the stabilised crystalline A/M/X material, but has either its conduction band or valance band closely matched with those of the stabilised crystalline A/M/X material. If the conduction band (or lowest unoccupied molecular orbital energy levels) of the exciton blocking layer are closely aligned with the conduction band of the stabilised crystalline A/M/X, then electrons can pass from the stabilised crystalline A/M/X material into and through the exciton blocking layer, or through the exciton blocking layer and into the stabilised crystalline A/M/X material, and we term this an n-type exciton blocking layer. An example of such is bathocuproine, as described in P. Peumans, A. Yakimov, and S. R. Forrest, "Small molecular weight organic thin-film photodetectors and solar cells" J. Appl. Phys. 93, 3693 (2001) and Masaya Hirade, and Chihaya Adachi, "Small molecular organic photovoltaic cells with exciton blocking layer at anode interface for improved device performance" Appl. Phys. Lett. 99, 153302 (2011)}.

An n-type layer is a layer of an electron-transporting (i.e. an n-type) material. The n-type material may, for instance, be a single n-type compound or elemental material, which may be undoped or doped with one or more dopant elements.

The n-type layer employed in the optoelectronic device of the invention may comprise an inorganic or an organic n-type material.

A suitable inorganic n-type material may be selected from a metal oxide, a metal sulphide, a metal selenide, a metal telluride, a perovskite, amorphous Si, an n-type group IV semiconductor, an n-type group III-V semiconductor, an n-type group II-VI semiconductor, an n-type group I-VII semiconductor, an n-type group IV-VI semiconductor, an n-type group V-VI semiconductor, and an n-type group II-V semiconductor, any of which may be doped or undoped.

The n-type material may be selected from a metal oxide, a metal sulphide, a metal selenide, a metal telluride, amorphous Si, an n-type group IV semiconductor, an n-type group III-V semiconductor, an n-type group II-VI semiconductor, an n-type group I-VII semiconductor, an n-type group IV-VI semiconductor, an n-type group V-VI semiconductor, and an n-type group II-V semiconductor, any of which may be doped or undoped.

More typically, the n-type material is selected from a metal oxide, a metal sulphide, a metal selenide, and a metal telluride.

Thus, the n-type layer may comprise an inorganic material selected from oxide of titanium, tin, zinc, niobium, tantalum, tungsten, indium, gallium, neodymium, palladium, or cadmium, or an oxide of a mixture of two or more of said metals. For instance, the n-type layer may comprise $TiO_2$, $SnO_2$, ZnO, $Nb_2O_5$, $Ta_2O_5$, $WO_3$, $W_2O_5$, $In_2O_3$, $Ga_2O_3$, $Nd_2O_3$, PbO, or CdO. Other suitable n-type materials that may be employed include sulphides of cadmium, tin, copper, or zinc, including sulphides of a mixture of two or more of said metals. For instance, the sulphide may be $FeS_2$, CdS, ZnS, SnS, BiS, SbS, or $Cu_2ZnSnS_4$.

The n-type layer may for instance comprise a selenide of cadmium, zinc, indium, or gallium or a selenide of a mixture of two or more of said metals; or a telluride of cadmium, zinc, cadmium or tin, or a telluride of a mixture of two or more of said metals. For instance, the selenide may be $Cu(In,Ga)Se_2$. Typically, the telluride is a telluride of cadmium, zinc, cadmium or tin. For instance, the telluride may be CdTe.

The n-type layer may for instance comprise an inorganic material selected from oxide of titanium, tin, zinc, niobium, tantalum, tungsten, indium, gallium, neodymium, palladium, cadmium, or an oxide of a mixture of two or more of said metals; a sulphide of cadmium, tin, copper, zinc or a sulphide of a mixture of two or more of said metals; a selenide of cadmium, zinc, indium, gallium or a selenide of a mixture of two or more of said metals; or a telluride of cadmium, zinc, cadmium or tin, or a telluride of a mixture of two or more of said metals. Examples of other semiconductors that may be suitable n-type materials, for instance if they are n-doped, include group IV elemental or compound semiconductors; amorphous Si; group III-V semiconductors (e.g. gallium arsenide); group II-VI semiconductors (e.g. cadmium selenide); group I-VII semiconductors (e.g. cuprous chloride); group IV-VI semiconductors (e.g. lead selenide); group V-VI semiconductors (e.g. bismuth telluride); and group II-V semiconductors (e.g. cadmium arsenide).

Typically, the n-type layer comprises $TiO_2$.

When the n-type layer is an inorganic material, for instance $TiO_2$ or any of the other materials listed above, it may be a compact layer of said inorganic material. Preferably the n-type layer is a compact layer of $TiO_2$.

Other n-type materials may also be employed, including organic and polymeric electron-transporting materials, and electrolytes. Suitable examples include, but are not limited to a fullerene or a fullerene derivative (for instance $C_{60}$ or Phenyl-C61-butyric acid methyl ester (PCBM)), an organic electron transporting material comprising perylene or a derivative thereof, or poly {[N,N0-bis(2-octyldodecyl)-naphthalene-1,4,5,8-bis(dicarboximide)-2,6-diyl]-alt-5,50-(2,20-bithiophene)} (P(NDI2OD-T2)).

The p-type region is typically a p-type layer. The p-type region may alternatively comprise an p-type layer and a p-type exciton blocking layer. Such a p-type exciton blocking layer is typically disposed between the p-type layer and the layer(s) comprising the stabilised crystalline A/M/X material. The p-type region may have a thickness of from 50 nm to 1000 nm. For instance, the p-type region may have a thickness of from 50 nm to 500 nm, or from 100 nm to 500 nm.

The p-type region in the optoelectronic device of the invention comprises one or more p-type layers. Often, the p-type region is a p-type layer, i.e. a single p-type layer. In other embodiments, however, the p-type region may comprise a p-type layer and a p-type exciton blocking layer. In cases where a p-type exciton blocking layer is employed, the p-type exciton blocking layer is usually disposed between the p-type layer and the layer(s) comprising the stabilised crystalline A/M/X material. If the valence band (or highest occupied molecular orbital energy levels) of the exciton blocking layer is closely aligned with the valence band of the stabilised crystalline A/M/X material, then holes can pass from the stabilised crystalline A/M/X material into and through the exciton blocking layer, or through the exciton blocking layer and into the stabilised crystalline A/M/X material, and we term this a p-type exciton blocking layer. An example of such is tris[4-(5-phenylthiophen-2-yl)phenyl]amine, as described in Masaya Hirade, and Chihaya Adachi, “Small molecular organic photovoltaic cells with exciton blocking layer at anode interface for improved device performance” Appl. Phys. Lett. 99, 153302 (2011).

A p-type layer is a layer of a hole-transporting (i.e. a p-type) material. The p-type material may be a single p-type compound or elemental material, or a mixture of two or more p-type compounds or elemental materials, which may be undoped or doped with one or more dopant elements.

The p-type layer employed in the optoelectronic device of the invention may comprise an inorganic or an organic p-type material. Typically, the p-type region comprises a layer of an organic p-type material.

Suitable p-type materials may be selected from polymeric or molecular hole transporters. The p-type layer employed in the optoelectronic device of the invention may for instance comprise spiro-OMeTAD (2,2',7,7'-tetrakis-(N,N-di-p-methoxyphenylamine)9,9'-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta[2,1-b:3,4-b'] dithiophene-2,6-diyl]]), PVK (poly(N-vinylcarbazole)), HTM-TFSI (1-hexyl-3-methylimidazolium bis(trifluoromethylsulfonyl)imide), Li-TFSI (lithium bis(trifluoromethanesulfonyl)imide) or tBP (tert-butylpyridine). The p-type region may comprise carbon nanotubes. Usually, the p-type material is selected from spiro-OMeTAD, P3HT, PCPDTBT and PVK. Preferably, the p-type layer employed in the optoelectronic device of the invention comprises spiro-OMeTAD.

The p-type layer may for example comprise spiro-OMeTAD (2,2',7,7'-tetrakis-(N,N-di-p-methoxyphenylamine)-9,9'-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta [2,1-b:3,4-b']dithiophene-2,6-diyl]]), or PVK (poly(N-vinylcarbazole)).

Suitable p-type materials also include molecular hole transporters, polymeric hole transporters and copolymer hole transporters. The p-type material may for instance be a molecular hole transporting material, a polymer or copolymer comprising one or more of the following moieties: thiophenyl, phenelenyl, dithiazolyl, benzothiazolyl, diketopyrrolopyrrolyl, ethoxydithiophenyl, amino, triphenyl amino, carbozolyl, ethylene dioxythiophenyl, dioxythiophenyl, or fluorenyl. Thus, the p-type layer employed in the optoelectronic device of the invention may for instance comprise any of the aforementioned molecular hole transporting materials, polymers or copolymers.

Suitable p-type materials also include m-MTDATA (4,4',4''-tris(methylphenylphenylamino)triphenylamine), MeOTPD (N,N,N',N'-tetrakis(4-methoxyphenyl)-benzidine), BP2T (5,5'-di(biphenyl-4-yl)-2,2'-bithiophene), Di-NPB (N,N'-Di-[(1-naphthyl)-N,N'-diphenyl]-1,1'-biphenyl)-4,4'-diamine), α-NPB (N,N'-di(naphthalen-1-yl)-N,N'-diphenyl-benzidine), TNATA (4,4',4''-tris-(N-(naphthylene-2-yl)-N-phenylamine)triphenylamine), BPAPF (9,9-bis[4-(N,N-bis-biphenyl-4-yl-amino)phenyl]-9H-fluorene), spiro-NPB (N2,N7-Di-1-naphthalenyl-N2,N7-diphenyl-9,9'-spirobi[9H-fluorene]-2,7-diamine), 4P-TPD (4,4-bis-(N,N-diphenylamino)-tetraphenyl), PEDOT:PSS and spiro-OMeTAD.

The p-type layer may be doped, for instance with tertbutyl pyridine and LiTFSI. The p-type layer may be doped to increase the hole-density. The p-type layer may for instance be doped with $NOBF_4$ (Nitrosonium tetrafluoroborate), to increase the hole-density.

In other embodiments, the p-type layer may comprise an inorganic hole transporter. For instance, the p-type layer may comprise an inorganic hole transporter comprising an oxide of nickel, vanadium, copper or molybdenum; CuI, CuBr, CuSCN, $Cu_2O$, CuO or CIS; a perovskite; amorphous Si; a p-type group IV semiconductor, a p-type group III-V semiconductor, a p-type group II-VI semiconductor, a p-type group I-VII semiconductor, a p-type group IV-VI semiconductor, a p-type group V-VT semiconductor, and a p-type group TI-V semiconductor, which inorganic material may be doped or undoped. The p-type layer may be a compact layer of said inorganic hole transporter.

The p-type layer may for instance comprise an inorganic hole transporter comprising an oxide of nickel, vanadium, copper or molybdenum; CuI, CuBr, CuSCN, $Cu_2O$, CuO or CIS; amorphous Si; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor, which inorganic material may be doped or undoped. The p-type layer may for instance comprise an inorganic hole transporter selected from CuI, CuBr, CuSCN, $Cu_2O$, CuO and CIS. The p-type layer may be a compact layer of said inorganic hole transporter.

Typically, the p-type layer comprises a polymeric or molecular hole transporter, and the n-type layer comprises an inorganic n-type material. The p-type polymeric or molecular hole transporter may be any suitable polymeric or molecular hole transporter, for instance any of those listed above. Likewise, the inorganic n-type material may be any suitable n-type inorganic, for instance any of those listed above. In one embodiment, for instance, the p-type layer comprises spiro-OMeTAD and the n-type layer comprises $TiO_2$. Typically, in that embodiment, the n-type layer which comprises $TiO_2$ is a compact layer of $TiO_2$.

In other embodiments, both the n-type layer and the p-type layer comprise inorganic materials. Thus, the n-type layer may comprise an inorganic n-type material and the p-type layer may comprise an inorganic p-type material. The inorganic p-type material may be any suitable p-type inorganic, for instance any of those listed above. Likewise, the inorganic n-type material may be any suitable n-type inorganic, for instance any of those listed above. In other embodiments, the p-type layer comprises an inorganic p-type material (i.e. an inorganic hole transporter) and the n-type layer comprises a polymeric or molecular hole transporter. The inorganic p-type material may be any suitable p-type inorganic, for instance any of those listed above. Likewise, the n-type polymeric or molecular hole transporter may be any suitable n-type polymeric or molecular hole transporter, for instance any of those listed above.

For instance, the p-type layer may comprise an inorganic hole transporter and the n-type layer may comprise an electron transporting material, wherein the electron transporting material comprises a fullerene or a fullerene derivative, an electrolyte, or an organic electron transporting material, preferably wherein the organic electron transporting material comprises perylene or a derivative thereof, or poly{[N,N0-bis(2-octyldodecyl)-naphthalene-1,4,5,8-bis (dicarboximide)-2,6-diyl]-alt-5,50-(2,20-bithiophene)} (P(NDI2OD-T2)). The inorganic hole transporter may for instance comprise an oxide of nickel, vanadium, copper or molybdenum; CuI, CuBr, CuSCN, $Cu_2O$, CuO or CIS; a perovskite; amorphous Si; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor, which inorganic material may be doped or undoped. More typically, the inorganic hole transporter comprises an oxide of nickel, vanadium, copper or molybdenum; CuI, CuBr, CuSCN, $Cu_2O$, CuO or CIS; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor, which inorganic material may be doped or undoped. Thus, the inorganic hole transporter may comprise an oxide of nickel, vanadium, copper or molybdenum; CuI, CuBr, CuSCN, $Cu_2O$, CuO or CIS.

The optoelectronic device typically further comprises one or more first electrodes and one or more second electrodes. The one or more first electrodes are typically in contact with the n-type region, if such a region is present. The one or more second electrodes are typically in contact with the p-type region, if such a region is present. Typically: the one or more first electrodes are in contact with the n-type region and the one or more second electrodes are in contact with the p-type region; or the one or more first electrodes are in contact with the p-type region and the one or more second electrodes are in contact with the n-type region. The first and second electrode may comprise any suitable electrically conductive material. The first electrode typically comprises a transparent conducting oxide. The second electrode typically comprises one or more metals. Typically, the first electrode typically comprises a transparent conducting oxide and the second electrode typically comprises one or more metals.

The transparent conducting oxide may be as defined above and is often FTO, ITO, or AZO, and typically ITO. The metal may be any metal. Generally the second electrode comprises a metal selected from silver, gold, copper, aluminium, platinum, palladium, or tungsten. The electrodes may form a single layer or may be patterned.

An optoelectronic device according to the invention, for instance a sensitized solar cell, may comprise the following layers in the following order:

I. one or more first electrodes as defined herein;
II. optionally a compact n-type layer as defined herein;
III. a porous layer of an n-type material as defined herein;
IV. a layer of said stabilised crystalline A/M/X material (e.g. as a sensitizer);
V. a p-type region as defined herein;
VI. optionally a further compact p-type layer as defined herein; and
VII. one or more second electrodes as defined herein.

An optoelectronic device according to the invention which is a photovoltaic device may comprise the following layers in the following order:

I. one or more first electrodes as defined herein;
II. an n-type region comprising at least one n-type layer as defined herein;
III. a layer of the photovoltaic material comprising the stabilised crystalline A/M/X material as defined herein;
IV. a p-type region comprising at least one p-type layer as defined herein; and
V. one or more second electrodes as defined herein.

A photovoltaic device according to the invention may comprise the following layers in the following order:

I. one or more first electrodes which comprise a transparent conducting oxide, preferably FTO;
II. an n-type region comprising at least one n-type layer as defined herein;
III. a layer of the stabilised crystalline A/M/X material as defined herein;
IV. a p-type region comprising at least one p-type layer as defined herein; and
V. one or more second electrodes which comprise a metal, preferably silver or gold.

A photovoltaic device (for instance an inverted device) according to the invention may comprise the following layers in the following order:

I. one or more second electrodes as defined herein;
II. an n-type region comprising at least one n-type layer as defined herein;
III. a layer of the stabilised crystalline A/M/X material as defined herein;

IV. a p-type region comprising at least one p-type layer as defined herein; and

V. one or more first electrodes as defined herein.

A photovoltaic device according to the invention, for instance a sensitized solar cell, may comprise the following layers in the following order I. one or more second electrodes which comprises a metal;

II. an n-type region comprising at least one mesoporous n-type layer as defined herein;

III. a sensitising layer of the stabilised crystalline A/M/X material as defined herein;

IV. a p-type region comprising at least one p-type layer as defined herein; and

V. one or more first electrodes which comprise a transparent conducting oxide.

The one or more first electrodes may have a thickness of from 100 nm to 700 nm, for instance of from 100 nm to 400 nm. The one or more second electrodes may have a thickness of from 10 nm to 500 nm, for instance from 50 nm to 200 nm or from 10 nm to 50 nm. The n-type region may have a thickness of from 50 nm to 500 nm. The p-type region may have a thickness of from 50 nm to 500 nm.

Many of the above-described optoelectronic devices comprise a layer of a stabilised crystalline A/M/X material disposed on a preceding layer in the device (for example a layer of semiconducting material, a layer of an n-type semiconductor, a layer of a p-type semiconductor, a scaffold material etc.). In these cases, the layer of stabilised crystalline A/M/X material in the device may be prepared as described herein, for instance at page 23. The optoelectronic devices may also further comprise subsequent layers disposed on the layer of stabilised crystalline A/M/X material. Subsequent layers disposed on the layer of stabilised crystalline A/M/X material may be prepared as described in WO 2017/037448.

In other embodiments, the photoactive material functions as a phosphor in the optoelectronic device. In such embodiments, the optoelectronic device typically comprises a light source and a photoactive material as defined herein. Typically, the photoactive material comprises a stabilised crystalline A/M/X material of the invention in coarse-grained powder form, or nanocrystalline form. Also typically, the photoactive material comprises a matrix material as defined herein.

By "functions as a phosphor" is meant that the photoactive material functions by absorbing a first wavelength of light and subsequently re-emitting a different, larger wavelength of light.

The light source is typically a white, blue or UV light source. That is, the light source is typically a source of electromagnetic radiation which emits at wavelengths of 500 nm or less, more usually 480 nm or less. For example, the light source typically emits electromagnetic radiation with a wavelength of from 400 to 480 nm.

Examples of optoelectronic devices wherein the photoactive material functions as a phosphor include display screens, such as LED display screens, and solid-state lighting devices. Such devices represent a further aspect of the invention.

Use

In a further aspect, the invention provides uses of the stabilised crystalline A/M/X materials of the invention and the photoactive materials of the invention comprising said compounds.

In a first embodiment, the invention provides the use of a stabilised crystalline A/M/X material or photoactive material as defined herein as a photo-emitter, preferably a photo-emitter which emits light, preferably visible light (i.e. light having a wavelength in the region 450 to 700 nm). In a preferred embodiment, the photo-emitter emits blue light, i.e. light in the wavelength range 450 to 500 nm, more preferably 455 to 495 nm, further preferably 460 to 490 nm.

In a second embodiment, the invention provides the use of a stabilised crystalline A/M/X material or a photoactive material as defined herein in the manufacture of an optoelectronic device, preferably wherein said optoelectronic device emits light, preferably visible light and more preferably wherein said optoelectronic device emits blue light in the wavelength range 450 to 500 nm, more preferably 455 to 495 nm, further preferably 460 to 490 nm.

In a third embodiment, the invention provides the use of a stabilised crystalline A/M/X material or a photoactive material as defined herein as a phosphor. For example, the invention provides the use of a photoactive material as defined herein in the manufacture of a screen, in particular an LED screen, or a solid-state lighting device.

In a fourth embodiment, the invention further provides the use of a stabilised crystalline A/M/X material or an optoelectronic device as defined herein in a method of generating light, preferably visible light, more preferably in a method of generating light in the wavelength range 450 to 500 nm, more preferably 455 to 495 nm, further preferably 460 to 490 nm. For example, the invention provides a method of generating light comprising irradiating a stabilised crystalline A/M/X material or a photoactive material as defined herein with a light source; and thus generating emission of light from said photoactive material in the wavelength range 450 to 500 nm, more preferably 455 to 495 nm, further preferably 460 to 490 nm.

EXAMPLES

1. Materials

CsBr (99.9%), CsCl (99.9%), $PbBr_2$ (≥98%), $PbCl_2$ (≥98%), $PbI_2$ (≥98%), HBr acid (48 wt % in water), N,N-dimethylformamide (DMF), anhydrous dimethyl sulfoxide (DMSO), Trimethylaluminum (TMA) solution (2.0 M in toluene), and toluene (anhydrous 99.8%) were purchased from Sigma-Aldrich. HCl was obtained from Fisher Scientific (32% in $H_2O$)

2. Fabrication of $CsPbBr_3$ Precursor Solution $CsPbBr_3$ was prepared by CsBr and $PbBr_2$ in 2:1 molar ratio with Cs:Pb dissolved in a mixed solvent of DMF and DMSO in 1:9 volume ratio to obtain a perovskite solution with desired composition and 0.3 M of $PbBr_2$ and the solution was mixed with magnetic stir bar at 40° C. for more than 60 min. The solution was filtered with PTFE Filter (pore size 0.45 μm).

3. Addition of TMA into $CsPbBr_3$ Precursor Solution

Different concentration of trimethylaluminum (TMA) solution was added into prepared $CsPbBr_3$ precursor solution in the nitrogen field glove box. The solution was mixed by vortex mixer for 1 min and leave into the glove box for 10 min. Finally, the mixed solution was filtered with PTFE Filter (pore size 0.45 μm).

4. Fabrication of $CsPb(Br_{1-x}Cl_x)_3$ Precursor Solution $CsPb(Br_{1-x}Cl_x)_3$ was prepared by changing mole ratio of CsBr and CsCl combined with the same mole ratio of $PbBr_2$ and $PbCl_2$ in stoichiometric amounts. For example, $CsPb(Br_{0.7}Cl_{0.3})_3$ was prepared with 1.490 g (7 mmol) of CsBr and 0.504 g (3 mmol) of CsCl, which were dissolved into 5 mL of deionized (DI) water and the solution was mixed by a vortex mixer becoming to clear solution. 2.569 g (7 mmol) of $PbBr_2$ (Aldrich ≥98%) and 0.834 g (3 mmol) of $PbCl_2$ were dissolved into 8.82 mL of DMF and 1.68 mL of HBr (48 wt. % in $H_2O$, ≥99.99%) and 3.15 mL of DMF and 1.35 mL of HCl (32% in $H_2O$), respectively. $PbBr_2$ solution and $PbCl_2$ solution were mixed with magnetic stir bar at 100° C. for 10 min and 5 min, respectively, and then the two solutions were mixed together with magnetic stir bar at 18-20° C. for 5 min.

The aqueous $CsBr_{0.7}Cl_{0.3}$ solution was slowly added into the $Pb(Br_{0.7}Cl_{0.3})_2$ solution whilst stirring with magnetic stir bar at 18-20° C. At certain point, bright yellow precipitate appears in the solution. 10 mL of Ethanol (Aldrich: laboratory Reagent, 96%) was added into the solution holding precipitate and mixed it by a vortex mixer for 10-20 seconds. The precipitate was taken out on an alpha-cellulose filter paper (Advantec) and washing with ethanol for a few times, and then it was dried in the vacuum oven at 70° C. for 10 h. The fabricated powder was dissolved in a DMSO to obtain a perovskite solution with desired composition and 0.2 M of $PbX_2$ and the solution was mixed with magnetic stir bar at 40° C. for more than 60 min. The solution was filtered with PTFE Filter (pore size 0.45 μm).

5. Fabrication of Thin Films

The perovskite precursor solution was coated onto the glass substrate by a spin-coating process at 3000 rpm (acceleration 500 rpm) for 50 sec in the normal lab atmosphere (18-20° C., humidity 40-60%), and then the perovskite films were annealed at 100° C. for 5 min in the same dried atmosphere.

For TMA-solvent quenching method, 80 μL of the precursor solution was spin-coated per substrate, spinning for 30 s at 3000 rpm (acceleration 500 rpm) 10 s before the end of the spin-coating program, the spinning substrate was quenched with 200 μL TMA mixed anti-solvent. Thereafter, the perovskite films were annealed at 100° C. for 5 min in the same dried atmosphere.

All thin film samples were coated with poly(methyl methacrylate) (PMMA, 20 mg/mL in chlorobenzene) to protect from air moisture.

6. Fabrication of Nanocrystals $CsPbBr_3$ NCs were synthesized following the previous report by Protesescu, et al. with some modification. Typically, $PbBr_2$ (1 g) (TCI), oleic acid (5 mL), oleylamine (5 mL) and ODE (50 mL) were all mixed and stirred in a 500 mL round bottom flask and degassed under vacuum at 120° C. for 1-2 hour until the $PbBr_2$ completely dissolved. The flask was then filled with $N_2$ and kept under constant $N_2$ flow while the temperature was set to 170° C. The previously prepared Cs-oleate (7.5 mL) precursor, pre-heated to 100° C., was swiftly injected into the reaction mixture. The reaction was stopped and quenched immediately (~10 sec after injection) by immersion of the flask into an ice bath and addition of 20 mL of anhydrous toluene.

7. Fabrication of Nanocrystal Thin Films Dispersed in PMMA and PS

The nanocrystal dispersion was added into poly(methyl methacrylate) (PMMA, 200 mg/mL in toluene) and polystyrene (PS, 200 mg/mL in toluene) to make a thin film into the polymer matrix. The polymer mixed nanocrystal solution was coated on glass substrate by doctor blade method.

8. Capsulation of Nanocrystal Thin Films PVB and EVA

Polyvinyl butyral (PVB) and ethylene vinyl acetate (EVA) were used as a barrier film to block nanocrystals. The barrier films were inserted between nanocrystal deposited glass and top cover glass to encapsulate.

9. Characterization

UV-vis absorption spectra were measured by a commercial spectrophotometer (Varian Cary 300 UV-Vis, USA). Photoluminescence (PL) spectra were recorded using an excitation wavelength of 365 nm and slit widths of 3 mm on a commercial spectrofluorometer (Horiba, Fluorolog). Photoluminescence quantum yield (PLQY) values were determined using a 405 nm CW laser (RLTMDL-405, Roithner Lasertechnik GmbH) to illuminate a sample in an integrating sphere (Oriel Instruments 70682NS), and the laser scatter and PL collected using a fiber-coupled detector (Ocean Optics MayaPro). PLQY calculations were carried out using established techniques. The laser intensity was adjusted using optical density filters. The stability test was carried out under full spectrum simulated AM1.5, 76 mA $cm^{-2}$ irradiance at an Atlas SUNTEST XLS+ (1700 W air-cooled Xenon lamp). The chamber temperature is ~60-70° C. The light source is pulsed at 100 Hz.

The invention claimed is:

1. A process for producing a stabilised crystalline A/M/X material, wherein the stabilised crystalline A/M/X material comprises an oxide of formula $[Z]_pO_q$ and a compound of formula $[A]_a[M]_b[X]_c$, wherein the stabilised crystalline A/M/X material is a polycrystalline material comprising a plurality of crystallites comprising the compound of formula $[A]_a[M]_b[X]_c$, and a plurality of grain boundaries between the crystallites, wherein the oxide of formula $[Z]_pO_q$ is distributed along the grain boundaries, wherein:

[Z] comprises at least one element Z capable of forming an oxide with a band gap of at least 3 eV, wherein each element Z is selected from Al, Si, Zr, Ga, Ba, Nb, Mg, Y, Ti, Ni, and Zn; p and q are positive numbers;

[A] comprises one or more A cations selected from an alkali metal cation, $C_{1-10}$ alkylammonium, $C_{2-10}$ alkenylammonium, iminium, $C_{1-10}$ alkyliminium, $C_{3-10}$ cycloalkylammonium and $C_{3-10}$ cycloalkyliminium optionally substituted with one or more substituents selected from amine, $C_{1-6}$ alkylamine, imine, $C_{1-6}$ alkylimine, $C_{1-6}$ alkyl, $C_{2-6}$ alkenyl, $C_{3-6}$ cycloalkyl and $C_{6-12}$ aryl;

[M] comprises one or more M cations selected from $Li^+$, $Na^+$, $K^+$, $Rb^+$, $Cs^+$, $Cu^+$, $Ag^+$, $Au^+$, $Hg^+$, $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yh^{2+}$, $Eu^{2+}$, $Bi^{3+}$, $Sb^{3+}$, $Cr^{3+}$, $Fe^{3+}$, $Co^{3+}$, $Ga^{3+}$, $As^{3+}$, $Ru^{3+}$, $Rh^{3+}$, $In^{3+}$, $Ir^{3+}$ and $Au^{3+}$;

[X] comprises one or more X anions selected from $F^-$, $Cl^-$, $Br^-$ or $I^-$;

a is an integer from 1 to 6;

b is an integer from 1 to 6; and c is an integer from 1 to 18, and wherein the process comprises treating:

(a) an A precursor comprising an A cation; and (b) an M precursor comprising an M cation;

with an oxide precursor comprising an element Z, and wherein the process further comprises producing an optoelectronic device comprising the stabilised crystalline A/M/X material, wherein the optoelectronic device is a photovoltaic device.

2. A process according to claim 1 wherein the photovoltaic device is a solar cell.

3. A process according to claim 1 wherein the A precursor, the M precursor and the oxide precursor are in solution.

4. A process according to claim 1 wherein said A precursor and said M precursor are present in a first solution, which first solution comprises the A precursor, the M precursor, and a first solvent.

5. A process according to claim 4 wherein the first solvent is an organic solvent.

6. A process according to claim 1 wherein said oxide precursor is present in a second solution, which second solution comprises said oxide precursor and a second solvent.

7. A process according to claim 6 wherein the compound of formula $[A]_a[M]_b[X]_c$ is insoluble in said second solvent.

8. A process according to claim 1 wherein treating the A precursor and the M precursor with the oxide precursor is carried out in the presence of water.

9. A process according to claim 1 wherein the process comprises disposing the A precursor and the M precursor on a substrate before treating the A precursor and the M precursor with the oxide precursor, wherein the substrate is a material which is useful in the manufacture of said optoelectronic device.

10. A process according to claim 9 wherein said substrate comprises one or more of: an n-type semiconductor; a p-type semiconductor; an electrode; a dielectric scaffold material, a polymer, or glass.

11. A process according to claim 1 wherein each element Z is selected from Al, Zr or Si.

12. A process according to claim 1 wherein each A cation is selected from one or more of $Cs^+$, $Rb^+$, methylammonium, ethylammonium, propylammonium, butylammonium, pentylammonium, hexylammonium, heptylammonium, octylammonium, formamidinium, benzyl ammonium, phenylethylammonium, benzylammonium, naphtylmethylammonium and guanidinium.

13. A process according to claim 1 wherein each M cation is selected from $Cu^+$, $Ag^+$, $Au^+$, $Sn^{2+}$, $Pb^{2+}$, $Cu^{2+}$, $Ge^{2+}$, $Ni^{2+}$, $Bi^{3+}$ and $Sb^{3+}$.

14. A process according to claim 1 wherein each X anion is selected from $Cl^-$ or $Br^-$.

15. A process according to claim 1 wherein [A] comprises two or more different A cations.

16. A process according to claim 1 wherein [X] comprises two or more different X anions.

17. A process according to claim 1 wherein the A precursor comprises a halide salt of the A cation or one of the A cations.

18. A process according to claim 1 wherein the M precursor comprises a halide salt of the M cation or one of the M cations.

19. A process according to claim 1 wherein the oxide precursor comprises one or more compounds of formula $ZR_n$; wherein n is a number from 1 to 6; and each R is independently selected from substituted or unsubstituted $C_{1-10}$ alkyl, $C_{2-10}$ alkenyl, $C_{3-10}$ cycloalkyl, $C_{1-10}$ alkyloxy, $C_{2-10}$ alkenyloxy, hydride, and halide.

20. A process according to claim 1 wherein the oxide precursor is trimethylaluminium.

21. A process according to claim 1 wherein said one or more A cations are monocations and said one or more M cations are dications.

22. A process according to claim 1 wherein the compound of formula $[A]_a[M]_b[X]_c$ is a compound of formula $[A][M][X]_3$.

23. A process according to claim 1 which further comprises removing any solvent present from the stabilised crystalline A/M/X material.

24. A process according to claim 1 wherein the process is performed in the absence of aliphatic ligands.

25. A process according to claim 1 wherein the stabilised crystalline A/M/X material comprises a crystal of the compound of formula $[A]_a[M]_b[X]_c$, the crystal having an oxide coating of formula $[Z]_pO_q$ on its entire surface.

26. An optoelectronic device comprising a stabilised crystalline A/M/X material, which is obtained and/or obtainable by a process according to claim 1 wherein the optoelectronic device is a photovoltaic device.

27. An optoelectronic device according to claim 26 wherein the photovoltaic device is a solar cell.

28. An optoelectronic device comprising a stabilised crystalline A/M/X material comprising a crystal of a compound of formula $[A]_a[M]_b[X]_c$, the crystal having an oxide coating of formula $[Z]_pO_q$ on its entire surface, wherein:

[Z] comprises at least one element Z capable of forming an oxide with a band gap of at least 3 eV, wherein each element Z is selected from Al, Si, Zr, Ga, Ba, Nb, Mg, Y, Ti, Ni, and Zn; p and q are positive numbers;

[A] comprises one or more A cations selected from an alkali metal cation, $C_{1-10}$ alkylammonium, $C_{2-10}$ alkenylammonium, iminium, $C_{1-10}$ alkyliminium, $C_{3-10}$ cycloalkylammonium and $C_{3-10}$ cycloalkyliminium optionally substituted with one or more substituents selected from amine, $C_{1-6}$ alkylamine, imine, $C_{1-6}$ alkylimine, $C_{1-6}$ alkyl, $C_{2-6}$ alkenyl, $C_{3-6}$ cycloalkyl and $C_{6-12}$ aryl;

[M] comprises one or more M cations selected from $Li^+$, $Na^+$, $K^+$, $Rb^+$, $Cs^+$, $Cu^+$, $Ag^+$, $Au^+$, $Hg^+$, $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, $Eu^{2+}$, $Bi^{3+}$, $Sb^{3+}$, $Cr^{3+}$, $Fe^{3+}$, $Co^{3+}$, $Ga^{3+}$, $As^{3+}$, $Ru^{3+}$, $Rh^{3+}$, $In^{3+}$, $Ir^{3+}$ and $Au^{3+}$;

[X] comprises one or more X anions selected from F, Cl, Br or I;

a is an integer from 1 to 6;

b is an integer from 1 to 6; and c is an integer from 1 to 18, wherein the optoelectronic device is a photovoltaic device;

wherein the stabilised crystalline A/M/X material is a polycrystalline material comprising the crystal, wherein at least a part of the oxide coating is located at a crystal grain boundary.

29. An optoelectronic device according to claim 28 wherein the photovoltaic device is a solar cell.

30. An optoelectronic device according to claim 28 wherein the said coating has a minimum thickness of 0.5 nm.

31. An optoelectronic device according to claim 28 wherein the compound of formula $[A]_a[M]_b[X]_c$ comprises said at least one element Z as an impurity.

32. An optoelectronic device according to claim 28 wherein the stabilised crystalline A/M/X material is a polycrystalline material wherein each crystal in the polycrystalline material has said coating on its entire surface.

33. A process according to claim 5 wherein the first solvent is an organic solvent, wherein the organic solvent comprises dimethyl sulfoxide, dimethylformamide, N-methyl-2-pyrrolidone, gamma-butyrolactone and mixtures thereof.

34. A process according to claim 7 wherein the second solvent is one of toluene, chlorobenzene, dichlorobenzene, anisole, methyl acetate, ethyl acetate, diethyl ether, and chloroform.

* * * * *